(12) United States Patent
Iwata et al.

(10) Patent No.: US 6,927,463 B2
(45) Date of Patent: *Aug. 9, 2005

(54) SEMICONDUCTOR DEVICE AND METHOD FOR FABRICATING THE SAME

(75) Inventors: Hiroshi Iwata, Ikoma-gun (JP); Seizou Kakimoto, Shiki-gun (JP); Masayuki Nakano, Tenri (JP); Toshimasa Matsuoka, Yao (JP)

(73) Assignee: Sharp Kabushiki Kaisha, Abeno-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/439,540

(22) Filed: May 15, 2003

(65) Prior Publication Data

US 2003/0230784 A1 Dec. 18, 2003

Related U.S. Application Data

(63) Continuation of application No. 09/496,944, filed on Feb. 3, 2000, now Pat. No. 6,573,577, which is a continuation of application No. 08/881,697, filed on Jun. 24, 1997, now Pat. No. 6,255,704.

(30) Foreign Application Priority Data

Jun. 28, 1996 (JP) ................................. 8-170072

(51) Int. Cl.⁷ ............................................. H01L 29/76
(52) U.S. Cl. ................ 257/401; 257/368; 257/369; 257/371
(58) Field of Search ................ 257/401, 368, 257/369, 371, 499, 506, 519, 397

(56) References Cited

U.S. PATENT DOCUMENTS

| | | | |
|---|---|---|---|
| 4,264,857 A | 4/1981 | Jambotkar | |
| 4,786,960 A | 11/1988 | Jeuch | |
| 4,876,214 A | 10/1989 | Yamaguchi et al. | |
| 4,983,226 A | 1/1991 | Hunter et al. | |
| 5,514,902 A | 5/1996 | Kawasaki et al. | |
| 5,780,899 A | 7/1998 | Hu et al. | |
| 6,573,577 B1 * | 6/2003 | Iwata et al. | 257/401 |

FOREIGN PATENT DOCUMENTS

| | | |
|---|---|---|
| EP | 276850 A2 | 3/1988 |
| JP | 61-137338 | 6/1986 |
| JP | 62-266848 | 11/1987 |
| JP | 63-79343 | 4/1988 |
| JP | 2-203549 | 8/1990 |
| JP | 4-225259 | 8/1992 |
| JP | 5-95043 | 4/1993 |
| JP | 6-85262 | 3/1994 |
| JP | 6-163683 | 6/1994 |
| JP | 6-232355 | 8/1994 |
| JP | 7147381 | 6/1995 |

OTHER PUBLICATIONS

Assaderaghi et al.(1994), "A dynamic threshold voltage MOSFET (DTMOS) for ultra–low voltage operation" *IEDM '94*.

* cited by examiner

*Primary Examiner*—Mark V. Prenty
(74) *Attorney, Agent, or Firm*—Morrison & Foerster LLP

(57) ABSTRACT

A semiconductor device of the present invention includes: a semiconductor substrate; a deep well region of a first conductivity type, formed in the semiconductor substrate; a plurality of shallow well regions of a second conductivity type, formed in the deep well region; a source region and a drain region of the first conductivity type, respectively formed in the plurality of shallow well regions; a channel region formed between the source region and the drain region; a gate insulating film formed on the channel region; and a gate electrode formed on the gate insulating film, wherein the gate electrode is electrically connected to a corresponding one of the shallow well regions, and the shallow well region is electrically separated from the adjacent shallow well region.

45 Claims, 54 Drawing Sheets

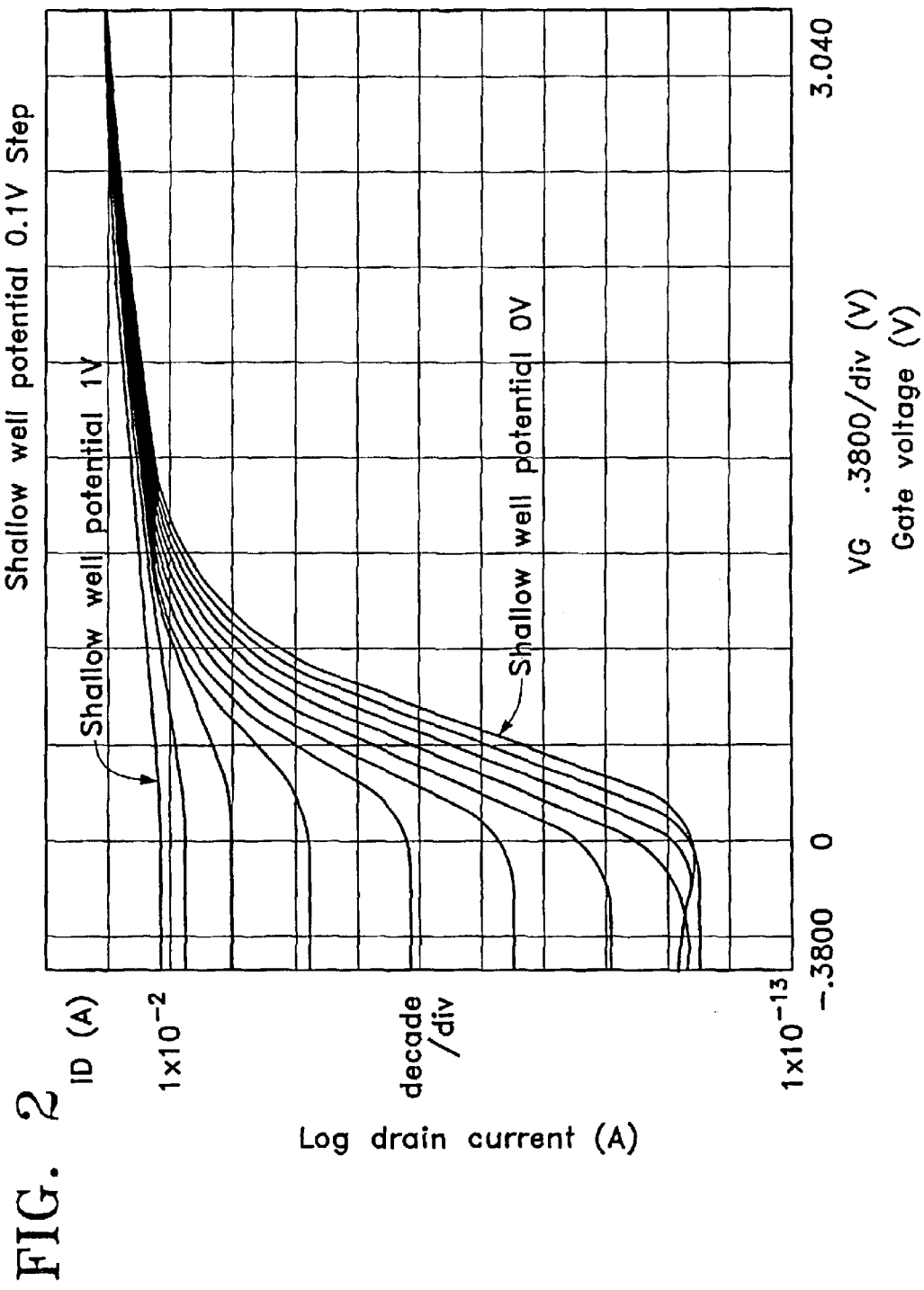

SEMICONDUCTOR DEVICE AND METHOD FOR FABRICATING THE SAME

This application is a continuation of U.S. patent application Ser. No. 09/496,994, filed on Feb. 3, 2000, now issued as U.S. Pat. No. 6,573,577, which is a continuation of U.S. patent application Ser. No. 08/881,697, filed on Jun. 24, 1997, now issued as U.S. Pat. No. 6,255,704, which claims priority to Japanese patent application number 8-170072 filed on Jun. 28, 1996, the contents of each of which are incorporated herein by reference in their entirety.

BACKGROUND OF THE INVENTION

1. Field of the Invention

The present invention relates to a transistor operating at a low power supply voltage by dynamically varying a threshold value, a semiconductor device including such transistors, and a method for producing such a semiconductor device. The present invention also relates to a contact formation technique for the transistors and an element separation technique suitable for integration of the transistor elements.

2. Description of the Releted Art

The power consumption of a circuit, in which MOS transistors of different conductivity types are complementarily connected to each other (a CMOS circuit), increases in proportion to the square of a power supply voltage. Therefore, it is effective to reduce the power supply voltage for reduction of the power consumption of a large scale integrated circuit (LSI) formed by using CMOS circuits. However, since the driving power of transistors is reduced simultaneously with the reduction of the power supply voltage, the delay time of the LSI circuit is disadvantageously increased. The delay time is increased as the power supply voltage is lowered. In particular, it is known that, when a power supply voltage becomes lower than three times as much as a threshold voltage (i.e., $3 \times V_{th}$), the delay time remarkably increases.

As a method for solving this problem, it is conceived to set a threshold voltage of the transistor to be low. However, if a threshold voltage is set at a low value, there arises a problem that a leak current during gate-OFF increases. Accordingly, the lower limit of the threshold voltage is limited depending on the acceptable degree of an OFF current (leak current).

In order to alleviate this problem, a dynamic threshold voltage operating transistor for effectively lowering a threshold voltage during gate ON has been proposed as a transistor corresponding to a low power supply voltage (A Dynamic Threshold Voltage MOSFET (DTMOS) for Ultra-Low Voltage Operation, F. Assaderaghi et al., IEDM94 Ext. Abst. pp.809).

A conventional structure of such a transistor is shown in FIG. 53. Although an N-channel MOS transistor (NMOS) is shown in FIG. 53, it is possible to construct a P-channel MOS transistor (PMOS) by providing an opposite polarity for the respective regions. This transistor is built on a Silicon-On-Insulator (SOI) substrate. A gate electrode and the substrate (a region of a silicon layer) are short-circuited through a local wiring by using an oversized metal wiring. In such a structure where the gate electrode and the substrate are short-circuited, when a bias voltage (a gate bias) is applied to the gate electrode, a forward bias as large as the gate bias is applied to an active region of the substrate.

However, in order to restrain the standby current in such a structure, the voltage to be applied to the gate electrode should be limited to below 0.6 V at which a lateral parasitic bipolar transistor is turned ON. In this manner, the same bias state as that in a normal transistor is formed during gate-OFF, and the substrate is forward biased as the gate bias increases during gate ON. As a result, a threshold voltage is reduced during gate ON.

As a result, the leak current during gate-substrate bias OFF is the same as that in a normal SOI transistor in the same channel state. When the transistor is an ON state, the threshold voltage is lowered as the gate-substrate bias is increased. Thus, the gate overdrive effect is increased to remarkably increase the driving power. A mobility is prevented from being deteriorated by the restraint of a longitudinal electric field on the surface of the substrate, which serves to increase the driving power. Since a lateral parasitic bipolar transistor is in an OFF state, the standby current is prevented from being remarkably increased.

Since the SOI substrate is utilized in the conventional technique described above, an active layer substrate is perfectly electrically insulated. Therefore, as compared with a device formed on a bulk substrate, holes generated in a channel (electrons in the case of a PMOS) are likely to be accumulated. As a result, the generation of kink in a drain current due to a substrate floating effect or characteristic hysteresis effect becomes a problem.

Moreover, the electrical insulation of the active layer substrate creates the problem of charge-up or causes electrostatic damage (ESD) to be generated during the fabrication process.

Furthermore, in the case where a separation by implanted oxygen (SIMOX) substrate, which has the best crystallinity at present, is used instead of the SOI substrate, the deterioration of characteristics due to carrier implantation to the bottom interface or capture becomes a problem. This is because the interface between the buried oxide film and the substrate has a larger degree of disturbance of the bonding state than that in the interface between the gate oxide film and the substrate on the channel side.

Furthermore, since a body (channel region) has an extremely small thickness (about 50 nm to about 200 nm) with the SOI substrate, the resistance becomes remarkably high. Therefore, even if the gate and the body are to be short-circuited by a contact region, it becomes more difficult to transfer a potential to the body as the distance from the contact increases. Therefore, the effect of a DTMOS is not fully demonstrated.

SUMMARY OF THE INVENTION

A semiconductor device of the present invention includes: a semiconductor substrate; a deep well region of a first conductivity type, formed in the semiconductor substrate; a plurality of shallow well regions of a second conductivity type, formed in the deep well region; a source region and a drain region of the first conductivity type, respectively formed in the plurality of shallow well regions; a channel region formed between the source region and the drain region; a gate insulating film formed on the channel region; and a gate electrode formed on the gate insulating film, wherein the gate electrode is electrically connected to a corresponding one of the shallow well regions, and the shallow well region is electrically separated from the adjacent shallow well region.

According to another aspect of the present invention, a semiconductor device includes: a semiconductor substrate; a deep well region of a first conductivity type formed in the semiconductor substrate, which is capable of functioning as an emitter or a collector of a bipolar transistor; a shallow well region of a second conductivity type formed in the deep well region, which is capable of functioning as a base of the bipolar transistor; a source region and a drain region of the first conductivity type, formed in the shallow well region, which are capable of functioning as the collector or the emitter of the bipolar transistor; a channel region formed between the source region and the drain region; a gate insulating film formed on the channel region; and a gate electrode formed on the gate insulating film, wherein the gate electrode is electrically connected to the shallow well region, and the semiconductor device is operated by a combination of an operation of a MOS transistor and an operation of the bipolar transistor.

In one embodiment of the invention, the adjacent shallow well regions are separated from each other by a groove type element separation structure which is deeper than the shallow well region and shallower than the deep well region.

In another embodiment of the invention a field oxide film is formed so as to partially cover a region surrounded by the groove type element separation structure, and a contact region for electrically connecting the gate electrode and the shallow well region with each other is surrounded by the field oxide film.

In still another embodiment of the invention, the gate electrode includes a polycrystalline silicon film formed on the gate insulating film and a metal silicide film formed on the polycrystalline silicon film, and wherein the metal silicide film is electrically connected to the shallow well region via the contact region of the shallow well region, a high concentration impurity diffusion region, in which an impurity of the same conductivity type as that of the shallow well region is diffused at a higher concentration than that of a reminder of the shallow well region, is formed in the contact region, and an Ohmic contact is formed between the metal silicide film and the shallow well region through the high concentration impurity diffusion region.

In yet another embodiment of the invention, a semiconductor device further includes an interlayer insulating film and an upper wiring provided on the interlayer insulating film, wherein a contact hole is formed in the interlayer insulating film, which penetrates through the gate electrode and the gate insulating film so as to reach the contact region of the shallow well region, wherein a high concentration impurity diffusion region, in which an impurity of the same conductivity type as that of the shallow well region is diffused at a higher concentration than that of a remainder of the shallow well region, is formed in the contact region, an Ohmic contact is formed between the upper wiring and the shallow well region through the high concentration impurity diffusion region on the bottom of the contact hole, and wherein an Ohmic contact is formed between the gate electrode and the upper wiring on a side wall region of the contact hole.

According to still another aspect of the invention, a method for fabricating a semiconductor device including: a semiconductor substrate; a deep well region of a first conductivity type, formed in the semiconductor substrate; a plurality of shallow well regions of a second conductivity type, formed in the deep well region; a source region and a drain region of the first conductivity type, respectively formed in the plurality of shallow well regions; a channel region formed between the source region and the drain region; a gate insulating film formed on the channel region; and a gate electrode formed on the gate insulating film, wherein the gate electrode is electrically connected to corresponding one of the shallow well regions, and the shallow well region is electrically separated from the adjacent shallow well region, the method includes the steps of: forming a side wall spacer on a side wall of the gate electrode; forming a contact hole in the gate electrode, for partially exposing a surface of the shallow well region in a contact region for connecting the shallow well region and the gate electrode with each other; depositing a refractory metal film so as to cover the gate electrode and the contact region in the shallow well region, which is partially exposed through the contact hole; and performing silicidation for part of the refractory metal film so as to form a refractory metal silicide film on the gate electrode and the contact region in a self-aligned manner.

In one embodiment of the invention, a method for fabricating a semiconductor device further includes the step of implanting impurity ions having the same conductivity type as that of the shallow well region through the contact hole into the shallow well region by ion implantation prior to or after the step of forming the refractory metal silicide film.

According to still another embodiment of the invention, a semiconductor device includes: a semiconductor substrate; a deep n-type well region formed in the semiconductor substrate; a deep p-type well region formed in the semiconductor substrate; a shallow p-type well region formed in the deep n-type well region; a shallow n-type well region formed in the deep p-type well region; an N-channel MOS transistor formed in the shallow p-type well region; and a P-channel MOS transistor formed in the shallow n-type well region, wherein the N-channel MOS transistor includes an n-type source region and an n-type drain region formed in the shallow p-type well region, a channel region formed between the n-type source region and the n-type drain region, a gate insulating film formed on the channel region, and an n-type gate electrode formed on the gate insulating film, wherein the P-channel MOS transistor includes a p-type source region and a p-type drain region formed in the shallow n-type well region, a channel region formed between the p-type source region and the p-type drain region, a gate insulating film formed on the channel region, and a p-type gate electrode formed on the gate insulating film, and wherein the n-type gate electrode is electrically connected to the shallow p-type well region, and the p-type gate electrode is electrically connected to the shallow n-type region.

In one embodiment of the invention, a semiconductor device further includes: a second n-type well region surrounding the deep p-type well region, which is deeper than the deep p-type well region; a second p-type well region surrounding the deep n-type well region, which is deeper than the deep n-type well region; and a groove type element separation structure for separating the second n-type well region and the second p-type well region from each other.

In another embodiment of the invention, a difference of a potential formed between the shallow well region and the source region and a difference of a potential formed between the shallow well region and the drain region is set so as to be smaller than a built-in potential of a pn junction in the semiconductor device during operation.

In still another embodiment of the invention, a method includes the steps of: forming a side wall spacer on a side wall of each of the n-type gate electrode and the p-type gate electrode; forming a first contact hole in the n-type gate electrode for partially exposing a surface of the shallow p-type well region in a first contact region for connecting the shallow p-type well region and the n-type gate electrode with each other, and for forming a second contact hole in the p-type gate electrode for partially exposing a surface of the shallow n-type well region in a second contact region for connecting the shallow n-type region and the p-type gate electrode with each other; depositing a refractory metal film so as to cover the n-type gate electrode, the p-type gate electrode and the first contact region in the shallow p-type well region and the second contact region in the shallow n-type well region; and performing silicidation for part of the refractory metal film so as to form a refractory metal silicide film on the n-type gate electrode, the p-type gate electrode, the first contact region and the second contact region in a self-aligned manner, wherein, upon implantation of a p-type impurity ion for forming the p-type source region and the p-type drain region, the p-type impurity ion is implanted into the first contact region, and upon implantation of an n-type impurity ion for forming the n-type source region and the n-type drain region, the n-type impurity ion is implanted into the second contact region.

In yet another embodiment of the invention, the gate electrode is electrically connected to the shallow well region via a source region or a drain region of a MOS transistor, and a constant voltage is applied to a gate electrode of the MOS transistor.

In yet another embodiment of the invention, the gate electrode is electrically connected to the shallow well region via a second source region or a second drain region of a second MOS transistor, and the drain region is connected to a second gate electrode of the second MOS transistor.

According to still another aspect of the invention, a semiconductor device includes: a semiconductor substrate; an n-type deep well region formed in the semiconductor substrate, which incapable of functioning as an emitter or a collector of an NPN type bipolar transistor; a p-type shallow well region formed in the n-type deep well region, which is capable of functioning as a base of the NPN type bipolar transistor; an n-type source region and an n-type drain region formed in the p-type shallow well region, which are capable of functioning as the collector or the emitter of the NPN type bipolar transistor; a channel region formed between the n-type source region and the n-type drain region; a gate insulating film formed on the channel region; an n-type gate electrode formed on the gate insulating film; a p-type deep well region formed in the semiconductor substrate, capable of functioning as an emitter or a collector of a PNP type bipolar transistor; an n-type shallow well region formed in the p-type deep well region, capable of functioning as a base of the PNP bipolar transistor; a p-type source region and a p-type drain region formed in the n-type shallow well region, which are capable of functioning as the collector or the emitter of the PNP bipolar transistor; a channel region formed between the p-type source region and the p-type drain region; a gate insulating film formed on the channel region; and a p-type gate electrode formed on the gate insulating film, wherein the n-type gate electrode is electrically connected to the p-type shallow well region via source/drain regions of a first MOS transistor while the n-type drain region is electrically connected to a gate electrode of the first MOS transistor, the p-type gate electrode is electrically connected to the n-type shallow well region via source/drain regions of a second MOS transistor while the p-type drain region is electrically connected to a gate electrode of the second MOS transistor, and wherein the semiconductor device further comprises a p-type deeper well region which is deeper than the n-type deep well region, including the n-type deeper well region, and a n-type deeper well region which is deeper than the p-type deep well region, including the p-type deep well region, a potential of the n-type deep well region and a potential of the p-type deeper well region are set to be identical to each other, and a potential of the p-type deep well region and a potential of the n-type deeper well region are set to be identical to each other.

In one embodiment of the invention, a junction between the source/drain regions, and the shallow well region, is doped with nitrogen ions or carbon ions.

In another embodiment of the invention, a semiconductor device includes a power supply voltage blocking circuit between a circuit block constituted by using the semiconductor device and a power supply voltage source, wherein supply of a power supply voltage is blocked when the circuit block is in a standby state.

In still another embodiment of the invention, a semiconductor device includes a block circuit between a circuit block constituted by using the semiconductor device and a power supply voltage source, another block circuit between the circuit block and a ground voltage supply source, wherein supply of a power supply voltage and supply of a ground voltage are blocked when the circuit block is in a standby state.

According to yet another embodiment of the invention, a method for fabricating a semiconductor device includes: a semiconductor substrate; a deep well region of a first conductivity type, formed in the semiconductor substrate; a plurality of shallow well regions of a second conductivity type, formed in the deep well region; a source region and a drain region of the first conductivity type, respectively formed in the plurality of shallow well regions; a channel region formed between the source region and the drain region; a gate insulating film formed on the channel region; and a gate electrode formed on the gate insulating film, wherein the gate electrode is electrically connected to a corresponding one of the shallow well regions, and the shallow well region is electrically separated from the adjacent shallow well region, the method includes the step of: forming a groove type element separation structure for separating the shallow well regions from each other and a field oxide film prior to the formation of the shallow well regions.

According to yet another embodiment of the invention, a semiconductor device includes: a semiconductor substrate; a plurality of transistor elements formed in the semiconductor substrate; and a groove type element separation structure for separating the plurality of transistor elements from each other, wherein the groove type element separation structure includes a groove formed in the semiconductor substrate, an insulating layer formed along an inner wall of the groove, and a silicon film filling the groove, and a field oxide film having a bird's beak is formed above the groove in an edge portion of an opening of the groove.

In one embodiment of the invention, the semiconductor substrate includes a first semiconductor layer of the first conductivity type and a second semiconductor layer of the second conductivity type positioned below the first semiconductor layer, a bottom of the groove extends from a surface of the semiconductor substrate to reach a middle of the second semiconductor layer, and a high concentration region, in which an impurity of the second conductivity type is diffused at a higher concentration than the other region, is formed in the vicinity of the bottom of the groove.

In another embodiment of the invention, a concentration of the impurity of the second conductivity type in the high concentration region is in the range of about $1\times10^{18}/cm^3$ to about $1\times10^{19}/cm^3$.

According to yet another aspect of the invention, a method for fabricating a semiconductor device including a plurality of transistor elements formed in a semiconductor substrate and an element separation structure for separating the plurality of transistor elements from each other, the method includes the steps of: forming a groove in the semiconductor substrate; forming an insulating layer along an inner wall of the groove; filling the groove with a polycrystalline silicon film; forming an anti-oxidation mask selectively covering an element region where the transistor elements are to be formed; and simultaneously oxidizing a surface of the polycrystalline silicon film filling the groove and an exposed surface of the semiconductor substrate so as to form an element separation structure including the groove and a field oxide film.

In one embodiment of the invention, the step of forming the groove includes the steps of: forming a first silicon oxide film on the semiconductor substrate; depositing a first silicon nitride film on the first silicon oxide film; and successively etching the first silicon nitride film, the first silicon oxide film, and the semiconductor substrate positioned on a region where the groove is to be formed so as to form the groove.

In another embodiment of the invention, the step of forming the insulating layer along the inner wall of the groove includes the step of forming a second silicon oxide film along the inner wall of the groove.

In still another embodiment of the invention, the step of filling the groove with the polycrystalline silicon film includes the step of depositing the polycrystalline silicon film so as to fill the groove and the step of selectively etching back the polycrystalline silicon film.

In yet another embodiment of the invention, the step of forming the anti-oxidation mask includes the step of selectively removing the first silicon nitride film positioned in a field region of the semiconductor substrate so as to form the anti-oxidation film from a remaining portion of the first silicon nitride film.

In yet another embodiment of the invention, the step of forming the anti-oxidation mask includes the steps of: depositing a second silicon nitride film after the step of filling,the groove with the polycrystalline silicon film; and selectively removing the first silicon nitride film and the second silicon nitride film positioned in a field region of the semiconductor substrate so as to form the anti-oxide mask from a remaining region of the first silicon nitride film and the second nitride film.

In yet another embodiment of the invention, the second silicon nitride film is changed to be a third oxide film by the thermal oxidation in the step of forming the element separation structure.

In yet another embodiment of the invention, the step of forming the groove includes the steps of: forming a first silicon oxide film on the semiconductor substrate; depositing a first silicon nitride film on the first silicon oxide film; depositing a second silicon oxide film on the first silicon nitride film; and successively etching the second silicon oxide film, the first silicon nitride film, the first silicon oxide film and the semiconductor substrate which are positioned in a region where the groove is to be formed.

In yet another embodiment of the invention, the step of forming the anti-oxidation mask includes the steps of: removing the second silicon oxide film; and selectively removing the first silicon nitride film positioned in a field region of the semiconductor substrate so as to form the anti-oxidation mask from a remaining portion of the first silicon nitride film.

In yet another embodiment of the invention,the step of forming the anti-oxidation mask includes the steps of: removing the second silicon oxide film; depositing a second silicon nitride film; and selectively removing the first silicon nitride film and the second silicon nitride film positioned in a field region of the semiconductor substrate so as to form the anti-oxidation mask from a remaining portion of the first silicon nitride film and the second silicon nitride film.

In yet another embodiment of the invention, the step of forming the anti-oxidation mask includes the step of: selectively removing the second silicon oxide film and the first silicon nitride film positioned in a field region of the semiconductor substrate so as to form the anti-oxidation mask from a remaining portion of the second silicon oxide film and the first silicon nitride film.

In yet another embodiment of the invention, the step of forming the anti-oxidation mask includes the steps of: depositing a second silicon nitride film after the step of filling the groove with the polycrystalline silicon film; and selectively removing the second silicon nitride film, the second silicon oxide film and the first silicon nitride film positioned in a field region of the semiconductor substrate so as to form the anti-oxidation film from a remaining portion of the second silicon nitride film, the second silicon oxide film and the first silicon nitride film.

In yet another embodiment of the invention, the method for fabricating a semiconductor device includes the step of depositing a third silicon oxide film so as to cover the first silicon nitride film and the second silicon oxide film formed in the groove after the formation of the second silicon oxide film and prior to the step of filling the groove with the polycrystalline silicon film, wherein a portion positioned in a region of the third silicon oxide film excluding the groove is etched in the step of filling the groove with the polycrystalline silicon film.

In yet another embodiment of the invention, the step of forming the anti-oxidation mask includes the steps of: depositing a second silicon nitride film after the step of etching the third silicon oxide film; selectively removing the first silicon nitride film and the second silicon nitride film positioned in a field region of the semiconductor substrate so as to form the anti-oxidation mask from a remaining portion of the first silicon nitride film and the second silicon nitride film.

In yet another embodiment of the invention, the second silicon nitride film is changed to be a fourth oxide film by the thermal treatment in the step of forming the element separation structure.

In yet another embodiment of the invention, the method for fabricating a semiconductor device includes the step of depositing a third silicon oxide film so as to cover the first silicon nitride film and the second silicon oxide film formed in the groove after the formation of the second silicon oxide film and prior to the step of filling the groove with the polycrystalline silicon film, and wherein the step of forming the anti-oxidation mask includes the step of etching a region of the third silicon oxide film and a region of the first silicon nitride film positioned in a field region of the semiconductor substrate after the step of filling the groove with the polycrystalline silicon film and prior to the step of forming the element separation structure.

In yet another embodiment of the invention, a method for fabricating a semiconductor device includes the step of depositing a third silicon oxide film so as to cover the first silicon nitride film and the second silicon oxide film formed in the groove after the formation of the second silicon oxide film and prior to the step of filling the groove with the polycrystalline silicon film, wherein the step of forming the anti-oxidation mask includes the steps of: depositing a second silicon nitride film after the step of filling the groove with the polycrystalline silicon film; and selectively removing the second silicon nitride film, the third silicon oxide film and the first silicon nitride film positioned in a field region of the semiconductor substrate so as to form the anti-oxidation mask from a remaining portion of the second silicon nitride film, the third silicon oxide film and the first silicon nitride film.

In one embodiment of the invention, a method for fabricating a semiconductor device includes the step of implanting an impurity ion into a bottom of the groove between the step of forming the groove in the semiconductor substrate and the step of filling the groove with the polycrystalline silicon film.

According to still another aspect of the invention, a field effect transistor device includes: a deep well region of a first conductivity type formed in a semiconductor substrate; at least one shallow well region of a second conductivity type, formed in the deep well region; a source region and a drain region of the first conductivity type formed in the shallow well region; a channel region formed between the source region and the drain region; a gate insulating film formed on the channel region; and a gate electrode formed on the gate insulating film, wherein the gate electrode is electrically connected to the shallow well region.

Thus, the invention described herein makes possible the advantages of: (1) providing a semiconductor device having a dynamically varying threshold, capable of operating at a low voltage; and (2) providing a method for fabricating such a semiconductor device.

These and other advantages of the present invention will become apparent to those skilled in the art upon reading and understanding the following detailed description with reference to the accompanying figures.

BRIEF DESCRIPTION OF THE DRAWINGS

FIG. 2 is a graph showing the relationship between a gate voltage and a drain current while varying the potential of a shallow well region of a MOS transistor.

DESCRIPTION OF THE PREFERRED EMBODIMENTS

The present invention is characterized in that a shallow well region is formed so as to dynamically vary a threshold voltage $V_t$ of a transistor in accordance with a gate potential and that the shallow well region and the gate electrode are electrically connected to each other.

In general, in the case where polycrystalline silicon doped with an impurity is used as a material for a gate electrode, a conductivity type of the impurity is opposite to that of an impurity added to a shallow well region as an dopant. Therefore, in order to realize the present invention, a technique for forming a low resistance Ohmic contact between the gate electrode and the shallow well region is needed. In the present invention, such a contact is formed by mainly using silicide.

Moreover, in the case where a semiconductor device includes a plurality of transistor elements respectively having gate electrodes to which different voltages are applied at certain time, the shallow well regions of these transistor elements should be electrically separated from each other. Typically, one shallow well region is allocated to each transistor element, and the shallow well regions are separated from each other. Therefore, in order to integrate the transistors of the present invention at a high density, a technique for effectively separating the adjacent shallow well regions from each other is required. In the present invention, the shallow well regions are separated from each other by a trench separation structure.

In the present invention, the term "shallow well region" refers to a well region including a source region and a drain region formed therein, which is electrically connected to a gate electrode. On the other hand, the term "deep well region" refers to a well region having a pn junction at a position deeper than that of the "shallow well region", which has an opposite conductivity type to that of the shallow well region and includes at least one shallow well region therein.

EXAMPLE 1

Figure 1A:
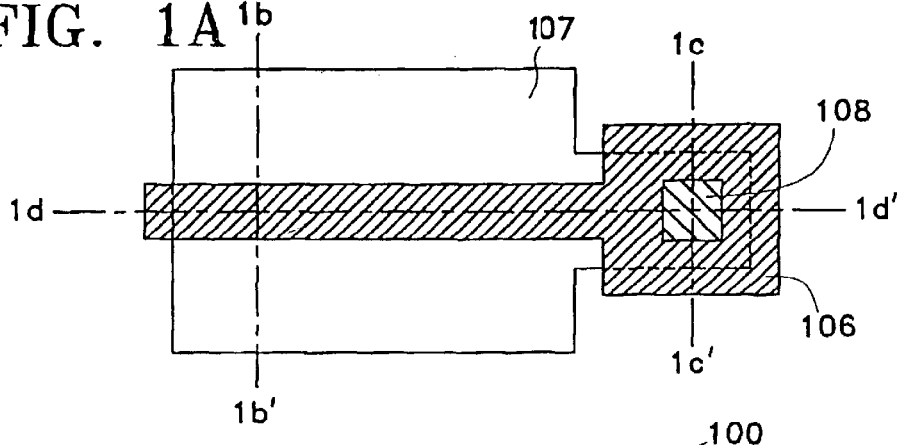
FIG. 1A is a plan view showing a semiconductor device of Example 1.
Figure 1B:
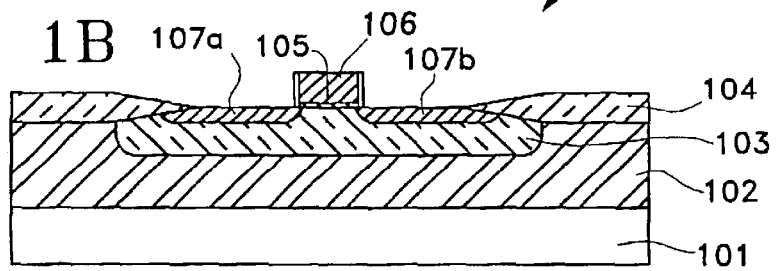
FIG. 1B is a cross-sectional view taken along a line 1b–1b' in FIG. 1A.
Figure 1C:
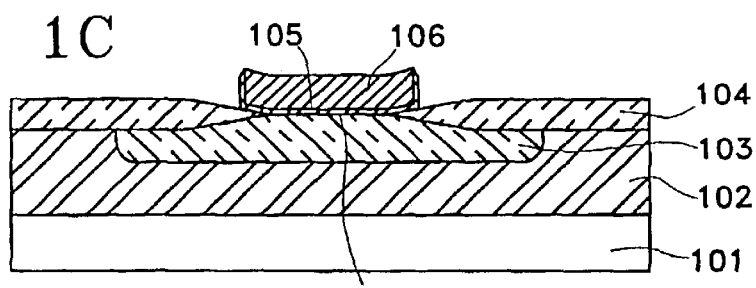
FIG. 1C is a cross-sectional view taken along a line 1c–1c' in FIG. 1A.
Figure 1D:
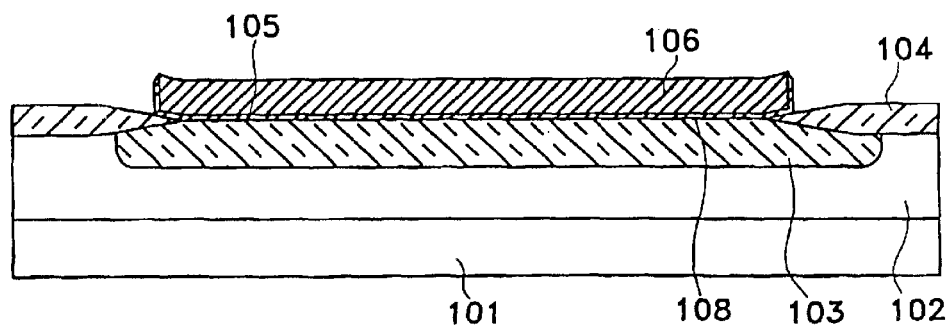
FIG. 1D is a cross-sectional view taken along a line 1d–1d' in FIG. 1A.

With reference to FIGS. 1A to 1D, a semiconductor device of Example 1 (having a LOCOS separation structure) according to the present invention will be described. FIG. 1A is a plan view showing the semiconductor device of Example 1, FIG. 1B is a cross-sectional view taken along a line 1b–1b' in FIG. 1A, FIG. 1C is a cross-sectional view taken along a line 1c–1c' in FIG. 1A, and FIG. 1D is a cross-sectional view taken along a line 1d–1d' in FIG. 1A.

In the semiconductor device of Example 1, a deep well region 102 is formed within a semiconductor substrate 101, and a shallow well region 103 is formed within the deep well region 102. The conductivity type of the shallow well region 103 is opposite to that of the deep well region 102, and is identical to that of the semiconductor substrate 101.

In Example 1, a MOS transistor 100 according to the present invention is formed in the shallow well region 103. More specifically, the MOS transistor 100 includes source/drain regions 107 (107a and 107b) formed in the shallow well region 103, a channel region formed between the source region 107a and the drain region 107b, a gate insulating film 105 formed so as to cover the channel region, and a gate electrode 106 formed on the gate insulating film 105. Part of the gate electrode 106 is electrically connected to the shallow well region 103 via a contact hole 108 formed through the gate insulating film 105.

Although only one MOS transistor is shown in FIGS. 1A to 1D for simplicity, actuality a plurality of MOS transistors are formed in one semiconductor substrate 101. The shallow well region 103 shown in FIGS. 1B to 1D is electrically separated from the shallow well region (not shown) of the adjacent MOS transistor by an oxide film 104, for separation of the element.

By the above structure, it is possible to realize a variable threshold voltage transistor without using a SOI substrate.

The relationship between an inverted threshold voltage $V_{th}$ (hereinafter, also referred to as "threshold voltage") of the MOS transistor 100 and a bias ($V_{s\text{-}well}$) of the shallow well region 103 can be expressed by Expression (1) below.

$$V_{th} = 2\phi_b + \frac{\sqrt{2qN_{s\text{-}well}\varepsilon_s(2\phi_b - V_{s\text{-}well})}}{C_{OX}} + V_{FB} \qquad \text{[Expression 1]}$$

In Expression 1, $\Phi_b$ is the Fermi potential, $N_{s\text{-}well}$ is the concentration of an impurity in the shallow well region 103, $\varepsilon_s$ is the dielectric constant, of the shallow well region 103, q is the amount of electron charge, $C_{OX}$ is the capacity of a gate insulating film per unit area, and $V_{FB}$ is a flat band voltage. In the case where the shallow well region 103 is forward biased, it is understood from the above Expression 1 that an absolute value of the threshold voltage is reduced.

In a linear region, a driving current is expressed by Expression 2 below.

$$I_D = \frac{W}{L}\mu_{eff}C_{OX}\left[(V_G - V_{th})V_D - \frac{1}{2}V_D^2\right] \qquad \text{[Expression 2]}$$

In a saturated region, a driving current is expressed by Expression 3 below.

$$I_D = \frac{1}{2}\frac{W}{L}\mu_{eff}C_{OX}(V_G - V_{th})^2 \qquad \text{[Expression 3]}$$

Herein, $I_D$ is a drain current, W is a gate width, L is a gate length, $\mu_{eff}$ is an effective mobility, and $V_G$ is a gate voltage.

FIG. 2 shows the relationship between a gate voltage and a drain current when a potential of the shallow well region is varied. Herein, a "gate voltage" refers to the potential at the gate electrode with respect to the potential of the source region.

Since the driving current is expressed by Expression 2 and Expression 3, a large driving current can be obtained at a remarkably low power supply voltage with the reduction of an absolute value of the threshold voltage ($V_{th}$).

Since the gate electrode and the shallow well region are connected to each other in the MOS transistor having the structure of Example 1, the potential of the shallow well region is displaced in accordance with the displacement of the gate potential. Therefore, as is apparent from Expressions 1 to 3 described above, the shallow well region is forward biased, with respect to the source region and the drain region, with the increase in the gate voltage, an apparent threshold voltage is lowered. As a result, a large driving current can be obtained even at a low power supply voltage.

As described above, the gate potential is identical with the potential of the shallow well region, a forward bias is applied to the pn junction formed between the shallow well region and the source region (and the drain region). More specifically, in the case of the N-channel transistor, the potential of the source region is equal to a GND potential, while the potential of the shallow well region is equal to the gate potential. On the other hand, in the case of a P-channel transistor, the potential of the source region is equal to the power supply voltage, while the potential of the shallow well region is equal to the gate potential.

In order to prevent a forward current from flowing, it is necessary to keep a voltage between the well region and the source region (or between the well region and the drain region) at a built-in potential of the pn junction or lower. If these voltages exceed the built-in potential, a pn junction diode forward current flows between the shallow well region and the source region (or the drain region). In the case where the potential of the shallow well region is increased to the built-in potential or the vicinity thereof, since an extremely large level of the pn junction diode forward current flows, it is desirable to set a power supply voltage so that the potential of the shallow well region is lower than the built-in potential by about 0.1 to 0.3 V.

Figure 3:
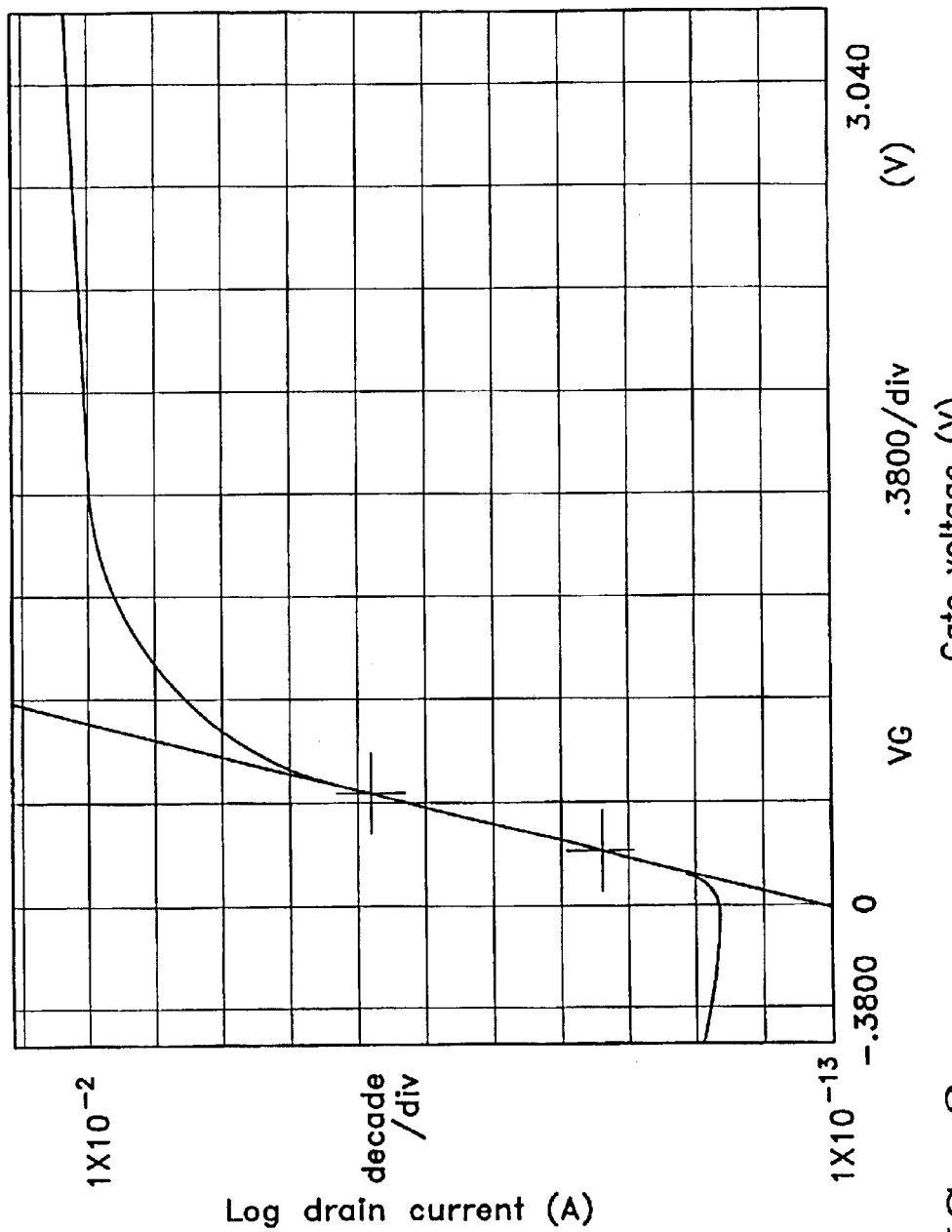
FIG. 3 is a graph showing the relationship between a gate voltage and a driving current (drain current) in the MOS transistor of Example 1.

FIG. 3 is a graph showing the relationship between a gate potential and a driving current (drain current) of a transistor having the structure of Example 1. It is understood from FIG. 3 that a S value, that is, the inclination of a curve of a sub-threshold region (the amount of displacement of the gate potential necessary for increasing a driving current by one digit) is about 60 mV/dec. With the structure of the present invention, a large driving current can be obtained by a small change in the gate potential as compared with a transistor having a normal structure with a S value of about 80 mV/dec to about 100 mV/dec.

In Example 1, the impurity concentration in the deep well region is set to be in the range of about $1 \times 10^{16}/\text{cm}^3$ to about $1 \times 10^{17}/\text{cm}^3$, and the impurity concentration in the shallow well region is set to be in the range of about $5 \times 10^{16}/\text{cm}^3$ to about $5 \times 10^{17}/\text{cm}^3$. The depth of the shallow well region is set to be in the range of about 250 nm to about 1000 nm. The impurity concentration in the source/drain regions is set to be about $1 \times 10^{20}/\text{cm}^3$ or higher, and its junction depth is set to be in the range of about 50 nm to about 300 nm. In order to restrain the short channel effect of the transistor, it is preferred to reduce the junction depth in the source region and the-drain region to as small as possible, and to reduce the thickness of the gate oxide film.

Figure 4A:
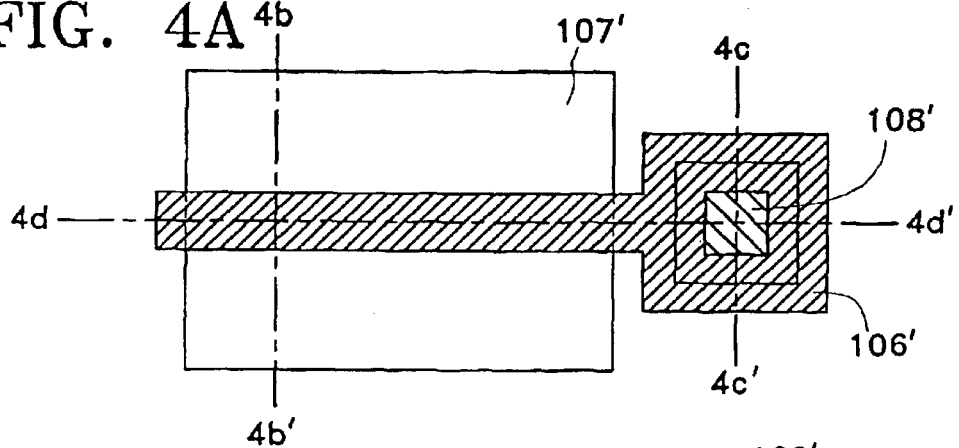
FIG. 4A is a plan view showing a modification of Example 1.
Figure 4B:
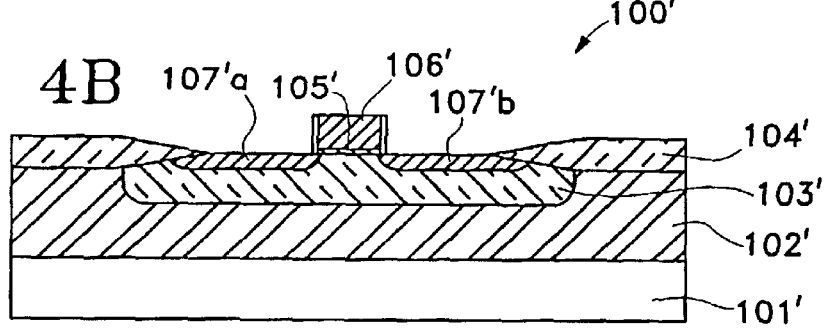
FIG. 4B is a cross-sectional view taken along a line 4b–4b' in FIG. 4A.
Figure 4C:
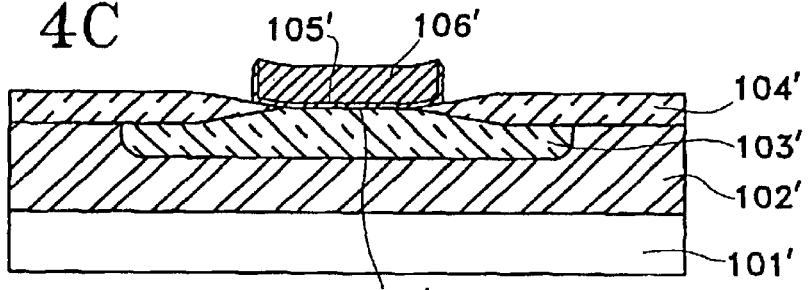
FIG. 4C is a cross-sectional view taken along a line 4c–4c' in FIG. 4A.
Figure 4D:
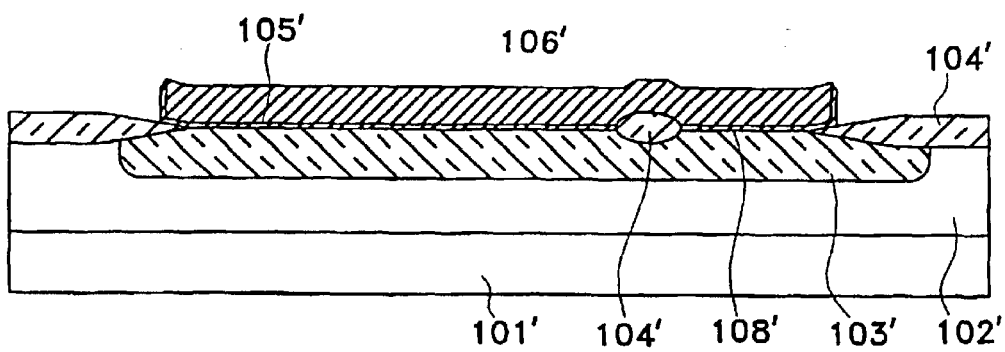
FIG. 4D is a cross-sectional view taken along a line 4d–4d' in FIG. 4A.

Next, with reference to FIGS. 4A to 4D, a modification of the semiconductor device shown in FIGS. 1A to 1D is described. FIG. 4A is a plan view showing the semiconductor device of the modification of Example 1, FIG. 4B is a cross-sectional view taken along a line 4b–4b' in FIG. 4A, FIG. 4C is a cross-sectional view taken along a line 4c–4c' in FIG. 4A, and FIG. 4D is a cross-sectional view taken along a line 4d–4d' in FIG. 4A. In this modification, "a deep well region 102'" is formed in a semiconductor substrate 101', and "a shallow well region 103'" is formed in the deep well region 102'. The conductivity type of the shallow well region 103' is opposite to that of the deep well region 102', and is identical to that of the semiconductor substrate 101'.

More specifically, a MOS transistor 100' includes source/drain regions 107' (107'a and 107'b) formed in the shallow well region 103', a channel region formed between the source region 107'a and the drain region 107'b, a gate insulating film 105' formed so as to cover the channel region, and a gate electrode 106' formed on the gate insulating film 105'. The gate electrode 106' is electrically connected to the shallow well region 103' via a contact hole 108' formed through the gate insulating film 105'.

The shallow well region 103' shown in FIGS. 4A to 4D is electrically separated from a shallow well region of the adjacent MOS transistor (not shown) by an oxide film 104' for separation of the element.

In this modification, the oxide film 104' for separation of the element is also present between the region where the contact between the gate electrode 106' and the shallow well region 103' is formed and the region where the source/drain regions 107' are formed.

EXAMPLE 2

A semiconductor device of Example 2 according to the present invention is described below. In Example 2, the case where a parasitic bipolar transistor contributes to the operation of a transistor is described.

Figure 5:
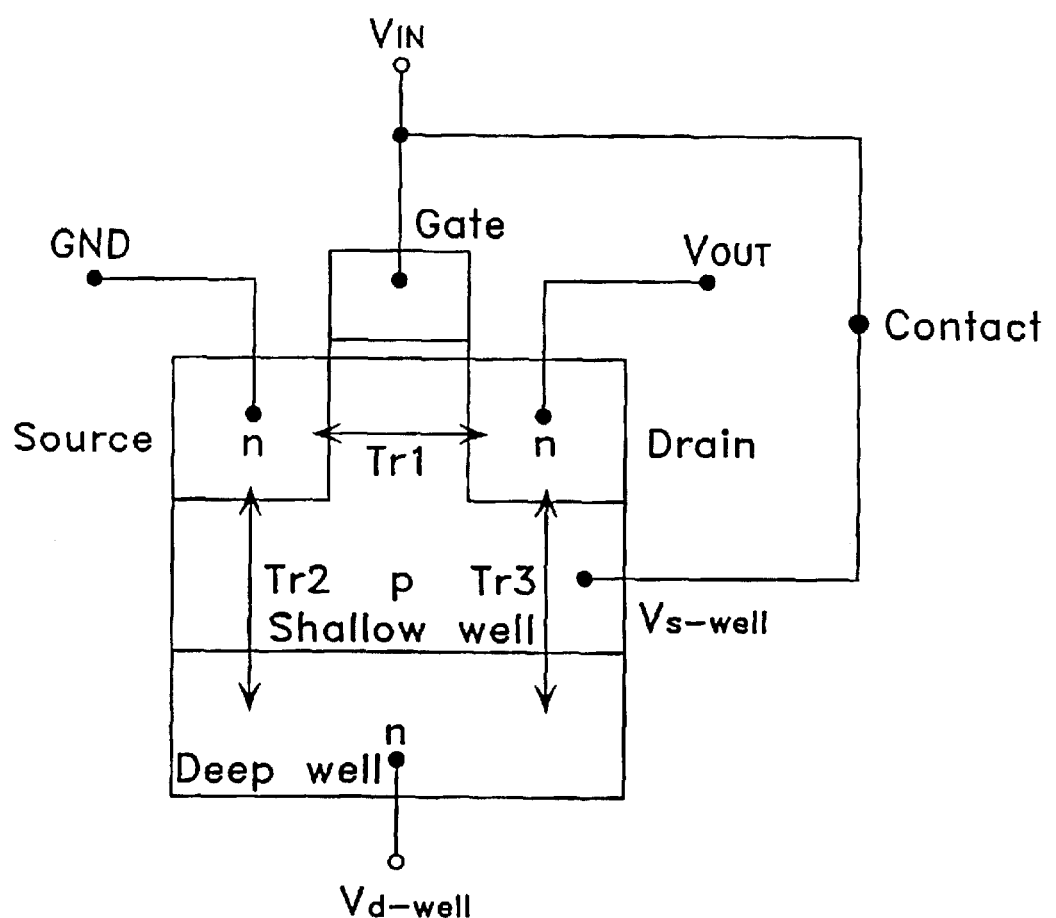
FIG. 5 is a schematic view showing the connection of various parts in a semiconductor device of Example 2 and parasitic bipolar transistors included in the semiconductor device.

FIG. 5 depicts schematically the wiring of the transistor element and the parasitic bipolar transistor of Example 2. Although the case where an N-channel type MOS transistor and a parasitic npn transistor are used is described herein, the present invention is also applicable to a semiconductor device which includes a P-channel type MOS transistor and a parasitic pnp transistor obtained by providing the opposite polarity to the transistor shown in FIG. 5.

In Example 2, the source region of the MOS type transistor is connected to a GND, the gate electrode is connected to an input $V_{IN}$, and the drain region is connected to an output $V_{OUT}$. The potential of the shallow well region is set at $V_{s\text{-}well}$, and the potential of the deep well region is set at $V_{d\text{-}well}$.

In the semiconductor device of Example 2, as shown in FIG. 5, three parasitic bipolar transistors represented by Tr1, Tr2 and Tr3 are formed in addition to the MOS transistor. The direction of operational currents of these parasitic bipolar transistors are shown in Table 1 below.

operate so as to obstruct the operation of the MOS transistor. In other words, while the MOS transistor operates to keep the output ($V_{out}$) at the GND, while the parasitic bipolar transistor Tr3 operates so as to keep the output ($V_{out}$) at the power supply voltage $V_{DD}$. In this case, the parasitic bipolar transistor Tr2 operates so as to generate a leak current independent of the operation of the MOS transistor.

Therefore, in the case where the potential ($V_{d\text{-}well}$) of the deep well region is fixed to the power supply voltage ($V_{DD}$), it is necessary to design the parasitic bipolar transistors Tr2 and Tr3 so that a large amount of a current does not flow therethrough. According to an experiment carried out by the inventors of the present invention, if the parasitic bipolar transistors Tr2 and Tr3 are designed so as to have a base width of about 200 nm or more and an impurity concentration in the base region of about $2 \times 10^{17}$ cm$^3$ or less, a current through the parasitic bipolar transistors can be limited to a negligibly small level. The "base width" herein means a distance from the lower end of the source region/drain region to the lower end of the shallow well region.

In the case where the voltage ($V_{d\text{-}well}$) applied to the deep well region is set at the GND level, the parasitic bipolar transistors function so as to help the MOS transistor for all inputs and outputs. At this time, the semiconductor device shown in FIG. 5 is capable of transmitting the sum of a current of the dynamic threshold transistor current and a current of the parasitic bipolar transistors therethrough. Therefore, in the case where the structure positively taking advantage of the operation of the parasitic bipolar transistors is utilized, the greater driving power can be obtained as compared with the dynamic threshold transistor unit which does not exhibit the parasitic bipolar transistor operation.

EXAMPLE 3

In the semiconductor device of Example 1, the element separation structure is formed by using a field oxide film. In the case where the element separation structure is formed by using a field oxide film, an extremely large element separation region is required to separate the adjacent shallow

TABLE 1

| $V_{d\text{-}well}$ | Initial value at OUT before input | IN | Direction of current through MOSFET | Direction of current through Tr1 | Direction of current through Tr2 | Direction of current through Tr3 |
|---|---|---|---|---|---|---|
| $V_{DD}$ | $V_{DD}$ | $V_{DD}$ | ← | ← ○ | ↑ Δ | ↑ X |
|  |  | GND | OFF | OFF | OFF | OFF |
|  | GND | $V_{DD}$ | OFF | OFF | ↑ Δ | ↑ X |
|  |  | GND | OFF | OFF | OFF | OFF |
| GND | $V_{DD}$ | $V_{DD}$ | ← | ← ○ | OFF | ↓ ○ |
|  |  | GND | OFF | OFF | OFF | OFF |
|  | GND | $V_{DD}$ | OFF | OFF | OFF | OFF |
|  |  | GND | OFF | OFF | OFF | OFF |

The direction of the arrow indicating "the direction of a current" in Table 1 corresponds to the direction of the arrow in FIG. 5. In Table 1, the symbol ○ represents that the parasitic transistor operates so as to help the operation of the MOS transistor of Example 2, the symbol Δ represents that the parasitic transistor generates a leak current independent of the operation of the MOS transistor, and the symbol X represents that the parasitic transistor operates so as to obstruct the operation of the MOS transistor of Example 2.

For example, in the case where a voltage of $V_{DD}$ is input to the gate electrode while fixedly setting the potential of the deep well region ($V_{d\text{-}well}$) to the level of the power supply voltage ($V_{DD}$), the parasitic bipolar transistor Tr3 tends to well regions from each other. Therefore, the element separation using a field oxide film is not suitable for the high integration of the transistors because it increases the area of one transistor on a silicon substrate. Thus, a semiconductor device having a groove type element separation structure for solving such a problem will be described in Example 3.

Figure 6A:
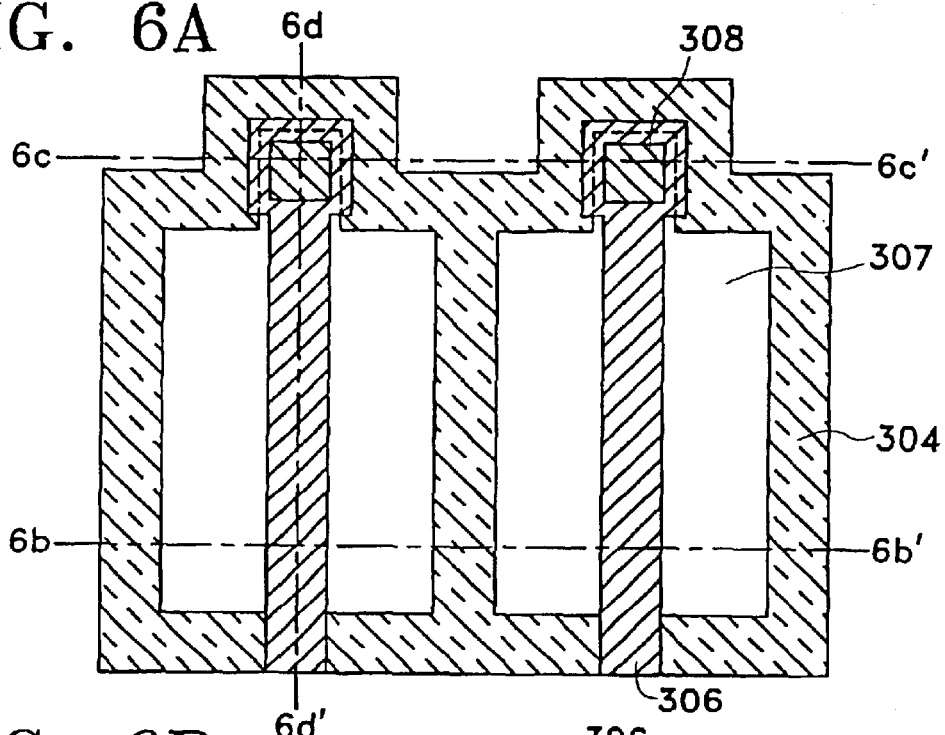
FIG. 6A is a plan view showing a semiconductor device of Example 3.
Figure 6B:
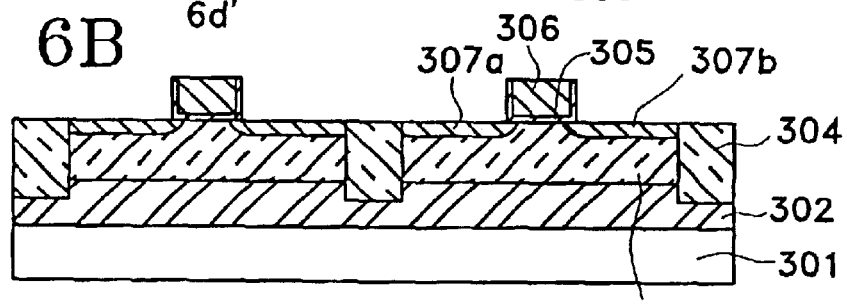
FIG. 6B is a cross-sectional view taken along a line 6b–6b' in FIG. 6A.
Figure 6C:
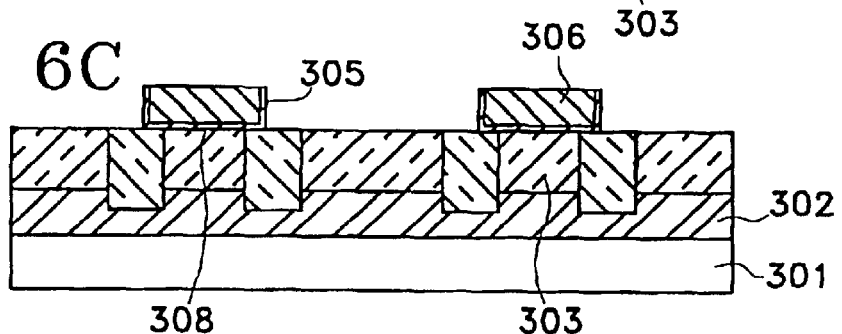
FIG. 6C is a cross-sectional view taken along a line 6c–6c' in FIG. 6A.
Figure 6D:
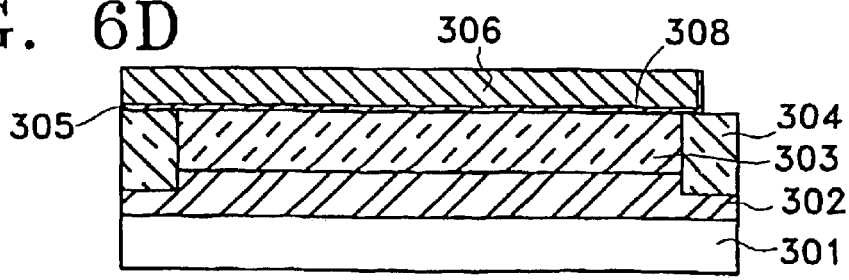
FIG. 6D is a cross-sectional view taken along a line 6d–6d' in FIG. 6A.

Hereinafter, a semiconductor device having a groove type element separation structure of Example 3 is described with reference to FIGS. 6A to 6D. FIG. 6A is a plan view showing the semiconductor device of Example 3, FIG. 6B is a cross-sectional view taken along a line 6b–6b' in FIG. 6A, FIG. 6C is a cross-sectional view taken along a line 6c–6c' in FIG. 6A, and FIG. 6D is a cross-sectional view taken along a line 6d–6d' in FIG. 6A.

In the semiconductor device of this example, a "deep well region 302" is formed in a semiconductor substrate 301, and a "shallow well region 303" is formed in the deep well region 302. The conductivity type of the shallow well region 303 is opposite to that of the deep well region 302, and is identical to that of the semiconductor substrate 301.

A MOS transistor of Example 3 is formed in the shallow well region 303. More specifically, the MOS transistor includes source/drain regions 307 (307a and 307b) formed in the shallow well region 303, a channel region formed between the source region 307a and the drain region 307b, a gate insulating film 305 formed so as to cover the channel region, and a gate electrode 306 formed on the gate insulating film 305. The gate electrode 306 is electrically connected to the shallow well region 303 via a contact hole 308 formed through the gate insulating film 305.

At least the shallow well region 303 is electrically separated from the shallow well region of the adjacent transistor element by a groove type element separation structure 304.

The lateral size of a region required to form the groove type element separation structure is substantially the same as the minimum processing size. Therefore, due to an extremely small region, substantially as small as the minimum processing size, it is possible to separate the transistor elements from each other. Thus, a variable threshold MOS transistor can be realized without using a SOI substrate and/or sacrificing the level integration of the semiconductor device.

Figure 7A:
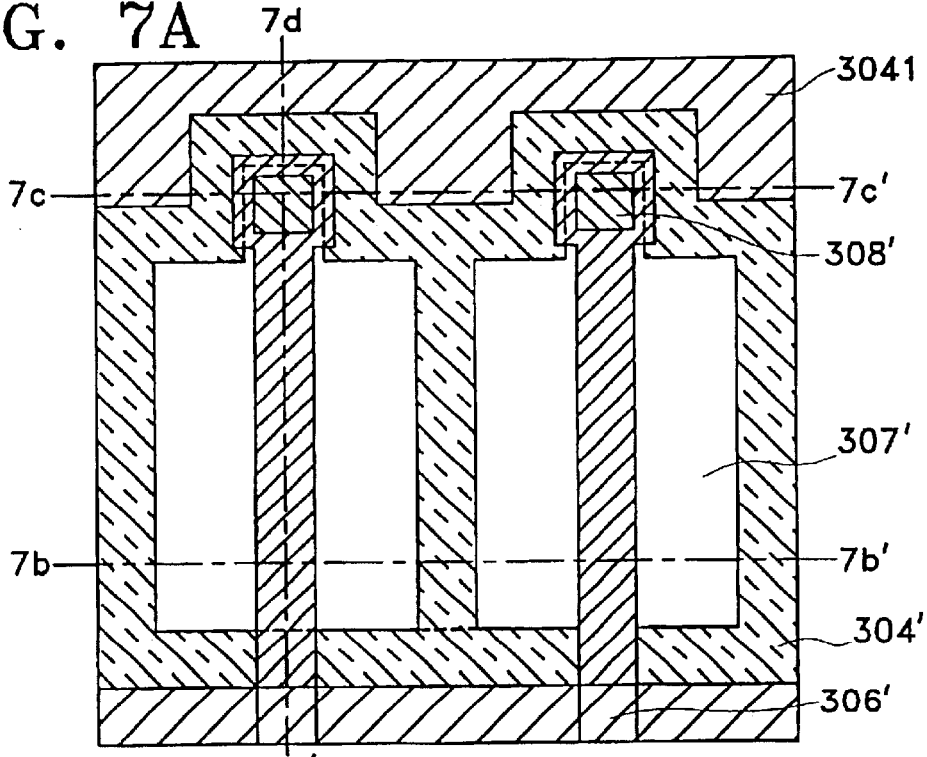
FIG. 7A is a plan view showing a modification of Example 3.
Figure 7B:
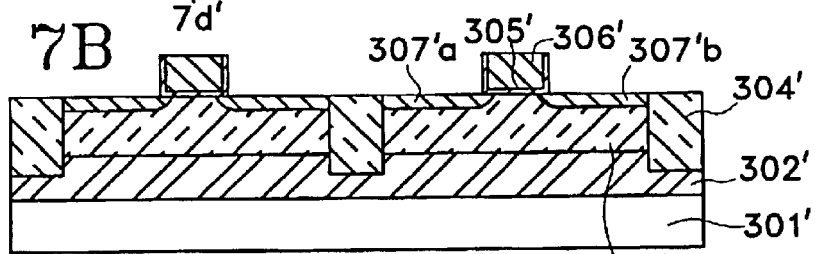
FIG. 7B is a cross-sectional view taken along a line 7b–7b' in FIG. 7A.
Figure 7C:
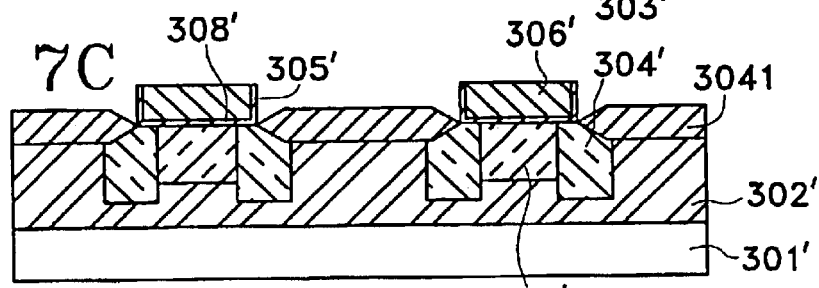
FIG. 7C is a cross-sectional view taken along a line 7c–7c' in FIG. 7A.
Figure 7D:
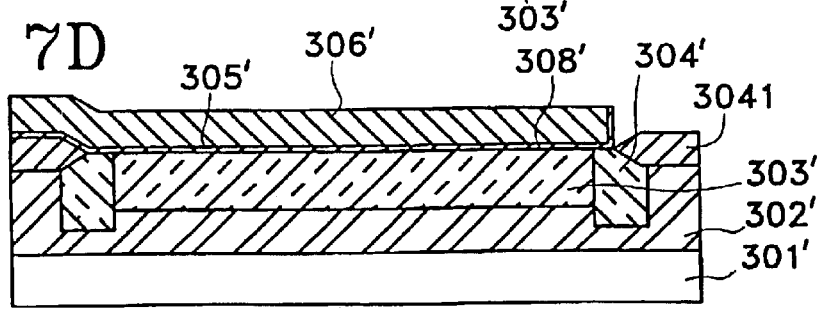
FIG. 7D is a cross-sectional view taken along a line 7d–7d' in FIG. 7A.

Next, with reference to FIGS. 7A to 7D, a modification of the semiconductor device shown in FIGS. 6A to 6D is described. FIG. 7A is a plan view showing the semiconductor device of the modification of Example 3, FIG. 7B is a cross-sectional view taken along a line 7b–7b' in FIG. 7A, FIG. 7C is a cross-sectional view taken along a line 7c–7c' in FIG. 7A, and FIG. 7D is a cross-sectional view taken along a line 7d–7d' in FIG. 7A.

In this modification, a field oxide film 3041 is formed on an inactive region of a silicon substrate which has a groove type element separation structure. The structure shown in FIGS. 7A to 7D is covered with an interlayer insulating film (not shown), and an upper wiring is formed thereon. By providing a field oxide film 3041, a parasitic capacity between the upper wiring and the semiconductor substrate can be reduced.

In this modification, "a deep well region 302'" is formed in a semiconductor substrate 301', and "a shallow well region 303'" is formed in the deep well region 302'. The conductivity type of the shallow well region 303' is opposite to that of the deep well region 302', and is identical to that of the semiconductor substrate 301'.

More specifically, a MOS transistor includes source/drain regions 307' (307'a and 307'b) formed in the shallow well region 303', a channel region formed between the source region 307'a and the drain region 307'b, a gate insulating film 305' formed so as to cover the channel region, and a gate electrode 306' formed on the gate insulating film 305'. The gate electrode 306' is electrically connected to the shallow well region 303' via a contact hole 308' formed through the gate insulating film 305'.

At least the shallow well region 303' is electrically separated from a shallow well region of the adjacent transistor element by the groove type element separation structure 304' and the field oxide film 3041.

EXAMPLE 4

In order to reduce a capacity formed between an upper wiring formed on an interlayer insulating film and a semiconductor substrate, the oxide film 3041 is formed on an inactive region of the silicon substrate in the semiconductor device of Example 3. In Example 4, a semiconductor device having another structure for achieving the same objective will be described.

Figure 8A:
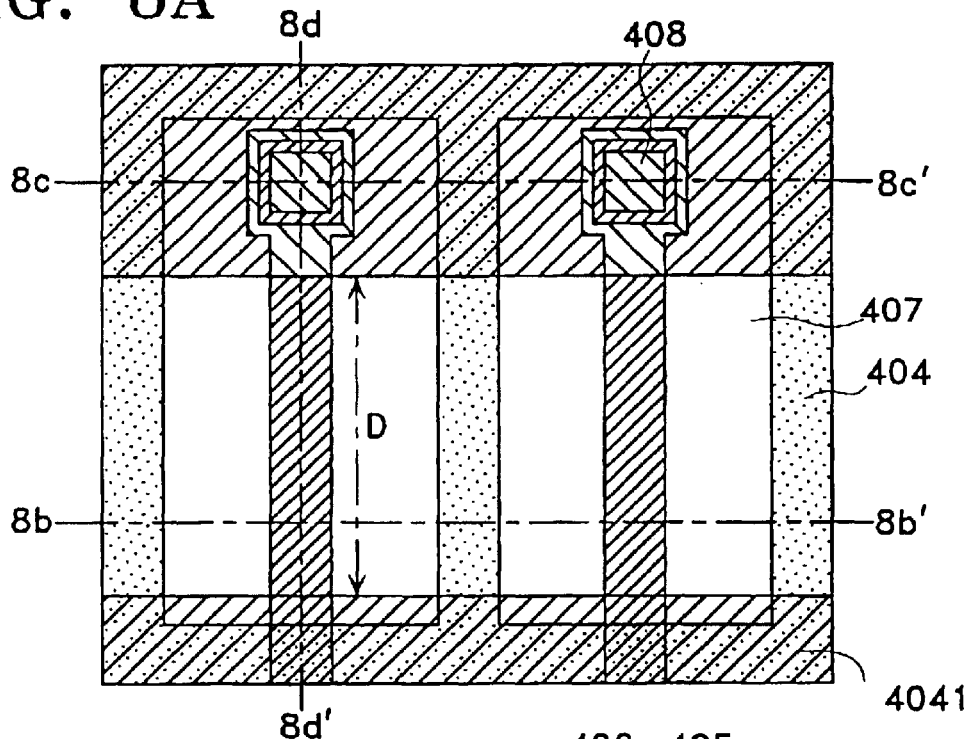
FIG. 8A is a plan view showing a semiconductor device of Example 4.
Figure 8B:
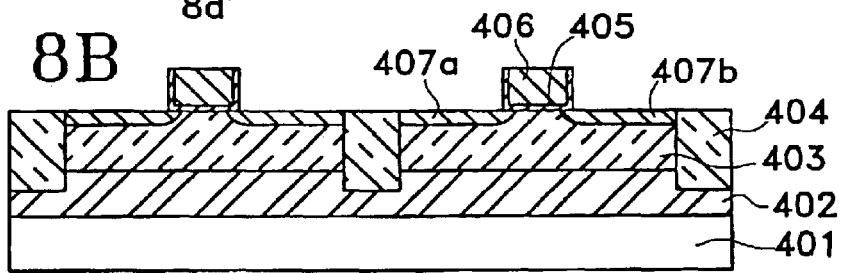
FIG. 8B is a cross-sectional view taken along a line 8b–8b' in FIG. 8A.
Figure 8C:
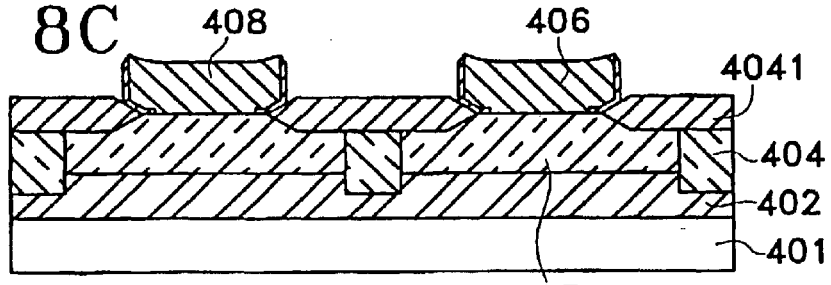
FIG. 8C is a cross-sectional view taken along a line 8c–8c' in FIG. 8A.
Figure 8D:
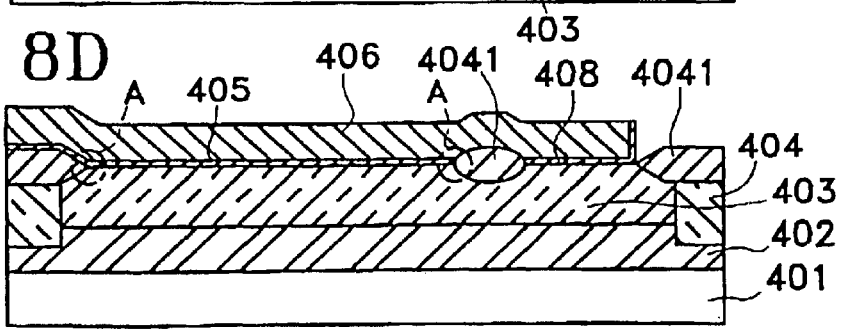
FIG. 8D is a cross-sectional view taken along a line 8d–8d' in FIG. 8A.

Hereinafter, a semiconductor device of Example 4 is described with reference to FIGS. 8A to 8D. FIG. 8A is a plan view showing the semiconductor device of Example 4, FIG. 8B is a cross-sectional view taken along a line 8b–8b' in FIG. 8A, FIG. 8C is a cross-sectional view taken along a line 8c–8c' in FIG. 8A, and FIG. 8D is a cross-sectional view taken along a line 8d–8d' in FIG. 8A.

In the semiconductor device of Example 4, a "deep well region 402" is formed in a semiconductor substrate 401, and a "shallow well region 403" is formed in the deep well region 402. The conductivity type of the shallow well region 403 is opposite to that of the deep well region 402, and is identical to that of the semiconductor substrate 401.

A MOS transistor of Example 4 is formed in the shallow well region 403. More specifically, the MOS transistor includes source/drain regions 407 (407a and 407b) formed in the shallow well region 403, a channel region formed between the source region 407a and the drain region 407b, a gate insulating film 405 formed so as to cover the channel region, and a gate electrode 406 formed on the gate insulating film 405. The gate electrode 406 is electrically connected to the shallow well region 403 via a contact hole 408 formed through the gate insulating film 405. At least the shallow well region 403 is electrically separated from a shallow well region of the adjacent transistor element by a groove type element separation structure 404.

In Example 4, a field oxide film 4041 partially extends over the region surrounded by the groove type element separation structure 404. Therefore, a channel width (W) (not shown) is determined by the field oxide film 4041, not by the groove type element separation structure 404. More particularly, the channel width of the transistor is determined by the distance D of the field oxide film 4041. In the example shown in FIGS. 7A to 7D, if misalignment occurs between an element separation groove and the gate electrode, the channel width (W) shifts from a designed value. In Example 4, however, the channel width (W) does not shift from a designed value even when such misalignment occurs. Therefore, the transistor characteristics are hardly affected by the fabrication process.

Instead of the edge portion of the groove, a bird's beak is present in an overlap region (region A in FIG. 8D) between the gate electrode and the element separation region. As a result, a leak current between the source region and the drain region due to the edge portion of the groove can be restrained.

For the high integration of the semiconductor device, however, this structure is disadvantageous. A method for restraining the bird's beak will be described below in Example 28 and the following Examples.

EXAMPLE 5

Hereinafter, a contact structure for forming an Ohmic contact between a gate electrode and a shallow well region in a transistor element according to the present invention is described.

Since a gate electrode (i.e., a semiconductor layer constituting the gate electrode) and a shallow well region have the same conductivity type in a MOS transistor having a buried channel, an Ohmic contact can be formed by forming a contact hole through a gate oxide film and directly connecting the gate electrode (i.e., a semiconductor layer constituting the gate electrode) and the shallow well region to each other through the contact hole. However, a gate electrode (i.e., a semiconductor layer constituting the gate electrode) and a shallow well region have opposite conductivity types in a surface channel type MOS transistor. Therefore, even when the gate electrode (a semiconductor layer constituting the gate electrode) is connected to the shallow well region, a pn junction is formed and therefore an Ohmic contact is not formed.

In the present invention, in connecting the gate electrode and the shallow well region to each other, a metal silicide film and a region of the same conductivity type as that of the shallow well region, which has a high impurity concentration, are provided between the gate electrode and the shallow well region so as to allow an Ohmic contact between a gate electrode and a shallow well region of any conductivity type. More specifically, the gate electrode is electrically connected to the shallow well region in the order of: the gate electrode; the metal silicide layer; the region of the same conductivity type as that of the shallow well region, having a high impurity concentration; and the shallow well region. If an impurity concentration of the region of the same conductivity type as that of the shallow well region, having a high impurity concentration, is set at about $1 \times 10^{20}/cm^3$ or higher, it is possible to form an Ohmic contact between "the metal silicide layer" and "the shallow well region". Since an impurity concentration of "the gate electrode" is originally high (normally, $1 \times 10^{20}/cm^3$ or higher), it is possible to form an Ohmic contact by directly connecting the gate electrode to the metal silicide film.

If the silicide film is directly connected to the shallow well region without providing the region of the same conductivity type as that of the shallow well region, having a high impurity concentration, a Schottky junction between the metal and the semiconductor is formed. Therefore, an Ohmic contact is not formed.

Figure 9A:
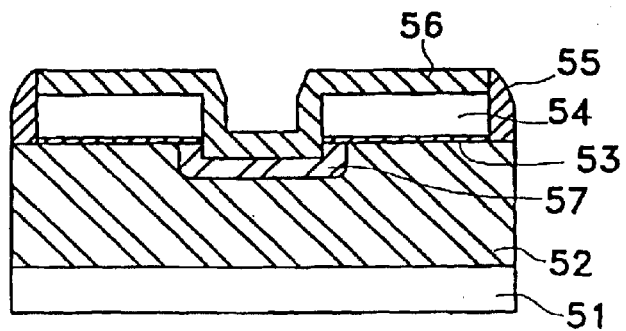
FIG. 9A is a schematic view showing the structure of an Ohmic contact of Example 5.
Figure 9B:
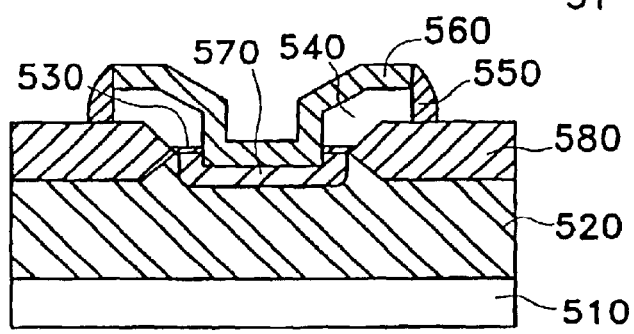
FIGS. 9B to 9E are cross-sectional views showing variations of the structure of an Ohmic contact of Example 5, including the combination of element separation structures.
Figure 9C:
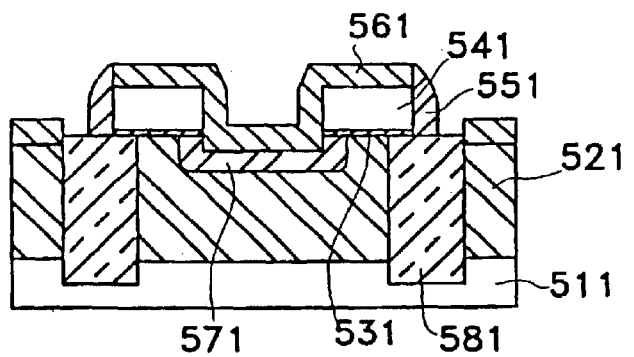
Figure 9D:
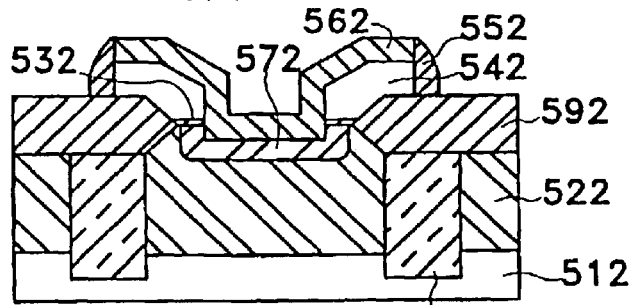

FIG. 9A is a cross-sectional view showing the basic structure of an Ohmic contact according to the present invention. FIGS. 9B to 9E show modified configurations of the structure of the Ohmic contact with various element separation structures. However, the element separation structures are not limited to the groove type element separation structure and the field oxide film as described in Example 5.

In FIGS. 9A to 9E, the reference numerals 51, 510, 511, 512 and 513 denote a deep well region; the reference numerals 52, 520, 521, 522 and 523 denote a shallow well region; the reference numerals 53, 530, 531, 532 and 533 denote a gate oxide film; the reference numerals 54, 540, 541, 542 and 543 denote a gate electrode; the reference numerals 55, 550, 551, 552 and 553 denote a gate electrode side wall oxide film; the reference numerals 56, 560, 561, 562 and 563 denote a metal silicide film; the reference numerals 57, 570, 571, 572 and 573 denote a region of the same conductivity type as that of the shallow well region, having a high impurity concentration; the reference numerals 580, 592, and 593 denote a field oxide film; and the reference numerals 581, 582 and 583 denote a groove type element separation structure.

EXAMPLE 6

Regarding the contact structure for forming an Ohmic contact between the gate electrode and the shallow well region according to the present invention, a structure which is different from those described in Example 5 is described with reference to FIG. 10.

As described above, a gate electrode and a shallow well region have opposite conductivity types in a surface channel type MOS transistor. Therefore, if the gate electrode and the shallow well region are connected to each other, a pn junction is formed and an Ohmic contact is not formed. However, the present invention allows to form an Ohmic contact between the gate electrode and the shallow well region of any conductivity types.

Figure 10:
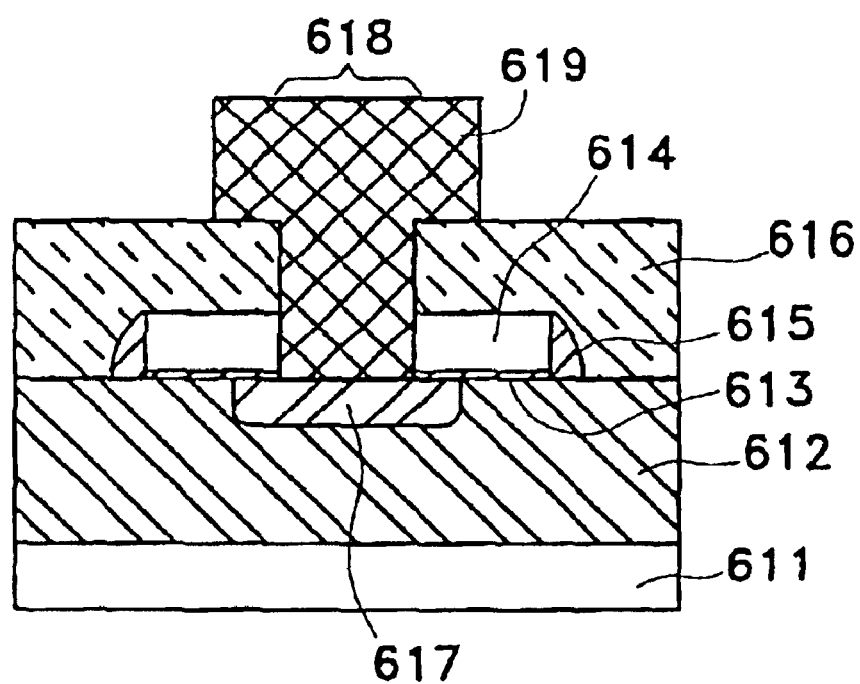
FIG. 10 is a schematic view showing the structure of an Ohmic contact of Example 6.

More specifically, as shown in FIG. 10, an upper metal wiring 619 is provided on the upper part of a semiconductor device through an interlayer insulating film 616. A contact hole 618 is formed through the interlayer insulating film 616 so as to penetrate the gate electrode 614 and the gate oxide film 613 to reach a shallow well region 612. The shallow well region 612 is formed in a deep well region 611 of the opposite conductivity type to that of the shallow well region 612. In this structure, on both sides of the gate electrodes 614, gate side wall oxide films 615 are formed. In the side wall sections of the contact hole 618, the gate electrode 614 and the upper metal wiring 619 are connected to each other so as to form an Ohmic contact. On the bottom of the contact hole 618, the upper metal wiring 619 and the shallow well region 612 are connected to each other through a region 617 of the same conductivity type as that of the shallow well region 612. The region 617 has a high impurity concentration so as to form an Ohmic contact.

According to this structure, by setting the impurity concentration of the high impurity concentration region 617, which has the same conductivity type as that of the shallow well region 612, at about $1 \times 10^{20}/cm^3$ or higher, it is possible to form an Ohmic contact between the upper metal wiring 619 and the shallow well region 612. An impurity concentration of the gate electrode 614 should be set at about $1 \times 10^{20}/cm^3$ or higher in order to prevent the depletion of the gate electrode. Therefore, since the upper metal wiring 619 and the gate electrode 614 are directly connected to form an Ohmic contact, the gate electrode 614 and the shallow well region 612 can be connected to each other through the upper metal wiring 619 to form an Ohmic contact.

Figure 11A:
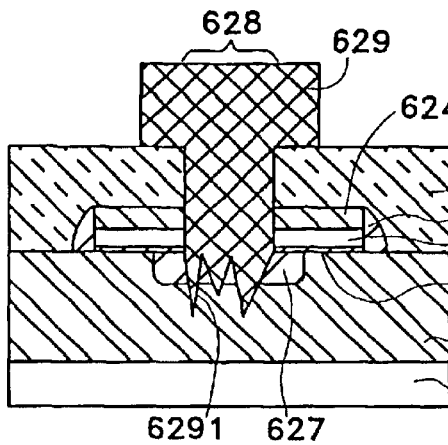
FIGS. 11A to 11F are cross-sectional views showing variations of the structure of an Ohmic contact of Example 6.

A modified configuration of Example 6 is shown in FIG. 11A. In the configuration shown in FIG. 11A, if an upper metal wiring 629 is intended to be formed of an aluminum group material free from silicon (the material is not limited to the aluminum group material, but any metal reacting with silicon may be used), a silicon substrate and the aluminum group material violently react with each other through a post-thermal treatment (for example, a sinter treatment) so as to generate a spike 6291. Therefore, a shallow well region 622 and the upper metal wiring 629 can be connected to each other so as to form an Ohmic contact therebetween. In this case, a region 627 of the same conductivity type as that of the shallow well region 622, having a high impurity concentration, can be omitted. However, with the presence of the region 627 of the same conductivity type as that of the shallow well region 622, having a high impurity concentration, the Ohmic contact can be certainly formed. By forming a gate electrode made of a double layered polycide film of a polycrystalline silicon film 624 and a metal silicide film 6241, a contact resistance between the upper metal wiring 629 and the gate electrode can be further lowered.

Figure 11B:
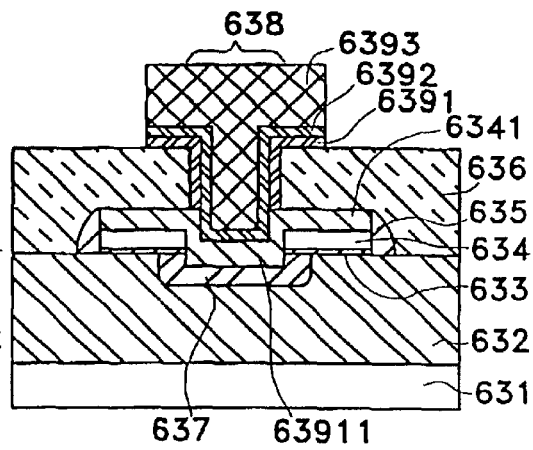
Figure 11C:
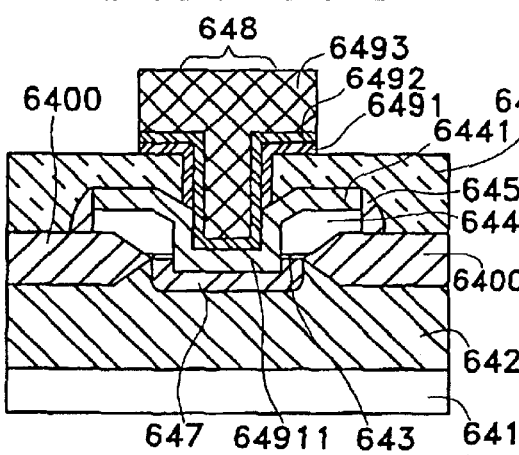
Figure 11D:
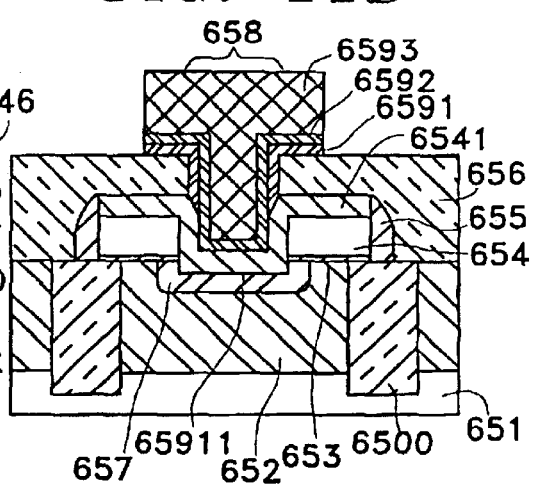
Figure 11E:
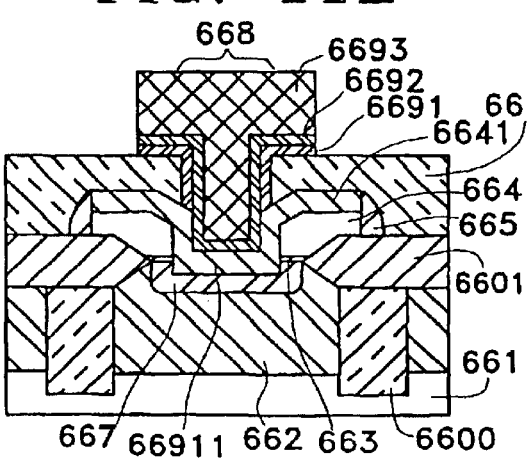
Figure 11F:
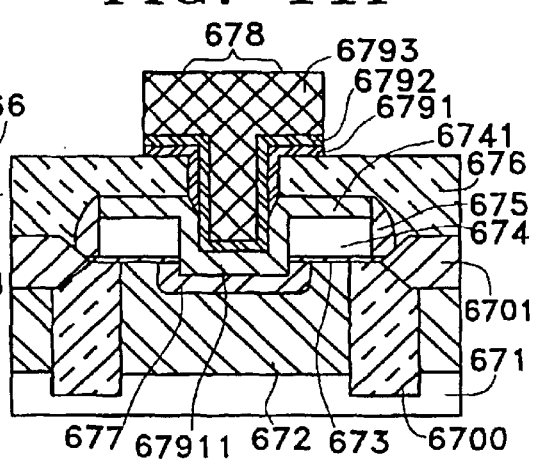

A more general configuration is shown in FIG. 11B. In the configuration shown in FIG. 11B, after forming a gate electrode having a polycide structure (in this example, having a double layered structure of a titanium silicide film 6341 and a polycrystalline silicon film 634), an interlayer insulating film 636 is deposited. After forming a contact hole 638 reaching the silicon substrate through the interlayer insulating film 636, a titanium layer 6391, a titanium nitride layer 6392, and an upper metal wiring 6393 are subsequently deposited. In this example, the titanium layer 6391 has a thickness of about 30 to about 50 nm, and the titanium nitride layer 6392 has a thickness of about 500 to 1000 nm.

Thereafter, annealing is performed in a nitrogen atmosphere at about 700° C. for about 20 seconds. During this annealing, the titanium film 6391 reacts with the titanium silicide film 6341 and the polycrystalline silicon film 634, and also reacts with the silicon substrate (i.e., a region 637 of the same conductivity type as that of the shallow well region 632, having a high impurity concentration). Since a titanium silicide film 63911 is formed in this way, the gate electrode and the shallow well region 632 can be connected to each other so as to form an Ohmic contact therebetween at a low resistivity.

Although Al—Si(1%)-Cu(0.5%) is used as a material of the upper metal wiring 6393, the material of the metal wiring is not limited thereto. The silicide film of the gate electrode of the polycide structure is not limited to the titanium silicide film. A refractory metal silicide film made of cobalt silicide or the like may also be used.

FIGS. 11C to 11F show the combinations of the structure shown in FIG. 11B and an element separation structure. However, this element separation structure is not limited to a groove type element separation structure and/or a field oxide film as described in Example 6.

In FIGS. 11A to 11F, the reference numerals 621, 631, 641, 651, 661 and 671 denote a deep well region; the reference numerals 622, 632, 642, 652, 662 and 672 denote a shallow well region; the reference numerals 623, 633, 643, 653, 663 and 673 denote a gate oxide film; the reference numerals 624, 634, 644, 654, 664 and 674 denote a polycrystalline silicon film; the reference numerals 6241, 6341, 6441, 6541, 6641 and 6741 denote a titanium silicide film; the reference numerals 625, 635, 645, 655, 665 and 675 denote a gate electrode side wall oxide film; the reference numerals 626, 636, 646, 656, 666 and 676 denote an interlayer insulating film; the reference numerals 627, 637, 647, 657, 667 and 677 denote a region of the same conductivity type as that of the shallow well region, having a high impurity concentration; the reference numerals 628, 638, 648, 658, 668 and 678 denote a contact hole; the reference numeral 629 denotes an Al—Cu (0.5%) wiring; the reference numeral 6291 denotes an aluminum alloy spike; the reference numerals 6391, 6491, 6591, 6691 and 6791 denote a titanium film; the reference numerals 63911, 64911, 65911, 66911 and 67911 denote a titanium silicide film; the reference numerals 6392, 6492, 6592, 6692 and 6792 denote a titanium nitride film; the reference numerals 6393, 6493, 6593, 6693 and 6793 denote an Al—Si(1%)-Cu(0.5%) wiring; the reference numerals 6400, 6601, and 6701 denote a field oxide film; and the reference numerals 6500, 6600, and 6700 denote a groove type element separation structure.

EXAMPLE 7

Figure 9E:
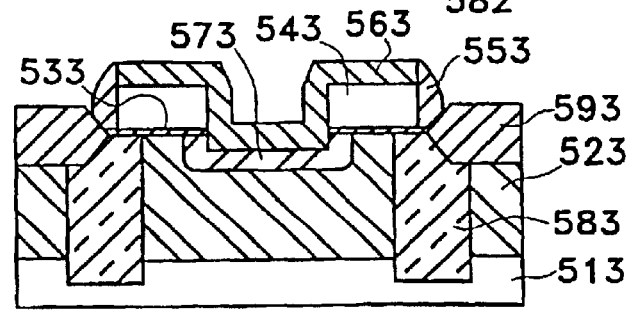

A method for forming the contact structure in Example 5 is described in detail with reference to FIGS. 12A to 12E. In this case, the element separation structure shown in FIG. 9E is used.

Figure 12A:
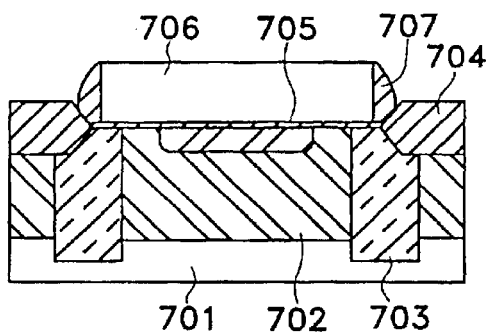
FIGS. 12A to 12E are cross-sectional views showing the fabrication steps of Example 7.

First, as shown in FIG. 12A, in a semiconductor substrate including a deep well region 701 formed therein, a shallow well region 702, a groove type element separation structure 703, and a field oxide film region 704 are formed. Then, impurity ions are implanted into the surface of the shallow well region 702 so as to control a threshold. Thereafter, a gate oxide film 705, a gate electrode 706, and a gate side wall oxide film 707 are formed by a known method.

In Example 7, the impurity concentration of the deep well region 701 is set to be in the range of about $5 \times 10^{16}$ to about $1 \times 10^{17}/cm^3$, and the impurity concentration of the shallow well region 702 is set to be in the range of about $1 \times 10^{17}$ to about $2 \times 10^{17}/cm^3$. The depth of the shallow well region 702 is set to be in the range of about 300 to 700 nm.

A source region and a drain region (not shown) are formed so as to have an impurity concentration of about $1 \times 10^{20}/cm^3$ or higher and a diffusion depth in the range of about 50 nm to 70 nm. The gate oxide film 705 has a thickness of about 3 nm. The gate electrode 706 is made of a polycrystalline silicon film, and has an impurity concentration of about $1 \times 10^{20}/cm^3$ or higher. It is necessary to form the groove type element separation structure 703 so as to have a depth which is sufficiently large with respect to the shallow well region 702 and, desirably, is smaller than that of the deep well region 701. In Example 7, the depth of the deep well region 701 is set to be about 2 μm or larger. The depth of the groove type element separation structure 703 is set to be in the range of about 1 to 2 μm.

Each of the above values is described only by way of example, and therefore the present invention is not limited thereto. These values such as the impurity concentration and diffusion depth vary depending on the design of the transistor.

The transistor of Example 7 has a gate length (a channel length) of about 0.18 μm. The deep well region 701, the source region/drain region (not shown), and the gate electrode 706 have the same conductivity type which is opposite to the conductivity type of the shallow well region 702.

Figure 12B:
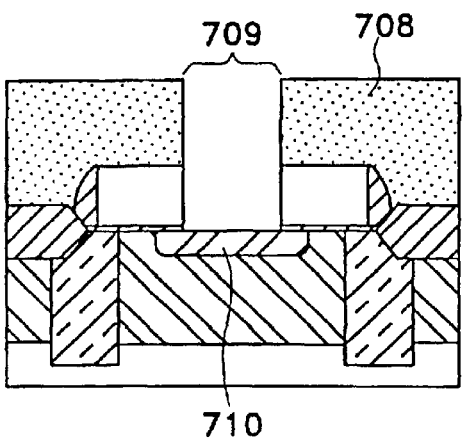

Next, as shown in FIG. 12B, a desired portion of the gate electrode 706 is etched by RIE (reactive ion etching) method using a resist 708 formed by lithography as a mask so as to form a contact hole 709 reaching the shallow well region 702. Thereafter, an impurity of the same conductivity type as that of the shallow well region 702 is implanted by an ion implantation step so as to form a region 710 having a higher impurity concentration than that of the shallow well region 702. In this ion implantation step, for example, if the shallow well region 702 is made of a p-type semiconductor, boron ions are implanted in the amount of about $1 \times 10^{15}$ to $5 \times 10^{15}/cm^2$ with an acceleration voltage of about 5 to 10 keV. If the shallow well region 702 is made of an n-type semiconductor, arsenic ions are implanted in the amount of about $1 \times 10^{15}$ to $5 \times 10^{15}/cm^2$ with an acceleration voltage of about 10 to 30 keV.

Figure 12C:
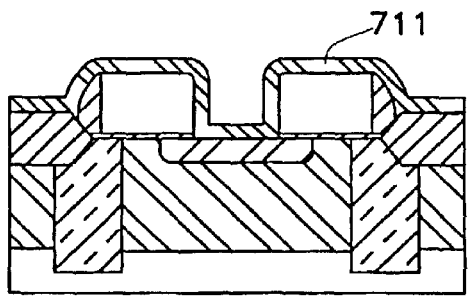

Next, as shown in FIG. 12C, after the resist 708 is removed, a titanium metal film 711 is deposited. In Example 7, the titanium metal film 711 having a thickness in the range of about 20 nm to about 50 nm is deposited in an argon gas atmosphere.

Figure 12D:
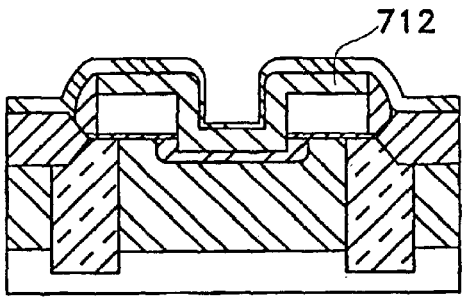

Next, as shown in FIG. 12D, a first quick heating treatment is performed at a temperature in the range of about 600° C. to about 700° C. for about 10 to about 20 seconds in a nitrogen atmosphere so as to allow the titanium metal film 711 and silicon in the silicon substrate to react with each other, thereby forming a titanium silicide film 712. By the first quick heating treatment, part of the impurity implanted into the contact portion region 710 is activated.

Figure 12E:
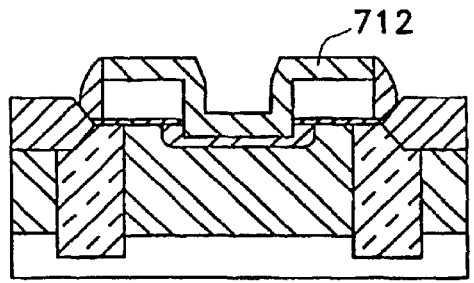

As shown in FIG. 12E, after selectively removing the unreacted and nitronized titanium metal film, a second quick heating treatment is performed at a temperature in the range of about 800° C. to about 1000° C. for about 10 to about 20 seconds in a nitrogen atmosphere, so that the titanium silicide film 712 converts to a C54 crystalline structure with a low resistivity and the impurity implanted into the contact portion 710 is activated.

According to the method of Example 7, it is possible to easily connect the gate electrode 706 and the shallow well region 702 with each other through the titanium silicide film 712. The process for forming the titanium silicide film 712 is basically the same as a process for forming a salicide. A salicide transistor can be formed with merely the addition of the step of forming the contact hole 709 and the step for forming the region 710 having a high impurity concentration. Thus, the number of fabrication steps is not greatly increased as a whole.

In Example 7, impurity ions are implanted into the contact portion while the surface of the silicon substrate (the surface of the shallow well region 702) is exposed. Therefore, there is a possibility that a contaminant from the resist may contaminate the surface of the silicon substrate (the shallow well region 702). In the case where ion implantation is performed so as to form a junction, the junction leak current is increased to produce an undesirable result because a contaminant form a deep level which acts as a recombination center. However, the ion implantation of this example is performed not to form a junction but to form an Ohmic contact. Therefore, the adverse effect of the contaminant can be reduced.

In the case where the surface of the silicon substrate (the shallow well region 702) is damaged by contact etching to form the contact hole 709, the etching may be completed when the gate oxide film on the bottom of the contact hole 709 is exposed by RIE having a high etching selectivity for polycrystalline silicon film and silicon oxide film. Then, the gate oxide film 705 may be removed by a hydrofluoric acid type solution or an oxide film etching type RIE.

In the case where the effect of a contaminant from the resist may be a problem, the etching may be completed when the gate oxide film on the bottom of the contact hole 709 is exposed by RIE having a high etching selectivity of polycrystalline silicon film and silicon oxide film so as to leave the gate oxide film 705. Then, the impurity ion implantation to the contact portion may be performed through the gate oxide film 705. By this method, however, oxygen is knocked on from the gate oxide film 705 toward the surface of the shallow well region 702 during ion implantation. Therefore, during a silicidation reaction, knock-on oxygen produces an adverse effect on the silicide film, resulting in deterioration of the quality of the silicide film.

EXAMPLE 8

Another method for forming a contact structure for connecting the gate electrode and the shallow well region will be described with reference to FIGS. 13A to 13H. In Example 8, a method with a reduced possibility of contamination due to the resist and contamination during silicidation due to the knocked-on oxygen as compared with the method in Example 7 will be described.

Figure 13A:
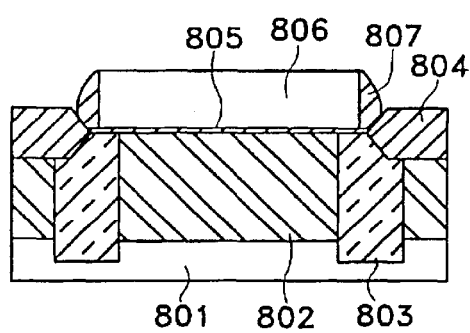
FIGS. 13A to 13H are cross-sectional views showing the fabrication steps of Example 8.

First, as shown in FIG. 13A, as in FIG. 12A, a deep well region 801 is formed in a semiconductor substrate. Then, after a shallow well region 802, a groove type element separation structure 803, and a field oxide film region 804 are formed in the semiconductor substrate, impurity ion implantation or the like for controlling a threshold value is performed. Thereafter, a gate oxide film 805, a gate electrode 806, and a gate side wall oxide film 807 are formed by a known method. In Example 8, the impurity concentration of the deep well region 801 is set to be in the range of about $5 \times 10^{16}$ to about $1 \times 10^{17}/cm^3$, and the-impurity concentration of the shallow well region is set to be in the range of about $1 \times 10^{17}/cm^3$ to about $2 \times 10^{17}/cm^3$. The depth of the shallow well region 802 is set to be in the range of about 300 nm to 700 nm. Source/drain regions (not shown) have an impurity concentration set to be about $1 \times 10^{20}/cm^3$ or higher and a junction depth in the range of about 50 to 70 nm.

The gate oxide film 805 has a thickness of about 3 nm. The gate electrode 806 is made of a polycrystalline silicon film. The impurity concentration of the gate electrode 806 is set to be about $1 \times 10^{20}/cm^3$ or higher. The groove type element separation structure 803 should have a depth which is sufficiently large with respect to the shallow well region 802 and, desirably, is smaller than that of the deep well region 801. The depth of the deep well region 801 is set to be about 2 $\mu$m or more, and the depth of the groove type element separation structure 803 is set to be in the range of about 1 to 2 $\mu$m.

These values are merely exemplary values used for fabricating a sample device. Therefore, the present invention is not limited thereto. These impurity concentrations and the depths vary in accordance with the design of the transistor. The transistor is formed so as to have a gate length of about 0.18 $\mu$m. The deep well region 801, the source region/drain region (not shown), and the gate electrode 806 have the same conductivity type, which is opposite to that of the shallow well region 802.

Figure 13B:
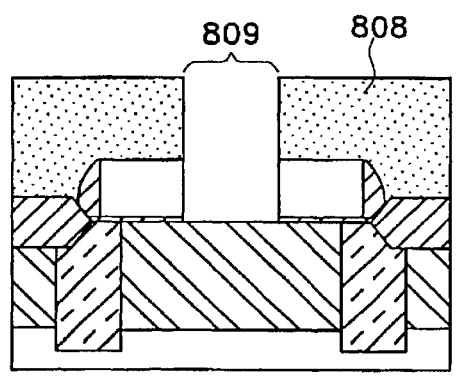

Next, as shown in FIG. 13B, a contact hole 809 reaching the shallow well region 802 is formed in a desired region of the gate electrode 806 by RIE using a photoresist 808 as a mask. If the surface of the silicon substrate (the shallow well region 802) is damaged by contact etching, the etching may be completed when the gate oxide film on the bottom of the contact hole 809 is exposed by RIE having a high etching selectivity for polycrystalline silicon film and silicon oxide film. Then, the remaining gate oxide film 805 may be removed by a hydrofluoric acid type solution or oxide film etching type RIE.

Figure 13C:
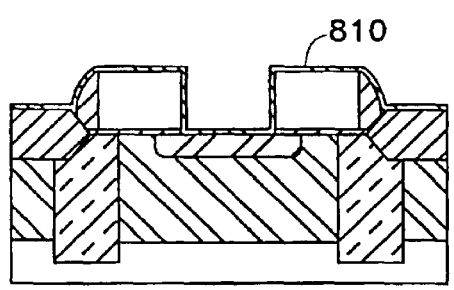

Next, as shown in FIG. 13C, the photoresist 808 is removed, and a silicon nitride film 810 is deposited. In Example 8, the silicon nitride film 810 is deposited by liquid phase chemical vapor deposition (LPCVD) so as to have a thickness of about 2 to 5 nm.

Figure 13D:
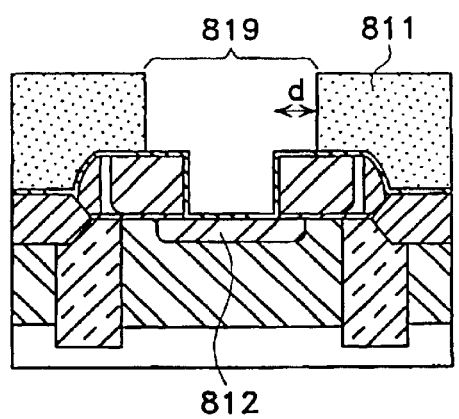

Next, as shown in FIG. 13D, ion implantation is performed into the bottom of the contact hole 809 using a photoresist 811 which has an opening 819 as a mask so as to form a region 812, with the same conductivity type as that of the shallow well region 802, having a higher impurity concentration than that of the shallow well region 802. In Example 8, if the shallow well region 802 is made of a p-type semiconductor, boron ions are implanted in the amount of about $1 \times 10^{15}$ to $5 \times 10^{15}/cm^2$ at an acceleration voltage of about 5 to 10 keV. If the shallow well region 802 is made of an n-type semiconductor, arsenic ions are implanted in the amount of about $1 \times 10^{15}$ to $5 \times 10^{15}/cm^2$ at an acceleration voltage of about 10 to 30 keV. Since nitrogen is knocked on instead of oxygen during ion implantation through the silicon nitride film 810, a silicidation reaction in the later step can be performed with good controllability.

The photoresist 811 (ion implantation mask) and the contact hole 809 should have such a positional relationship that the edge of the opening 819 in the photoresist 811 is positioned outside of the edge of the contact hole 809 by a margin (a distance d) for the misalignment. An impurity providing the same conductivity type as that of the shallow well region 802 is implanted into part of the gate electrode 806. As a result, since the gate electrode 806 originally has an opposite conductivity type to that of the shallow well region 802, only the region of the gate electrode 806 which is subjected to contact implantation approaches an intrinsic semiconductor or obtains the same conductivity type as that of the shallow well region 802; or, in the worst case, a pn junction is formed in the gate electrode 806. However, since the silicidation of the gate electrode 806 is performed by the later process, an Ohmic contact is not affected thereby.

Figure 13E:
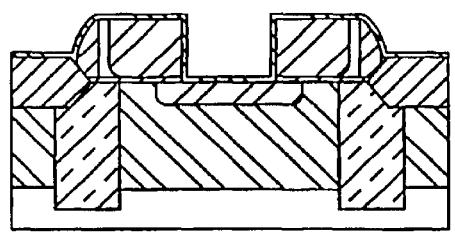
Figure 13F:
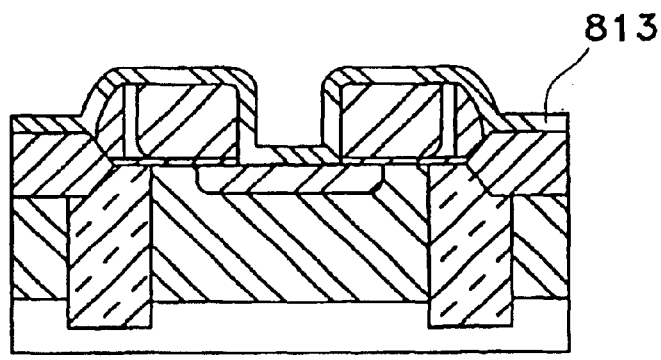

Next, after the photoresist 811 is removed as shown in FIG. 13E, a titanium metal film 813 is deposited as shown in FIG. 13F. In Example 8, the titanium metal film 813 is deposited by sputtering in an argon gas atmosphere so as to have a thickness in the range of about 20 nm to about 50 nm.

Figure 13G:
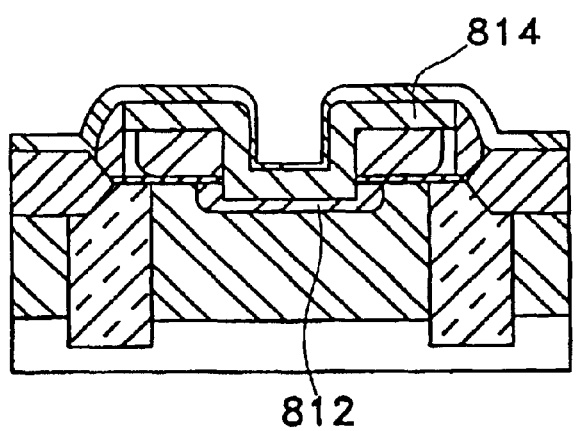
Figure 13H:
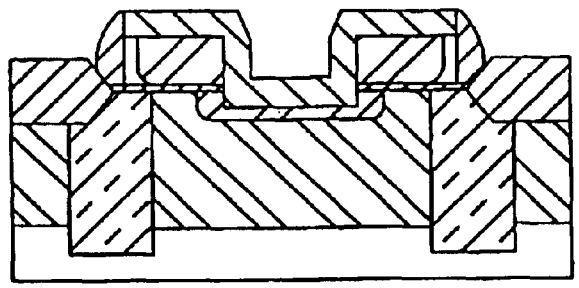

Next, as shown in FIG. 13G, a first quick heating treatment is performed at a temperature in the range of about 600° C. to about 700° C. for about 10 to about 20 seconds in a nitrogen atmosphere so as to allow the titanium metal film 813 and silicon in the silicon substrate (the shallow well region 802) and in the gate electrode 806 to react with each other, thereby forming a titanium silicide film 814. By the first quick heating treatment, part of the impurity implanted into the contact portion (region 812) is activated.

Then, after selectively removing the unreacted and nitronized titanium metal film, a second quick heating treatment is performed at a temperature in the range of about 800° C. to about 1000° C. for about 10 to about 20 seconds in a nitrogen atmosphere, so that the titanium silicide film 814 converts to a C54 crystalline structure with a low resistivity and the impurity implanted into the contact portion (region 812) is activated.

Since nitrogen instead of oxygen is knocked on into the silicon substrate in this example, nitrogen segregates in the grain boundary region of the silicide film. As a result, the heat resistance of the silicide film is increased. Moreover, since a contaminant is prevented from entering from the photoresist by the silicon nitride film 810 serving as an implantation protective film, the silicide film is hardly contaminated.

In the case where the simplification of the steps is given priority, impurity ions may be directly implanted without depositing the silicon nitride film 810. However, as previously described in Example 7, the silicide film is contaminated during ion implantation in such a case.

In Example 8, one step, that is, the step for forming an implantation mask for selectively implanting impurity ions to the region where a contact is to be formed, is added as compared with the method of Example 7. However, in the case where a complementary MOS structure is formed, it is necessary to independently perform the ion implantation for an N-channel transistor and a P-channel transistor. Therefore, the step of forming an implantation mask should be performed at least twice in total. Thus, in the case where the ion implantation is performed for the region where a contact is to be formed by using an implantation mask for forming a contact, it is necessary to form independent contact holes for a contact of an N-channel transistor and for a contact of a P-channel transistor, respectively.

In view of these points, the method of Example 8 is not as complicated when compared with the method of Example 7 in the case where the semiconductor device has a complementary MOS structure.

In the case where a complementary MOS structure is formed by the method of Example 7, the fabrication process is performed in the following order: photolithography for the N-channel (P-channel) contact; the formation of the N-channel (P-channel) contact hole; ion implantation into the p-well region (n-well region) for the formation of contact; photolithography for P-channel (N-channel) contact; the formation of the P-channel (N-channel) contact hole; and ion implantation into the n-well region (p-well region) for the formation of contact.

On the other hand, in Example 8, the fabrication process is performed in the following order: photolithography for the formation of a contact hole; simultaneous formation of the N-channel contact hole and the P-channel contact hole; photolithography for ion implantation into the contact region for the N-channel (P-channel); ion implantation into p-well region (n-well region) for the formation of a contact; P-channel (N-channel) contact implantation photolithography; and n-well region (p-well region) contact implantation. Therefore, although the number of photolithography steps is reduced by one in Example 7 when compared with Example 8, one contact hole formation step is added in Example 7.

In the case where the ion implantation for the formation of source/drain regions and the ion implantation for the formation of a contact are conducted by using the same mask in the process of forming a complementary MOS structure as described in Example 13 below, the number of photolithography steps is reduced by one in Example 8 when compared with the method of Example 7. This is because the photolithography step for forming a mask for the formation of a contact hole cannot be used in ion implantation for the formation of source/drain regions in order to prevent the source/drain regions from being damaged.

EXAMPLE 9

By the method of Example 9, after forming a refractory metal silicide film in a self-aligned manner, impurity ions are implanted into the shallow well region by ion implantation so as to form a high concentration diffusion layer having the same conductivity type as that of the shallow well region in the shallow well region on the bottom of a contact hole.

FIGS. 14A to 14F are cross-sectional views showing the method of Example 9 in a simplified manner.

Figure 14A:
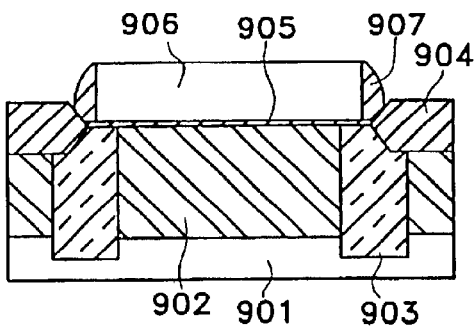
FIGS. 14A to 14F are cross-sectional views showing the fabrication steps of Example 9.

First, as shown in FIG. 14A, similarly to the step shown in FIG. 12A, a deep well region 901 is formed in a semiconductor substrate (not shown). Then, a shallow well region 902, a groove type element separation structure 903, and a field oxide film region 904 are formed in the semiconductor substrate. After implanting impurity ions so as to control a threshold value, a gate oxide film 905, a gate electrode 906, and a gate side wall oxide film 907 are formed by a known method.

In Example 9, the impurity concentration of the deep well region 901 is set to be in the range of about $5 \times 10^{16}$ to about $1 \times 10^{17}/cm^3$, and the impurity concentration of the shallow well region 902 is set to be in the range of about $1 \times 10^{17}/cm^3$ to about $2 \times 10^{17}/cm^3$. Although not shown, a source region and a drain region have an impurity concentration of about $1 \times 10^{20}/cm^3$ or higher and a depth of about 50 to 70 nm. The gate oxide film 905 has a thickness of about 3 nm. The gate electrode 906 is made of a polycrystalline silicon film, and has an impurity concentration of about $1 \times 10^{20}/cm^3$ or higher.

It is necessary to form the groove type element separation structure 903 so as to have a depth which is sufficiently large with respect to the shallow well region 902 and, desirably, is smaller than that of the deep well region 901. In Example 9, the depth of the deep well region 901 is set to be about 2 $\mu$m or larger. The depth of the groove type element separation structure 903 is set to be in the range of about 1 to 2 $\mu$m.

Each of the above values is described only by way of example, and therefore the present invention is not limited thereto. These values such as the impurity concentration and diffusion depth may vary depending on the design of a transistor. The transistor in Example 9 has a gate length of about 0.18 μm. The deep well region 901, the source region/drain region (not shown), and the gate electrode 906 have the same conductivity type which is opposite to that of the shallow well region 902.

Figure 14B:
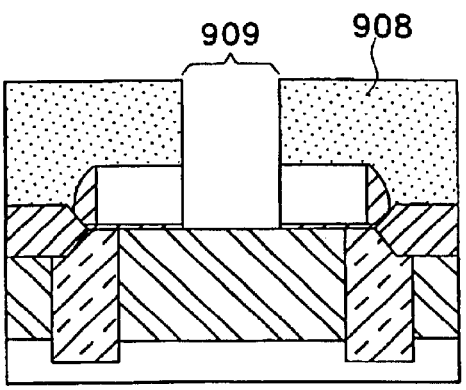

Next, as shown in FIG. 14B, a contact hole 909 reaching the shallow well region 902 is formed in a desired region of the gate electrode 906 by RIE using a photoresist 908 as a mask. If the surface of the silicon substrate (the shallow well region 902) is damaged by etching for the contact hole, the etching may be completed when the gate oxide film 905 on the bottom of the contact hole 909 is exposed by RIE having a high etching selectivity for polycrystalline silicon film and silicon oxide film. Then, the remaining gate oxide film 905 may be removed by a hydrofluoric acid type solution or RIE which are effective for etching an oxide film.

Figure 14C:
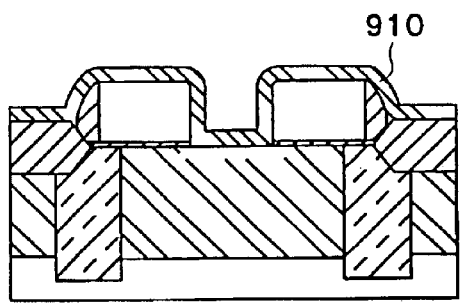

Next, as shown in FIG. 14C, after the photoresist 908 is removed, a titanium metal film 910 is deposited. In Example 9, the titanium metal film 910 is deposited by sputtering in an argon gas atmosphere so as to have a thickness in the range of about 20 nm to 50 nm.

Figure 14D:
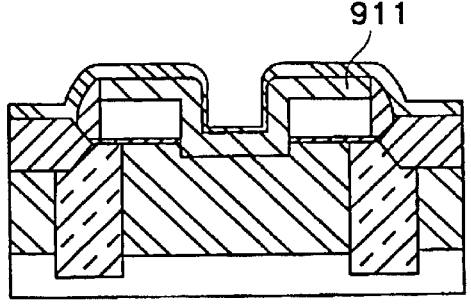

Next, as shown in FIG. 14D, a first quick thermal treatment is performed at a temperature in the range of about 600 to 700° C. in a nitrogen atmosphere for about 10 to 20 seconds so as to allow the titanium metal 910 and silicon in the silicon substrate (the shallow well region 902) and in the gate electrode 906 to react with each other, thereby forming a titanium silicide film 911.

Figure 14E:
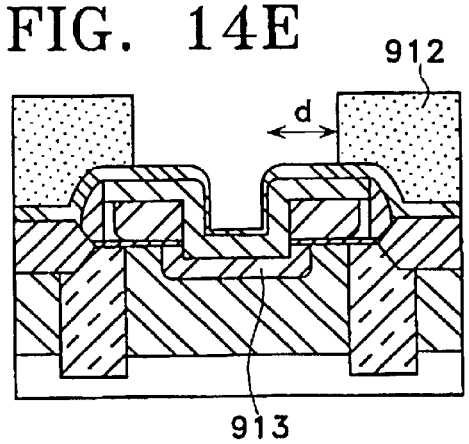

Next, as shown in FIG. 14E, ion implantation is performed in the bottom of the contact hole 909 using a photoresist 912 as a mask so as to form a region 913, with the same conductivity type as that of the shallow well region 902, having a higher impurity concentration than that of the shallow well region 902. In Example 9, if the shallow well region 902 is made of a p-type semiconductor, boron ions are implanted in the amount of about $1 \times 10^{15}/cm^2$ to $5 \times 10^{15}/cm^2$ at an acceleration voltage of about 5 to 10 keV. If the shallow well region 902 is made of an n-type semiconductor, arsenic ions are implanted in the amount of about $1 \times 10^{15}/cm^2$ to $5 \times 10^{5}/cm^2$ at an acceleration voltage of about 10 to 30 keV.

The photoresist 912 (ion implantation mask) and the contact hole 909 should have such a positional relationship that the edge of the opening in the photoresist 912 is positioned outside of the edge of the contact hole 909 by a margin (a distance d) for the misalignment. An impurity providing the same conductivity type as that of the shallow well region 902 is implanted into part of the gate electrode 906. As a result, since the gate electrode 906 originally has the opposite conductivity type as that of the shallow well region 902, only the region of the gate electrode 906 which is subjected to contact implantation approaches an intrinsic semiconductor or obtains the same conductivity type as that of the shallow well region 902. In the worst case, a pn junction is formed in the gate electrode 906. However, since the gate electrode is polycided, an Ohmic contact is not affected thereby.

Figure 14F:
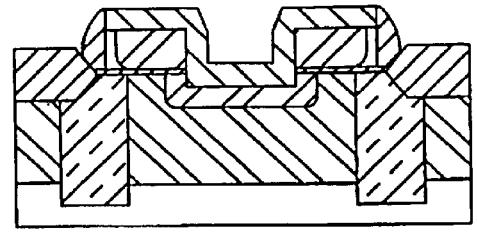

Next, as shown in FIG. 14F, the photoresist 912, and the unreacted and nitronized titanium metal film 910 are selectively removed. A second quick heating treatment is performed at a temperature in the range of about 800° C. to about 1000° C. for about 10 to about 20 seconds in a nitrogen atmosphere, so that the titanium silicide film 911 converts to a C54 crystalline structure with a low resistivity and the impurity implanted into the contact portion (region 913) is activated.

Since titanium instead of oxygen is knocked on into silicon during ion implantation, oxygen hardly segregates in the grain boundary region of the silicide film, resulting in an increased heat resistance of the silicide film 911. Since contamination from the photoresist 912 can be prevented by the unreacted and nitronized titanium metal film 910 serving as an implantation protective film, the level of contamination is reduced.

EXAMPLE 10

Figure 15:
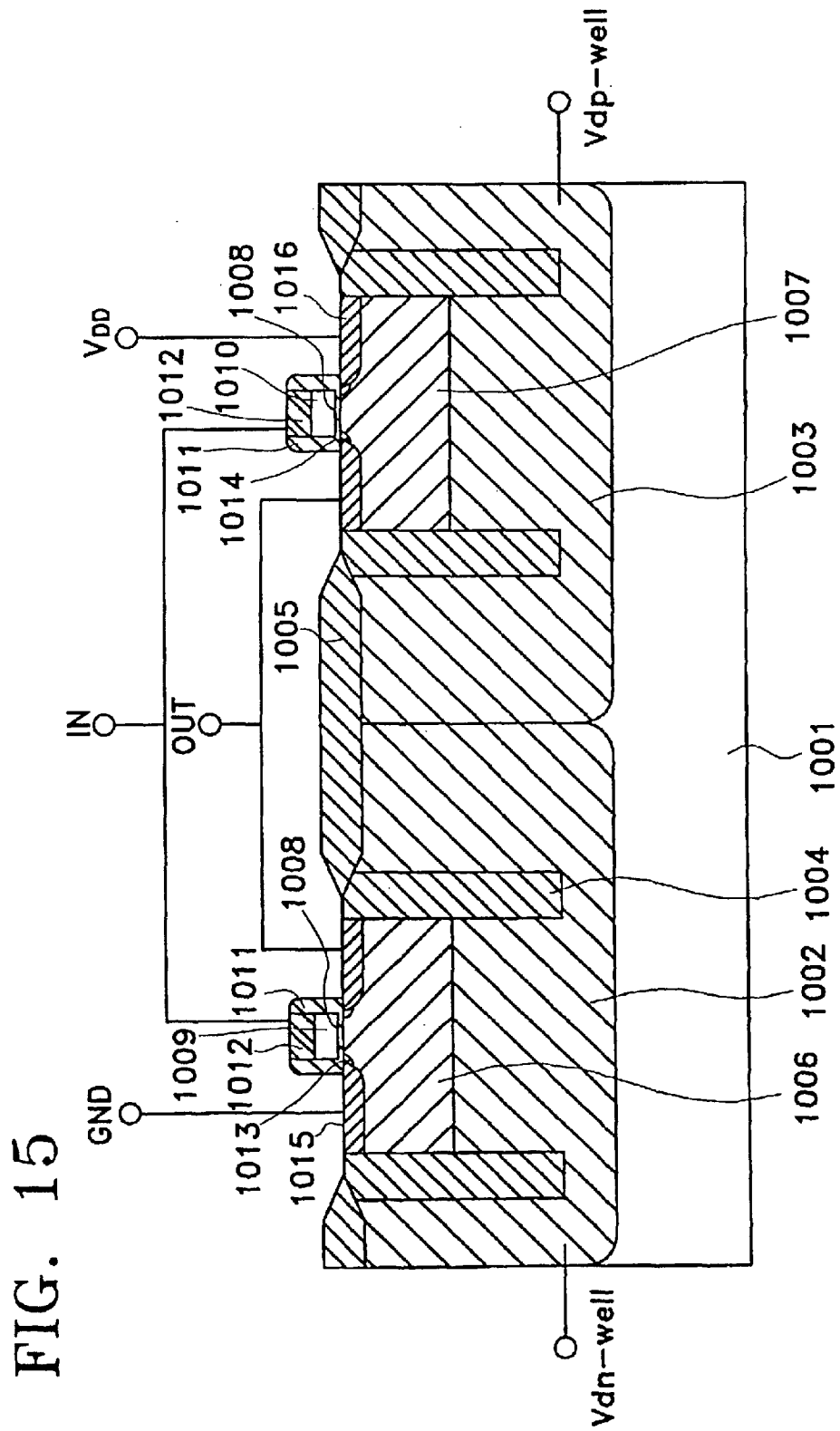
FIG. 15 is a cross-sectional view showing the structure of a semiconductor device of Example 10.
Figure 16:
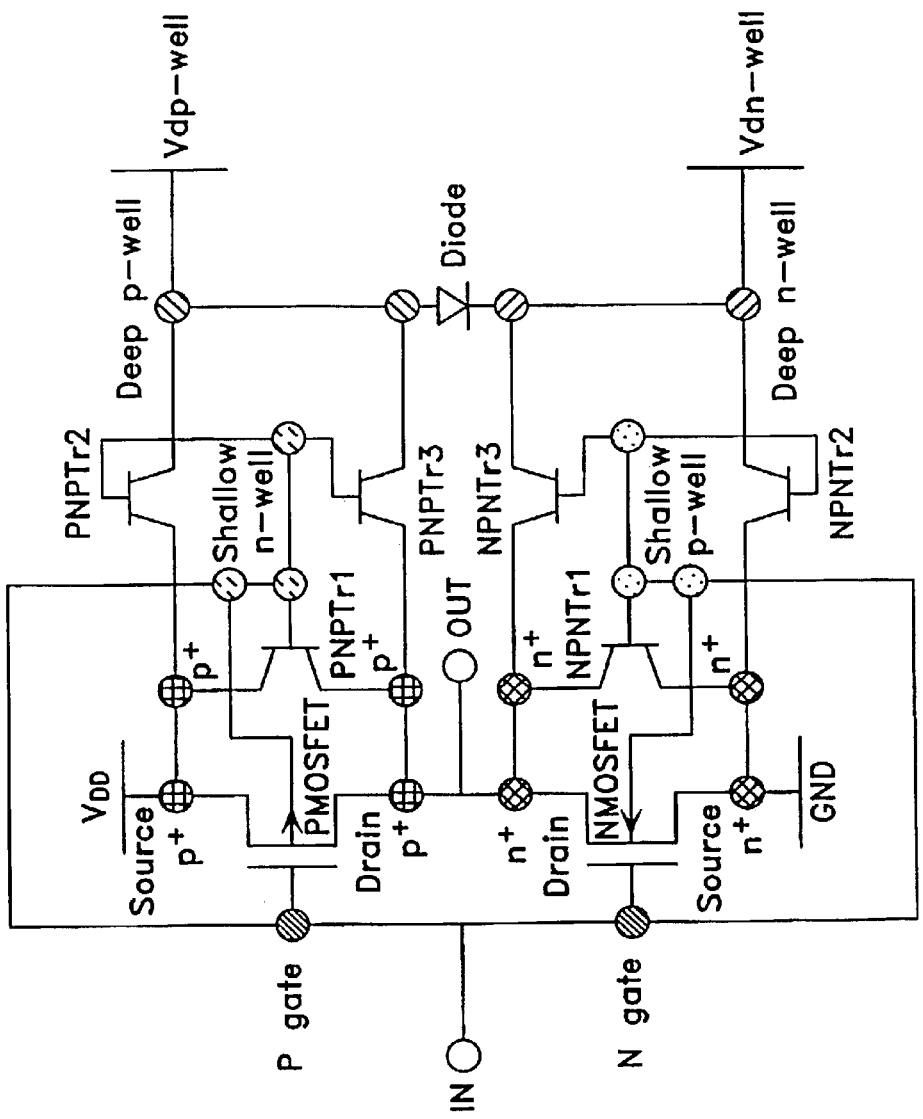
FIG. 16 is a circuit diagram showing the structure of a semiconductor device of Example 10.

A semiconductor device having a complementary MOS structure of Example 10 according to the present invention will be described with reference to FIGS. 15 and 16. FIG. 15 shows the structure of the semiconductor device of Example 10, and FIG. 16 is an equivalent circuit diagram thereof. FIG. 15 shows a CMOS inverter which has a varying potential level of an output OUT between a power supply voltage $V_{DD}$ and a ground voltage GND in response to a potential level of an input IN. In Example 10, transistor elements fabricated according to Examples 1 to 4 respectively having different conductivity types are formed in the same semiconductor substrate so as to be complementarily connected to each other.

As shown in FIG. 15, a deep n-well region 1002 and a deep p-well region 1003 are provided in a semiconductor substrate 1001. A shallow p-well region 1006 is formed in the deep n-well region 1002, and a shallow n-well region 1007 is formed in the deep p-well region 1003. In FIG. 15, a pair of MOS transistors having a complementary relationship therebetween are shown. In actuality, however, a larger number of pairs of MOS transistors are integrated onto a single substrate.

An N-channel MOS transistor element is formed in the shallow p-well region 1006, and a P-channel MOS transistor element is formed in the shallow n-well region 1007.

The N-channel MOS transistor element includes n-type source/drain regions 1015 formed in the vicinity of the upper surface of the shallow p-well region 1006, an n-type extended junction region 1013, a gate insulating film 1008 formed on a channel region formed between the source region 1015 and the drain region 1015, and an n-type gate electrode 1009 formed on the gate insulating film 1008. The n-type gate electrode 1009 is electrically connected to the shallow p-well region 1006.

The P-channel MOS transistor element includes p-type source/drain regions 1016 formed in the vicinity of the upper surface of the shallow n-well region 1007, a p-type extended junction region 1014, a gate insulating film 1008 formed on a channel region formed between the source region 1016 and the drain region 1016, and a p-type gate electrode 1010 formed on the gate insulating film 1008. The p-type gate electrode 1010 is electrically connected to the shallow n-well region 1007.

For each of the transistors, refractory metal silicide films 1012 are formed on the gate electrodes 1009 and 1010. On side faces of each of the gate electrodes 1009 and 1010, side wall insulating films (side wall spacers) 1011 are formed.

The extended junction regions 1013 and 1014 are provided so as to enhance the transistor driving force while inhibiting short channel effect. Each of the extended junction regions 1013 and 1014 has a junction depth of, for example, about 20 to 70 nm and an impurity concentration in the range of about $1 \times 10^{19}/cm^3$ to $1 \times 10^{20}/cm^3$.

The size of each section, impurity concentration thereof or the like are as described in Example 2. The operation of each of the transistors is the same as described in Examples 1 and 2.

In the circumferential region of each of the shallow p-well region 1006 and the shallow n-well region 1007, a groove type element separation structure 1004 is provided. A field element separation region 1005 is formed on an inactive region (field region) on the surface of the substrate 1001.

Although not shown in FIG. 15, a plurality of shallow p-well regions 1006 can be formed in one deep n-well region 1002. Although adjacent p-well regions 1006 should be electrically separated from each other, the deep n-well region 1002 may be used for a plurality of transistors. Therefore, the groove type element separation structure 1004 is formed so as to have a larger depth than that of the shallow well regions 1006 and 1007 but so as not to reach the lower end of the deep well regions 1002 and 1003.

By constituting a dynamic threshold voltage transistor so as to have the above complementary structure, a circuit of low power consumption can be advantageously obtained with ease.

The problem of a complementary MOS transistor is in that a pn junction forward current always flows through any one of the N-channel MOS transistor element and the P-channel MOS transistor element. The term "pn junction forward current" herein includes not only a current flowing across a pn junction formed between the shallow well region and the source/drain regions, but depending on the bias of the deep well region, a current flowing across a pn junction formed between the shallow well region and the deep well region.

This phenomenon will be described in detail with reference to FIG. 16.

In a standby state, the level of an input IN is set at High (the power supply voltage $V_{DD}$ level) or Low (GND level). In this standby state, parasitic bipolar transistors (PNPTr1, PNPTr2, and PNPTr3) on the P-channel MOS transistor side or parasitic bipolar transistors (NPNTr1, NPNTr2, and NPNTr3) on the N-channel MOS transistor side are turned ON so as to allow a parasitic bipolar current to flow therethrough. Even if a parasitic bipolar current is negligibly small, a pn junction forward current continues to flow.

Regarding the potential of the deep well region, as described in Table 1 of Example 2, in the case where the deep n-well region is set at GND and the deep p-well region is set at $V_{DD}$ (the power supply voltage), it is effective for the MOS transistors because the parasitic bipolar transistors operate so as to help the MOS transistors. In this case, however, a forward bias is applied to a diode junction formed between the deep p-well region and the deep n-well region, resulting in a forward current always flowing through the diode junction.

In order to prevent the forward current from flowing through the diode junction between the deep p-well region and the deep n-well region, it is sufficient that the deep p-well region and the deep n-well region are set at the same potential, for example, $\frac{1}{2}V_{DD}$ (a half of the power supply voltage), or that the potential of the deep n-well region is set at the level of $V_{DD}$ and the potential of the deep p-well region is set at the level of GND.

In this case, as described in Example 2, since the parasitic bipolar transistors PNPTr3 and NPNTr3 operate so as to obstruct the operation of the MOS transistors, it is necessary to lower the ability of the parasitic bipolar transistors to such a level that the operation of the parasitic bipolar transistors will be negligible, by increasing a base width and lowering an impurity concentration of the base. In order to lower the ability of the parasitic bipolar transistors to produce the current which obstructs the operation of the MOS transistors, the shallow well region is formed so as to have a base width of about 200 nm or longer, and an impurity concentration of about $2\times10^7/cm^3$ or less for reducing the impurity concentration of the base.

EXAMPLE 11

As described above, regarding the potential of the deep well regions, in the case where the potential of the deep n-well region is set at the GND level and the deep p-well region is set at the $V_{DD}$ (power supply voltage) level as described in Table 1 of Example 2, the parasitic bipolar transistors operate so as to help the operation of the MOS transistor. However, according to the configuration of Example 10, since a forward bias is applied to the diode junction formed between the deep p-well region and the deep n-well region, a forward current continues to flow disadvantageously.

According to the configuration of Example 11, a deeper well region having the opposite conductivity type to that of the deep well region is provided. Furthermore, a groove type element separation structure is provided at the boundary between the deep p-well region and the deep n-well region so as to have a larger depth than that of the deep well regions.

Figure 17:
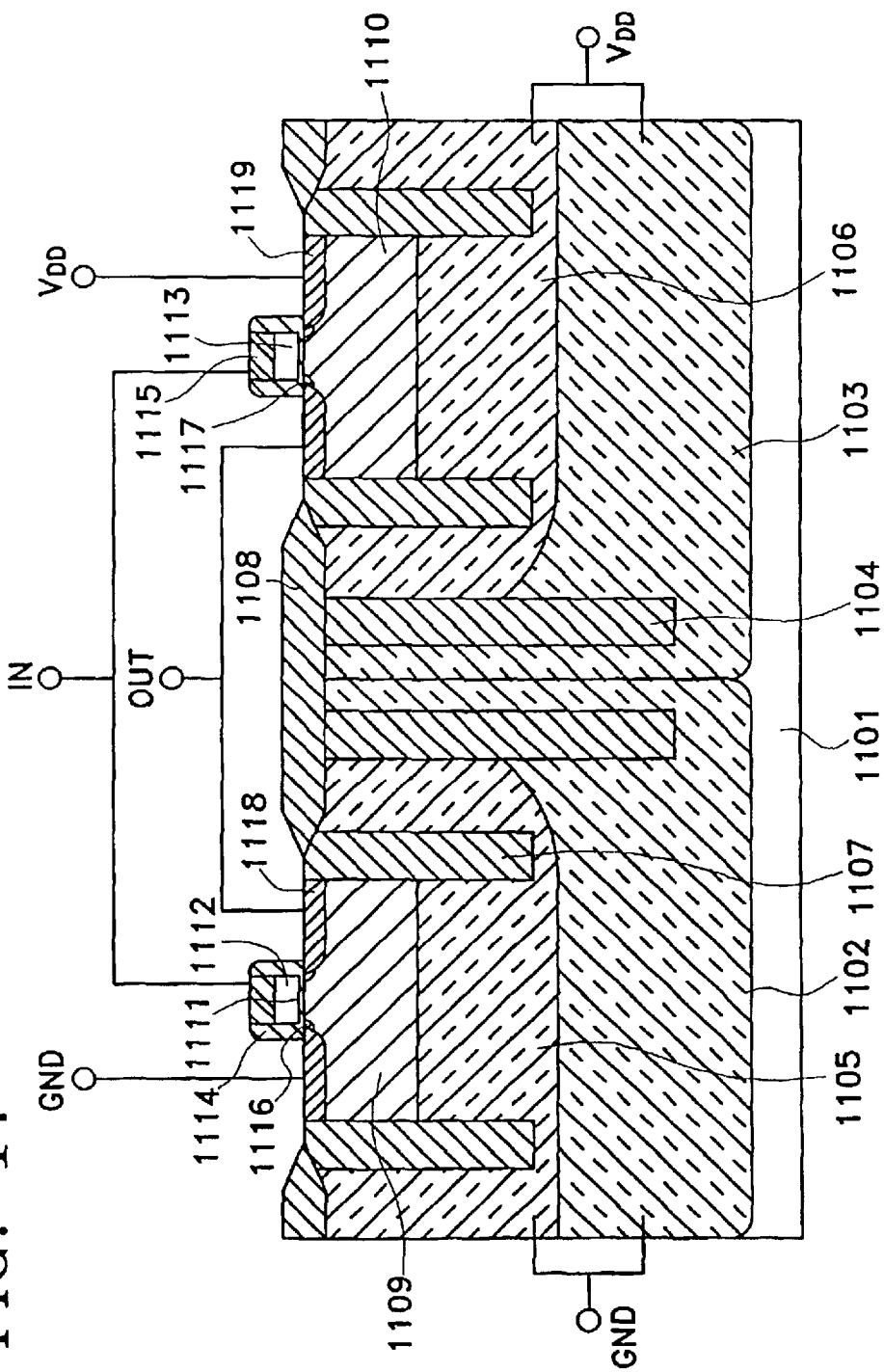
FIG. 17 is a cross-sectional view showing the structure of a semiconductor device of Example 11.
Figure 18:
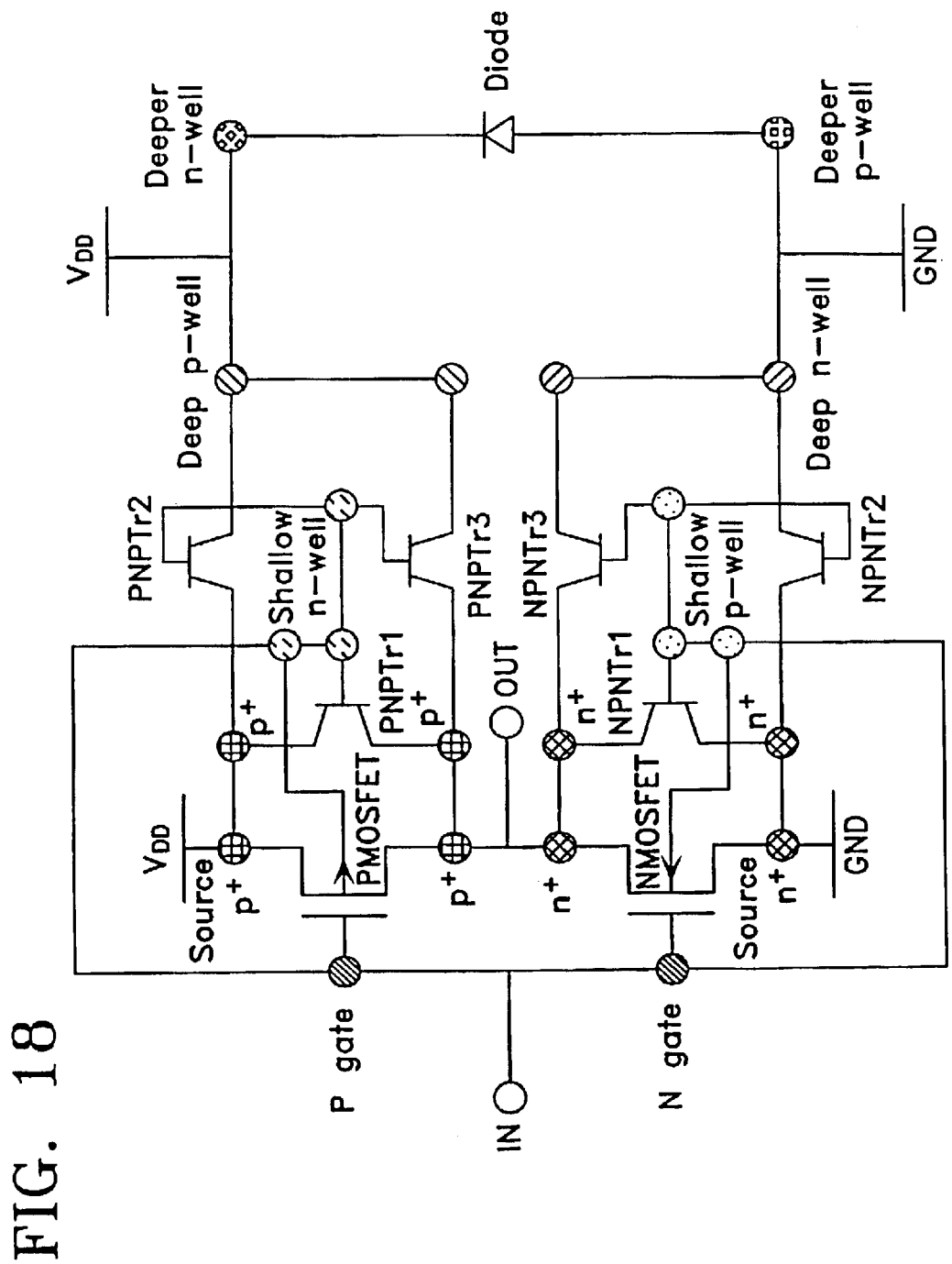
FIG. 18 is a circuit diagram showing the structure of a semiconductor device of Example 11.

With reference to FIGS. 17 and 18, Example 11 is described. FIG. 17 is a cross-sectional view showing the structure of a semiconductor device of Example 11, and FIG. 18 is a circuit diagram of the semiconductor device of Example 11.

In FIG. 17, the reference numeral 1101 denotes a semiconductor substrate; the reference numeral 1102 denotes a deeper p-well region; the reference numeral 1103 denotes a deeper n-well region; the reference numeral 1104 denotes a groove-type element separation structure which is formed so as to have a larger depth than that of the deep well regions but so as not to reach the lower end of the deeper well regions; the reference numeral 1105 denotes a deep n-well region; the reference numeral 1106 denotes a deep p-well region; the reference numeral 1107 denotes a groove-type element separation structure which is shallower than the deep well regions and deeper than the shallow well regions; the reference numeral 1108 denotes a field element separation region; the reference numeral 1109 denotes a shallow p-well region; the reference numeral 1110 denotes a shallow n-well region; the reference numeral 1111 denotes a gate oxide film; the reference numeral 1112 denotes an n-type gate electrode; the reference numeral 1113 denotes a p-type gate electrode; the reference numeral 1114 denotes a gate side wall insulating film; the reference numeral 1115 denotes a refractory metal silicide film; the reference numeral 1116 denotes an n-type projecting junction; the reference numeral 1117 denotes a p-type projecting junction; the reference numeral 1118 denotes n-type source region/drain region; and the reference numeral 1119 denotes p-type source region/drain region.

The deeper well regions 1102 and 1103 have an impurity concentration in the range of about $1\times10^{16}$ to about $1\times10^{17}/cm^2$. The depth of the deeper well regions 1102 and 1103 is set at about 5 µm or more. The deep well regions 1105 and 1106 have a depth in the range of about 2 to 4 µm. The other conditions are as described in Example 10. However, the conditions are not limited to those described above.

According to Example 11, as shown in FIGS. 17 and 18, the deep well regions are separated from each other by the deeper well regions without directly forming a pn junction therebetween. Moreover, a pn-junction between the adjacent deeper well regions is reverse biased. Thus, a pn-junction forward current does not flow between the deep well regions as in Example 10.

EXAMPLE 12

In Example 12, it is described how to set a threshold voltage of a MOS transistor in the case where the switching elements of Examples 10 and 11 are operated as MOS transistors while restraining the bipolar effect to be as small as possible.

In consideration of future portable equipment, a technique for reducing the power consumption will gain importance. In a normal CMOS, the reduction of a power supply voltage is the most effective means to reduce the power consumption in terms of the device. In a CMOS, the amount of standby leak (the sum of an OFF current of the MOS transistor section and a base current of the bipolar section) is determined by an OFF current of the transistor.

According to a complementary semiconductor device of the present invention, however, the amount of a standby leak (the sum of an OFF current of the MOS transistor section and a base current of the bipolar section) is determined by the sum of an OFF current of the MOS transistor and a current of the bipolar transistor. In the case where the amplification function of the bipolar transistor is small, "the current of the bipolar transistor" is equivalent to a base current and therefore identical to a pn-junction forward current. Therefore, since either the transistor NPN or PNP is always maintained in an ON state even in a standby state, a bipolar current of either the transistor NPN or PNP (a pn-junction forward current in the case where the amplification function is small) continues to flow. Therefore, even if the OFF current of the MOS transistor is set to be lower than the bipolar current by several figures, it is not effective because the bipolar current becomes dominant to the standby leak current.

Thus, in the semiconductor device of Example 12 of the present invention, it is desirable to set an OFF current of the MOS transistor to the level smaller than that of the bipolar current by one figure or the same level as that of the bipolar current. The reasons for this are as follows.

In order to set an OFF current of the MOS transistor to the level smaller than that of the bipolar current by one figure or to the same level as that of the bipolar current, it is sufficient to lower an apparent threshold voltage of the MOS transistor. The rule of thumb is, an "apparent threshold voltage" is equal to a gate voltage when a drain current is about 1 $\mu A$ and a gate width is about 10 $\mu m$. Herein, the term "apparent" threshold value means an original threshold voltage varies depending on the gate voltage (the potential of a shallow well region).

Figure 19:
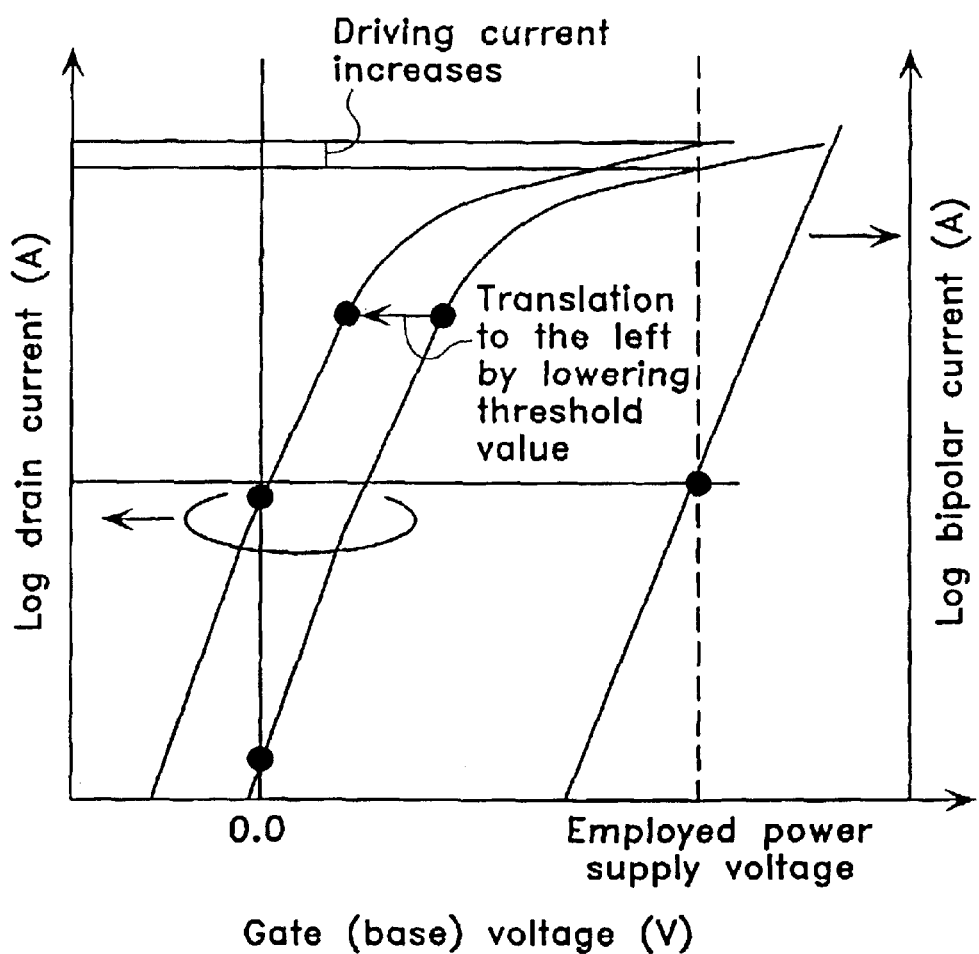
FIG. 19 is a graph showing the relationship between a bipolar current with respect to a power supply voltage of a semiconductor device of Example 12, and a drain current, a base voltage and a gate voltage of a MOS transistor.

In FIG. 19, three lines, that is, a straight line and two curves are shown. The straight line represents a bipolar current (a bipolar current of the transistor Tr3 in Examples 2, 10 and 11). The two curves show the gate voltage ($V_G$)—drain current ($I_D$) characteristics in a MOS transistor. The two curves for the MOS transistor correspond to two different threshold values.

Since the base region (shallow well region) and the gate electrode are short-circuited, the gate voltage and the base voltage are equal to each other. Moreover, since the parasitic bipolar effect is restrained as much as possible in Example 12, the amplification rate is about 1. Thus, the base current and the bipolar current are almost identical to each other.

The OFF current of the MOS transistor means a drain current at a gate voltage of 0 V. In order to adjust the OFF current to be equal to the bipolar current or smaller than the bipolar current by one figure at the power supply voltage employed, it is sufficient to lower the "apparent threshold voltage" of the MOS transistor as shown in FIG. 19.

As described in Example 1, in the case where the semiconductor device (transistor element) of Examples 10 and 11 are used as a low power consumption element, it is important to restrain a bipolar current (even if the bipolar transistor has no amplification function, at least a pn junction forward current flows). Therefore, in actuality, it is necessary to set a power supply voltage to be equal to or lower than a built-in potential of a pn junction. A forward current flowing through the pn junction exponentially increases with respect to a bias value when a bias is applied in a forward direction of the pn junction. Therefore, it is preferred to set a bias value to be small, and it is desirable to design a semiconductor device operating at a power supply voltage in the range of about 0.3 V to 0.6 V.

In summary, the base current exponentially decreases by dropping the power supply voltage. At a certain power supply voltage, an apparent threshold voltage of the MOS transistor is set so that an OFF current of the MOS transistor is approximately equal to the base current (or the level smaller than the base current by one figure). As a result, an ON current of the MOS transistor at the certain power supply voltage is determined thereby. If the ON current is excessively sufficient to charge a gate capacity (that is, to allow a circuit to operate at a frequency of a designed value) on the next stage within a predetermined time period, the power supply voltage is further dropped. If the ON current is insufficient to charge the gate capacity (that is, to allow a circuit to operate at a frequency of a designed value) on the next stage within a predetermined time period, the power supply voltage is boosted.

The semiconductor device fabricated by the inventors of the present invention according to the guideline of the design has a standby leak (the sum of the OFF current of the MOS transistor section and the base current of the bipolar section) of about $10^{-10}$ A orders per a gate width of about 1 $\mu m$. Moreover, in the semiconductor device, an ON current in the range of about 0.2 to 0.25 mA (NMOS) or in the range of about 0.1 to 0.13 mA (PMOS) is realized, and the apparent threshold voltage is about 0.18 V.

Transmission delay time for one stage of a ring oscillator constituted by a complementary invertor is about 30 psec.

In this example, various parameters are set as follows. The gate oxide film has a thickness of about 3 nm. The impurity concentration of the source region/drain region is about $1 \times 10^{20}/cm^3$ or higher. The junction depth of the source region/drain region is in the range of about 0.1 $\mu m$ (in the case of a NMOS) to about 0.15 $\mu m$ (in the case of a PMOS). The shallow well region has an impurity concentration of about $9 \times 10^{16}/cm^3$ and a junction depth in the range of about 0.8 to 1.0 $\mu m$. The groove-type element separation structure has a depth in the range of about 1.5 to 2.0 $\mu m$. The deep well region has an impurity concentration of about $4 \times 10^{16}/cm^3$. The gate length is about 0.15 $\mu m$. The potential of the deep n-well region is set at $V_{DD}$, while the potential of the deep p-well region is set at GND.

EXAMPLE 13

In Examples 8 and 9, a method for forming an Ohmic contact between a gate electrode and a shallow well region has been described. In the case where the fabrication method of Examples 8 and 9 is applied to the complementary device of Examples 10 and 11, as briefly described in Example 8, the source/drain implantation mask also serves as the implantation mask for the formation of a contact.

Figure 20A:
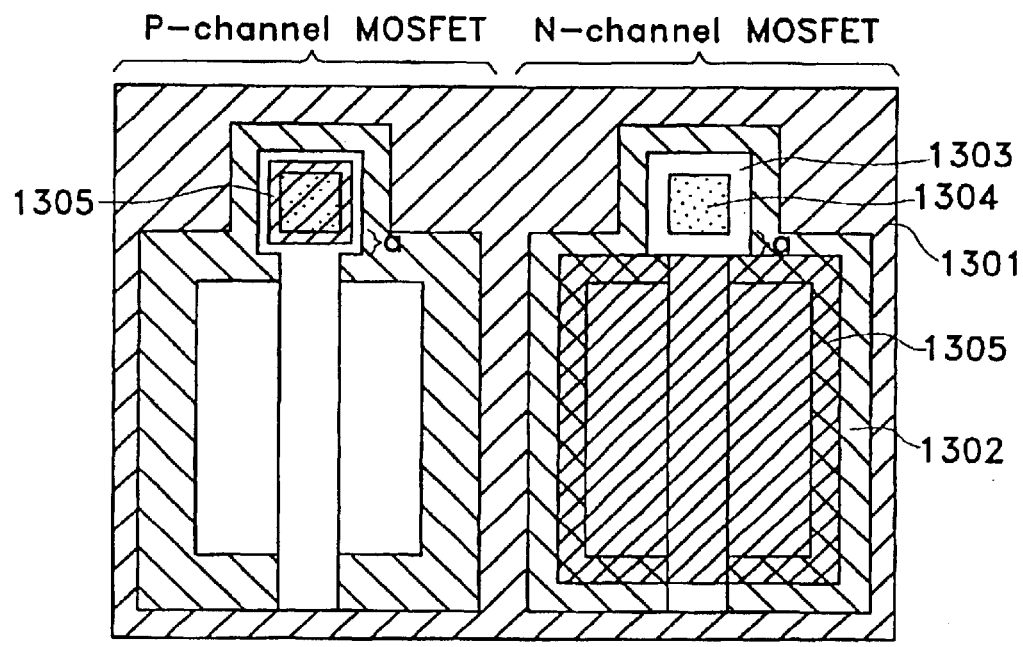
FIGS. 20A and 20B show layout plan views of masks of Example 13 both serving as a mask for forming a contact and as a mask for source/drain implantation.
Figure 20B:
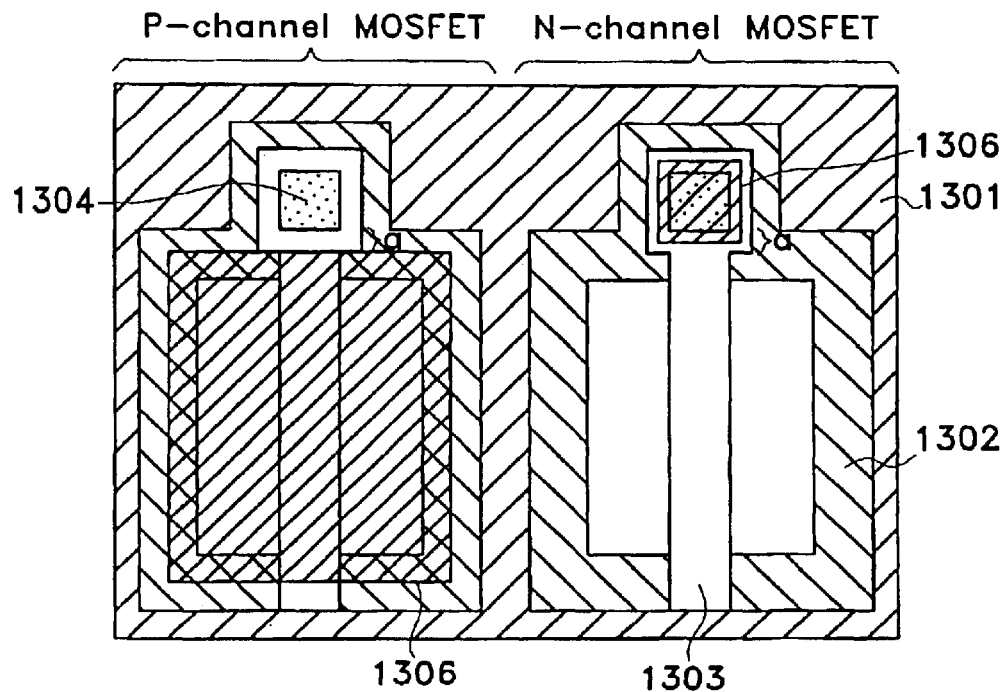

FIGS. 20A and 20B are plan views showing an implantation mask (made of a photoresist) serves both as a mask for forming a contact and a mask for source/drain implantation of Example 13.

Openings of the implantation mask correspond to hatched regions (i.e., a donor impurity implanted region 1305 and an acceptor impurity implanted region 1306). In FIGS. 20A and 20B, the reference numeral 1301 denotes a field oxide film region; the reference numeral 1302 denotes a groove type element separation structure; the reference numeral 1303 denotes a polycrystalline silicon film serving as a gate electrode; and the reference numeral 1304 denotes a contact hole for connecting a shallow well region and the gate electrode with each other.

With the implantation mask shown in FIG. 20A, since it is possible to carry out the implantation for forming the contact for the P-channel MOS transistor, the source/drain implantation for the N-channel MOS transistor, and the implantation to the gate electrode by using a single mask, the fabrication steps can be simplified. Similarly, with the implantation mask shown in FIG. 20B, since it is possible to carry out the implantation for forming the contact for the N-channel MOS transistor, the source/drain implantation for the P-channel MOS transistor, and the implantation to the gate electrode by using a single mask, the fabrication steps can be simplified.

For the reasons as described above, in the case where a complementary MOS transistor is formed by the fabrication methods of Examples 8 and 9, it is preferred to use an implantation mask having a layout pattern as shown in FIGS. 20A and 20B.

The method of Example 13 is different from those of Examples 8 and 9 in that the polycrystalline silicon film serving as the gate electrode is doped with an impurity simultaneously when the impurity doping for forming the source region and the drain region occurs. In Examples 8 and 9 described above, the impurity doping for forming the source region and the drain region is performed after the doping of the gate electrode with an impurity is completed.

Since the upper surface of the source region/drain region and the upper surface of the gate electrode are salicided in a self-aligned manner, transistor parasitic resistance is extremely reduced. Moreover, according to the fabrication method of Example 13, a pn junction is formed in the vicinity of a region a of the gate electrode in FIGS. 20A and 20B. However, since the gate electrode has a polycide structure, no problem arises thereby.

Furthermore, two steps, that is, the source/drain implantation on the N-channel MOS transistor side (implantation for forming the contact on the P-channel MOS transistor side) and the source/drain implantation on the P-channel MOS transistor side (implantation for forming the contact on the N-channel MOS transistor side), can be carried out in a desired order.

However, in the case where a thermal treatment for activation after the source/drain implantation on the N-channel MOS transistor side and a thermal treatment for activation after the source/drain implantation on the P-channel MOS transistor side are not simultaneously performed, it is better to first carry out the implantation of ions which are less sensitive to the thermal treatment.

For example, in the case where arsenic ions are used as implanted ions to the source/drain in the N-channel MOS transistor and boron ions are used as implanted ions to the source/drain in the P-channel MOS transistor and activating annealing of boron is intended to be restrained (since boron is light, it has a high diffusion speed in silicon) in view of the prevention of short-channel effect of the transistor, it is better to first carry out the step of implanting arsenic ions. Then, after performing the annealing (for example, at about 850° C. for about 30 minutes), the step of implanting boron ions may be carried out. Thereafter, additional annealing (for example, at about 1000° C. for about 20 seconds) is performed.

EXAMPLE 14

Figure 21A:
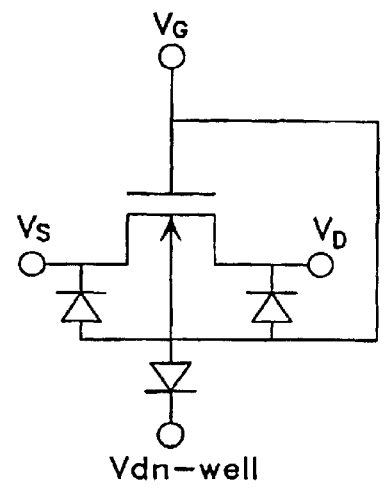
FIGS. 21A and 21B are circuit diagrams for illustrating an equivalent circuit based on Example 1 as used in Example 14.
Figure 21B:
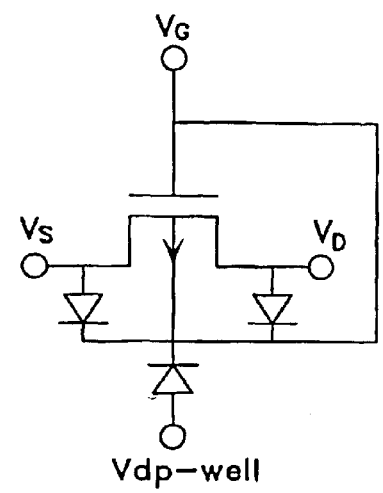

The case where a gate electrode and a shallow well region are electrically connected with each other in a direct manner is described in Example 1. In the semiconductor device of Example 1, if the parasitic bipolar effect is negligibly small, the semiconductor device has an equivalent circuit as shown in FIGS. 21A and 21B. FIG. 21A shows an N-channel MOS transistor, and FIG. 21B shows a P-channel MOS transistor.

As shown in FIGS. 21A and 21B, pn junctions are formed between a shallow well region and source/drain regions and between a deep well region and the shallow well region. When these pn junctions are forward biased, a forward current flows through the pn junctions as described in Example 1. In order to avoid this, it is desirable to set a power supply voltage so that the potential of the well region is lower than the built-in potential by about 0.1 to 0.3 V (see Example 12). Therefore, in the case where the gate electrode and the shallow well region are electrically connected to each other than in a direct manner, the available power supply voltage is limited to about 0.6 V or lower.

Figure 21C:
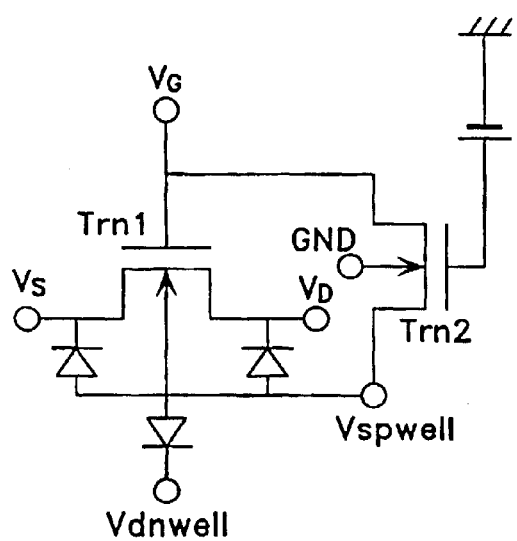
FIGS. 21C and 21D are circuit diagrams showing a semiconductor device of Example 14.
Figure 21D:
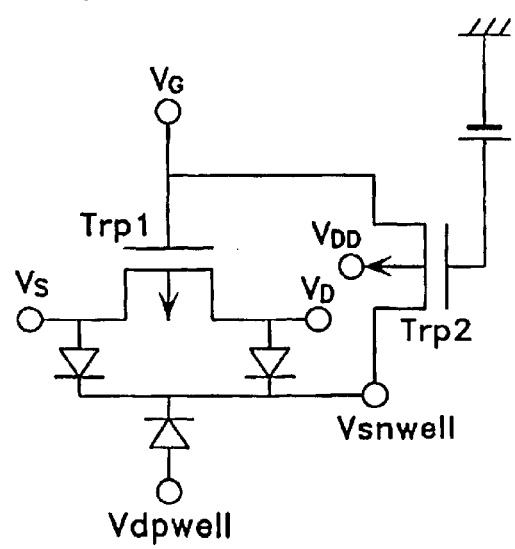

In Example 14, a method of using a power supply voltage without limitation thereof will be described. FIGS. 21C and 21D respectively show the case where an N-channel transistor Trn2 is placed between a gate electrode and a shallow well region and a P-channel transistor Trp2 is placed between a gate electrode and a shallow well region.

If the gate potential of the transistor Trn2 is set at $Vspwell_{MAX}+V_{thn2}$ with regard to a ground potential GND, a voltage $Vspwell_{MAX}$ is applied to the deep well region at maximum, regardless of the gate voltage ($V_G$).

Similarly, if the gate potential of the transistor Trp2 is set at $Vsnwell_{MIN}+V_{thp2}$ with regard to the ground potential GND, a voltage $Vsnwell_{MIN}+V_{thp2}$ is applied onto the deep well region at maximum, regardless of the gate voltage ($V_G$).

Figure 22A:
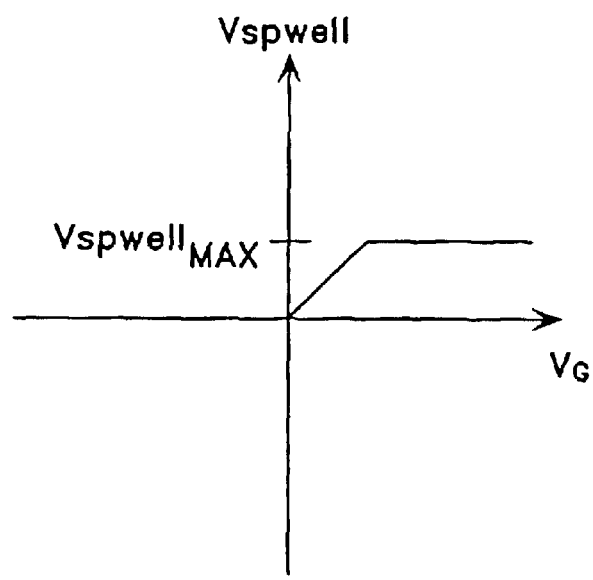
FIGS. 22A and 22B are graphs showing the relationship between a potential ($V_{spwell}$) of a shallow p-well region and a potential ($V_{snwell}$) of a shallow n-well region with respect to a gate voltage of transistors Trn1 and Trp1 constituting a semiconductor device of Example 14.
Figure 22B:
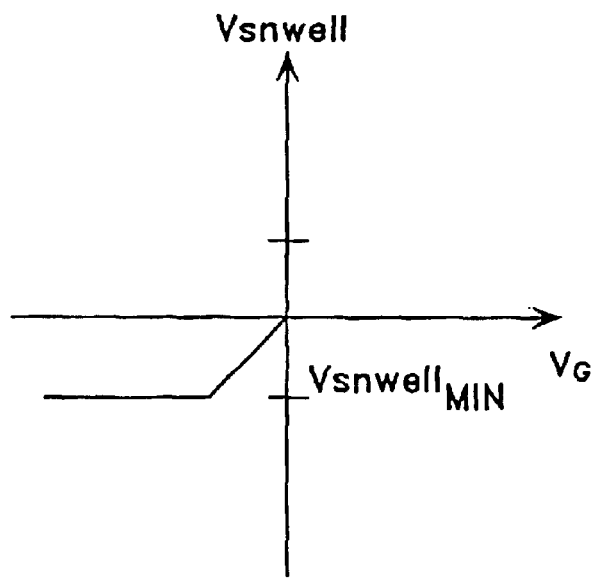

The relationship between the potential of the gate electrode of the transistor Trn1 and the potential (Vspwell) of the shallow p well region is shown in FIG. 22A, while the relationship between the potential of the gate electrode of the transistor Trp1 and the potential (Vsnwell) of the shallow n well region is shown in FIG. 22B.

In FIGS. 22A and 22B, $Vspwell_{MAX}$ represents the maximum potential applied to the shallow p-well region, $Vsnwell_{MIN}$ represents the minimum potential applied to the shallow n-well region, $V_{thn2}$ represents a threshold voltage of the N-channel transistor Trn2, and $V_{thp2}$ represents a threshold voltage of the P-channel transistor Trp2.

Specifically, when the potential of the source region of the N-channel transistor Trn2 is set at GND and the potential of the source region of transistor Trp2 is set at 3 V (that is, the power supply voltage), it is assumed that the maximum potential $Vspwell_{MAX}$ is set at 0.6 V and the minimum potential Vsnwell$_{MIN}$ is set at 2.4 V so as to restrain the leak current in a forward direction. In such a case, for example, if the threshold voltage of the transistor Trn2 is 0.4 V and the threshold voltage of the transistor Trp2 is −0.4 V, it is sufficient to set the gate voltage of the transistor Trn2 at 1 V and the gate voltage of the transistor Trp2 at 2 V.

By the above method, it is possible to set the maximum value (the minimum value) of the potential of the shallow well region at an arbitrary value, regardless of the power supply voltage. As a result, the power supply voltage can be prevented from being limited.

EXAMPLE 15

In Example 14, a method allowing the power supply voltage to be used without limitation is described regarding an equivalent circuit with a negligibly small parasitic bipolar effect. Next, Example 15 is described with reference to FIGS. 23 and 24 taking a parasitic bipolar transistor into consideration.

Figure 23:
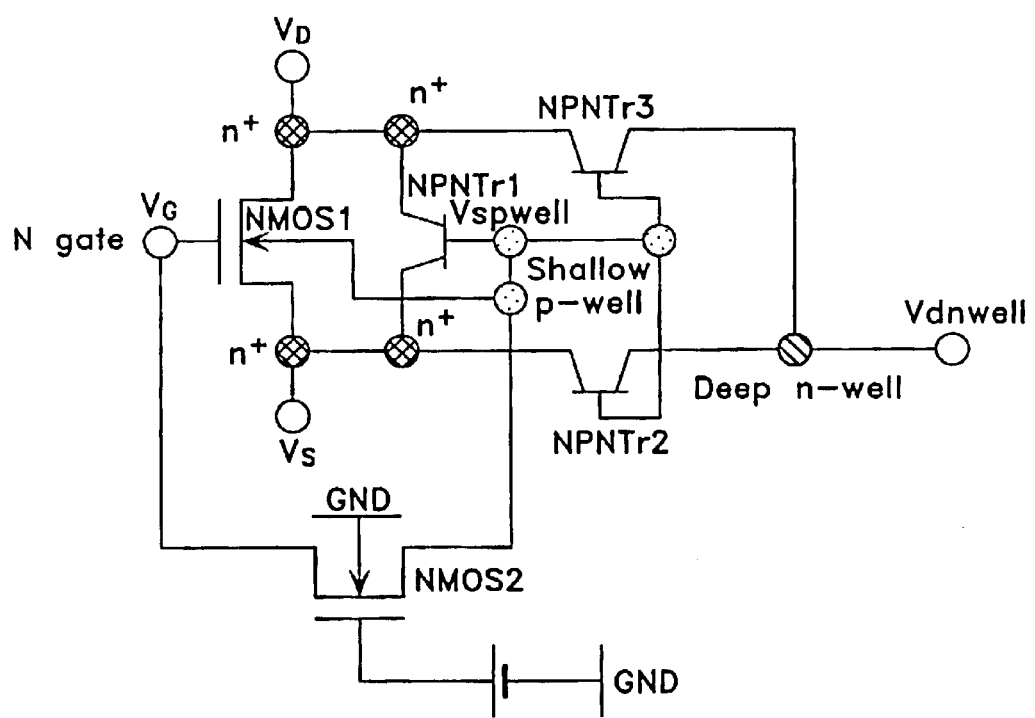
FIG. 23 is a circuit diagram showing a semiconductor device of Example 15.
Figure 24:
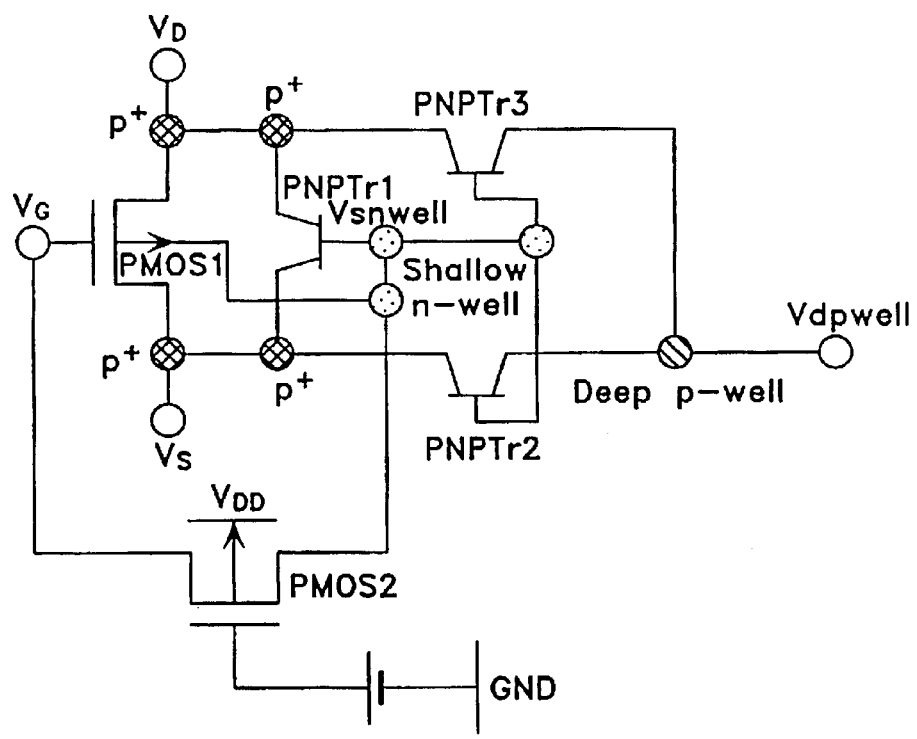
FIG. 24 is another circuit diagram showing a semiconductor device of Example 15.

FIG. 23 shows the case where a semiconductor device is constructed by using N-channel transistors and npn type bipolar transistors. FIG. 24 shows the case where a semiconductor device is constructed by using P-channel transistors and pnp type bipolar transistors.

Since the function of the N-channel MOS transistor NMOS2 and the P-channel MOS transistor PMOS2 shown in FIGS. 23 and 24 are the same as that of the N-channel transistor Trn1 and the P-channel transistor Trp1 in Example 14, respectively, the basic operation thereof is herein omitted.

Even in the case where the effect of a parasitic bipolar transistor is large enough to be taken into consideration, a base current can be arbitrary designed based on the gate voltage of the N-channel MOS transistor NMOS2 and the P-channel MOS transistor PMOS2. Therefore, the degree of freedom of design is advantageously increased as compared with Example 2.

EXAMPLE 16

The structure of the semiconductor device which allows the maximum value (or the minimum value) of the potential of the shallow well region to be arbitrary set is described in Examples 14 and 15 above. In the structures of Examples 14 and 15, however, there still remains a problem wherein a pn junction forward current continues to flow on the N-channel MOS transistor side when the transistor enters a standby state while an input state (gate potential) is set at High, or on the P-channel MOS transistor side when the transistor enters a standby state while an input state (gate potential) is set at Low.

In Example 16, a semiconductor device having a structure for solving such a problem is described. Specifically, in a semiconductor device having such a structure, a pn junction forward current flows only during the time period which allows the output value to be changed from Low to High or from High to Low when the input value is changed from High to Low or from Low to High, but not in the standby state (that is, a pn junction is not forward biased).

Figure 25:
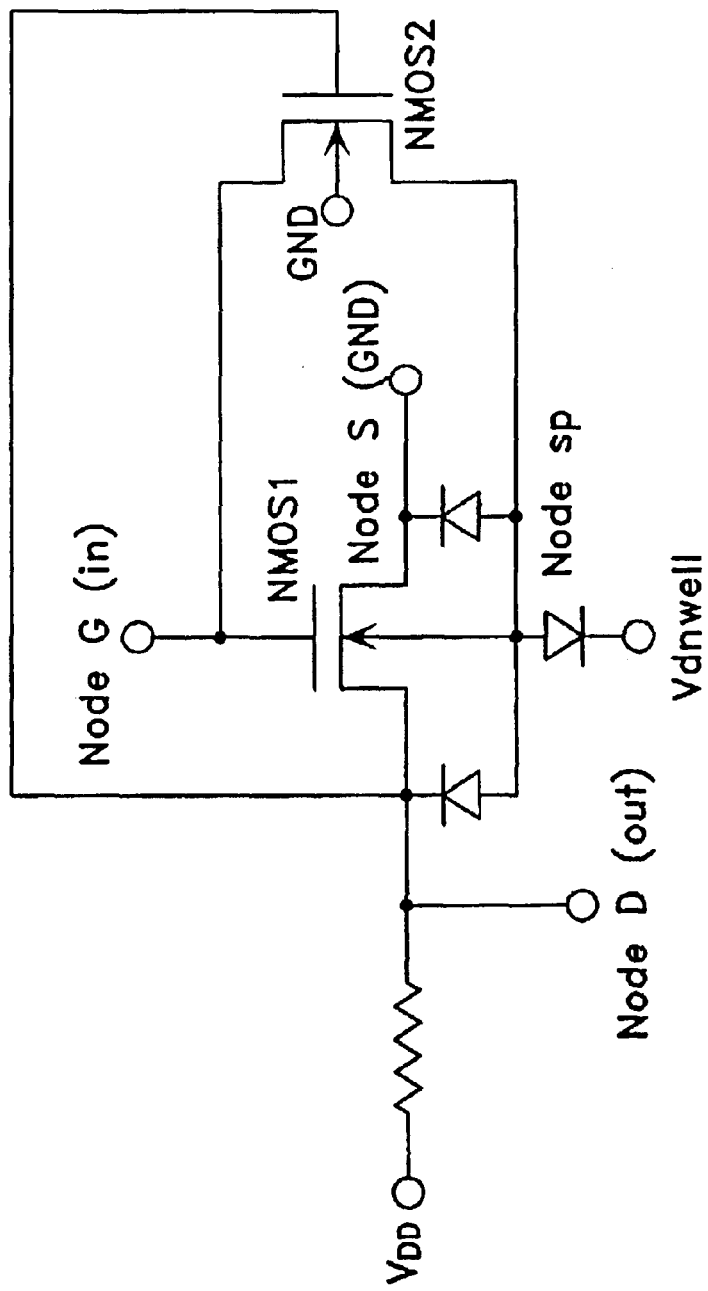
FIG. 25 is a circuit diagram showing a semiconductor device of Example 16.

As shown in FIG. 25, the gate electrode of the N-channel MOS transistor in Example 1 (herein, denoted as NMOS1) is connected to the shallow well region of the MOS transistor NMOS1 via the source/drain regions of the second N-channel MOS transistor (herein, denoted as NMOS2) of the same type as the MOS transistor NMOS1, and the gate electrode of the second MOS transistor NMOS2 is connected to the drain of the MOS transistor NMOS1. As a result, a pn junction forward current flows only when the output changes in response to a change in the input, and not in a standby state.

Figure 26:
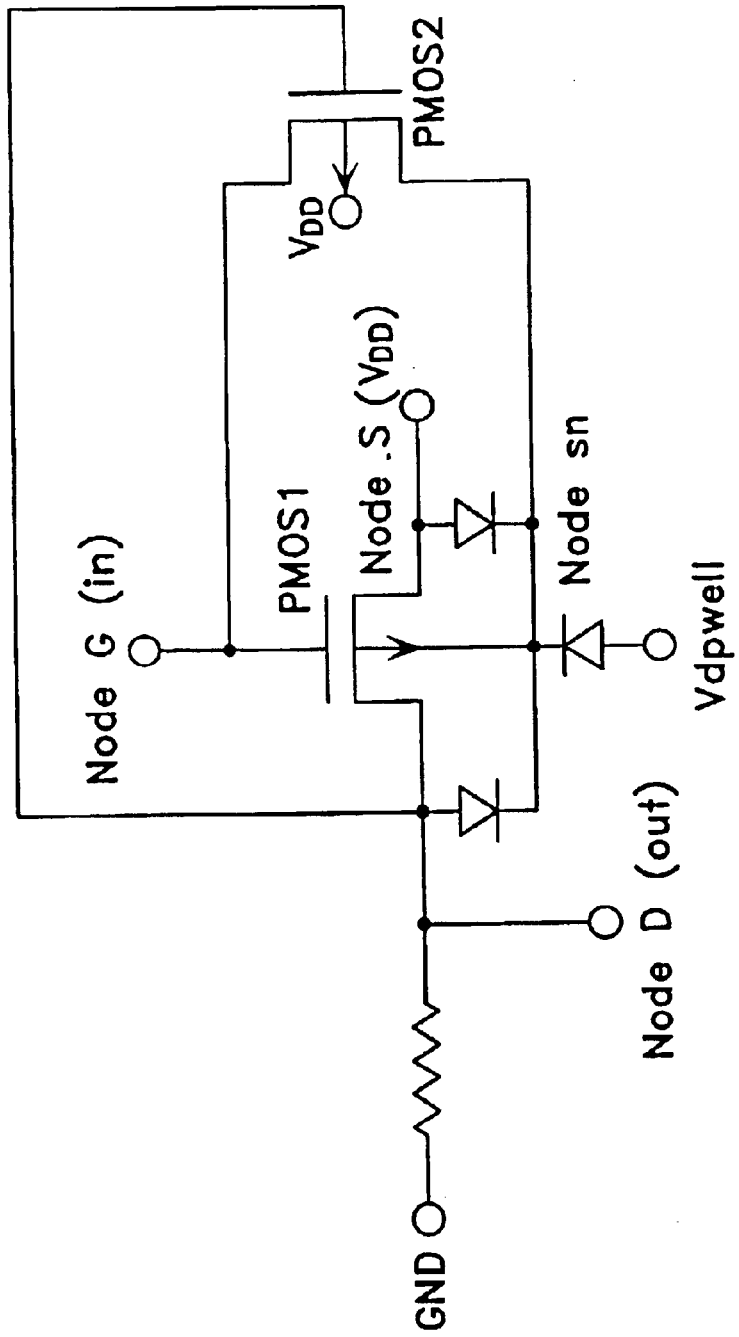
FIG. 26 is another circuit diagram showing the semiconductor device of Example 16.

As shown in FIG. 26, the same can be applied to a P-channel transistor. The gate electrode of the MOS transistor in Example 1 (herein, designated as PMOS1) is connected to the shallow well region of the MOS transistor PMOS1 via the source/drain regions of the second MOS transistor (herein, designated as PMOS2) of the same type as the MOS transistor PMOS1, and the gate electrode of the second MOS transistor PMOS2 is connected to the drain of the MOS transistor PMOS1. As a result, a pn junction forward current flows only when the output changes in response to a change in the input, and not in a standby state.

The principle of this operation is described taking the N-channel transistor as an example. It is assumed that a node G (serving as a gate potential of the N-channel MOS transistor NMOS1 and thus as an input potential) is fixedly set at a Low level in a standby state at first. At this time, since a node D (serving as a drain potential of the N-channel MOS transistor NMOS1 and thus as an output potential) is at a High level, the second N-channel MOS transistor NMOS2 is in an ON state. The potential of a node sp (the potential of the shallow well region) becomes the same as that of the node G and is fixed at the Low level. As a result, the node sp (Low) and the node S (Low) have the same potential, the node sp (Low) and the node D (High) are reverse biased relative to each other, and the node sp (Low) and a node $V_{dnwell}$ (Low or High) have the same potential or are reverse biased. Therefore, a pn junction forward current does not flow therethrough.

The case where the potential level of the node G changes from Low to High so as to enter the standby state again is considered. Since the node D is set at High level at the time when the potential level of the node G changes from Low to High, the second N-channel MOS transistor NMOS2 remains in an ON state. Therefore, the potential of the node sp changes from Low to High as the node G changes from Low to High. Since the nodes G and sp change from Low to High in a similar manner, the N-channel MOS transistor NMOS1 operates in a similar manner as that in Example 1. Accordingly, a threshold value dynamically changes in accordance with the potential of the node G.

Since the N-channel transistor NMOS1 enters an ON state, electrons are supplied from the node S to the node D so that the potential of the node D gradually approaches the Low level. The second N-channel transistor NMOS2 enters an OFF state at the time when the potential of the node D is lowered below a threshold voltage of the second N-channel MOS transistor NMOS2. On the other hand, the node sp enters a floating state. As a result, a supply source of charges to the node sp is blocked (in a strict sense, the amount of charges corresponding to an OFF current of the second N-channel transistor NMOS2 is supplied). Therefore, a pn junction forward current does not continue to flow in a standby state (in a strict sense, a current corresponding to an OFF current of the second N-channel transistor NMOS2 flows).

At the beginning when the node sp enters a floating state, the potential of the node sp is still higher than that of the node S (grounded). Therefore, there still remains substrate bias effect on the N-channel transistor NMOS1. Since the node sp in a floating state is forward biased with respect to the node S (grounded), the node D (Low) and the deep well region (in the case where the node $V_{dnwell}$ is grounded), the charges at the node sp are gradually released therefrom over time so that the potential of the node sp approaches the Low (GND) level.

Specifically, a pn junction forward current does not flow even if the input (node G) is in a standby state at either High or Low.

When the potential of the node G changes from Low to High, the maximum potential of the node sp becomes VD-Vthn2 in the case where a threshold voltage of the second N-channel MOS transistor 2 is set at Vthn2 and the potential of the node D is set at VD. Specifically, the maximum potential of the node sp is determined depending on the setting of Vthn2.

Since the principle of the operation of the P-channel MOS transistor is the same as that of the N-channel MOS transistor, a description thereof is herein omitted.

EXAMPLE 17

Figure 27:
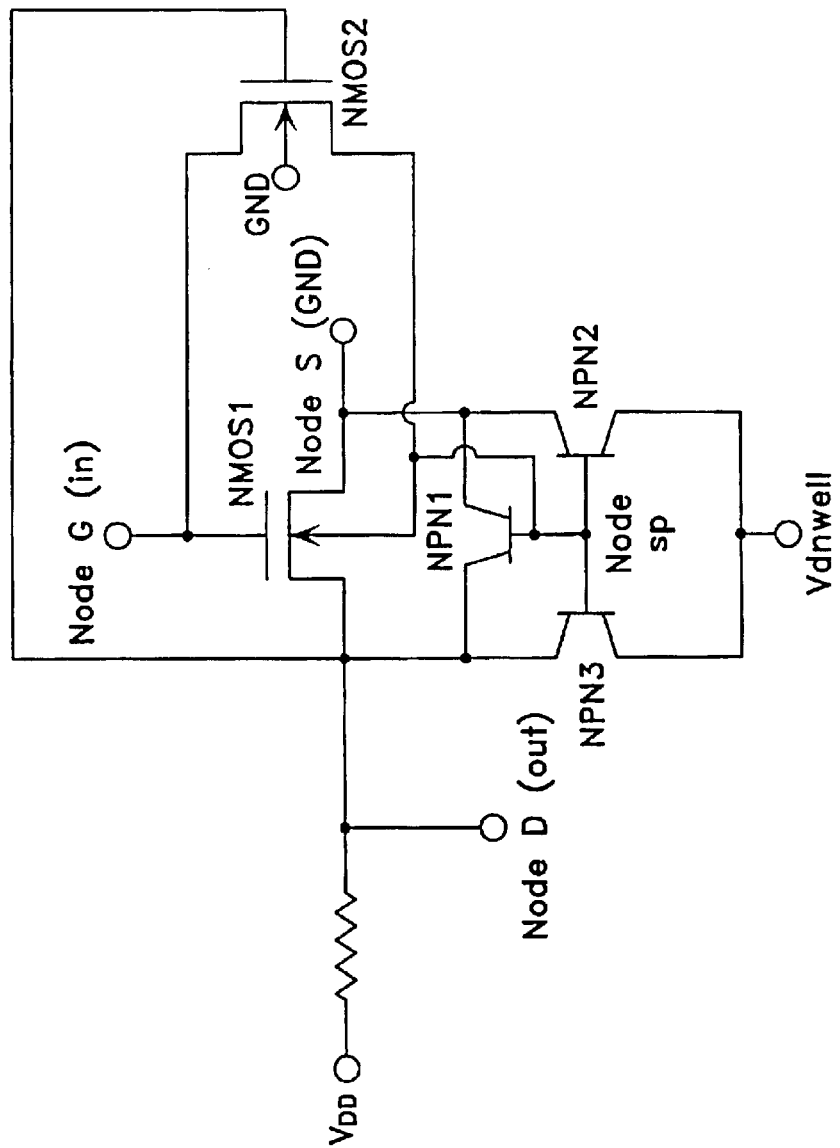
FIG. 27 is a circuit diagram showing a semiconductor device of Example 17.
Figure 28:
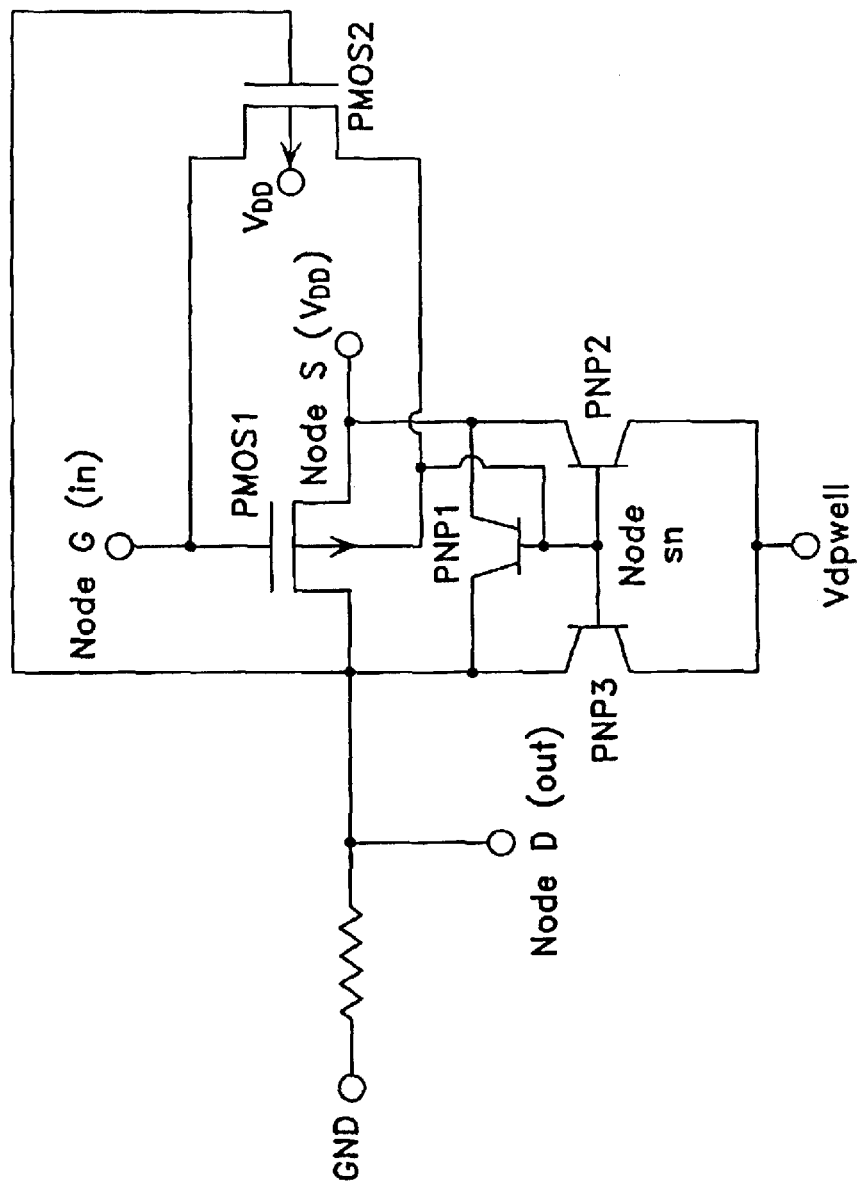
FIG. 28 is another circuit diagram showing the semiconductor device of Example 17.
Figure 29:
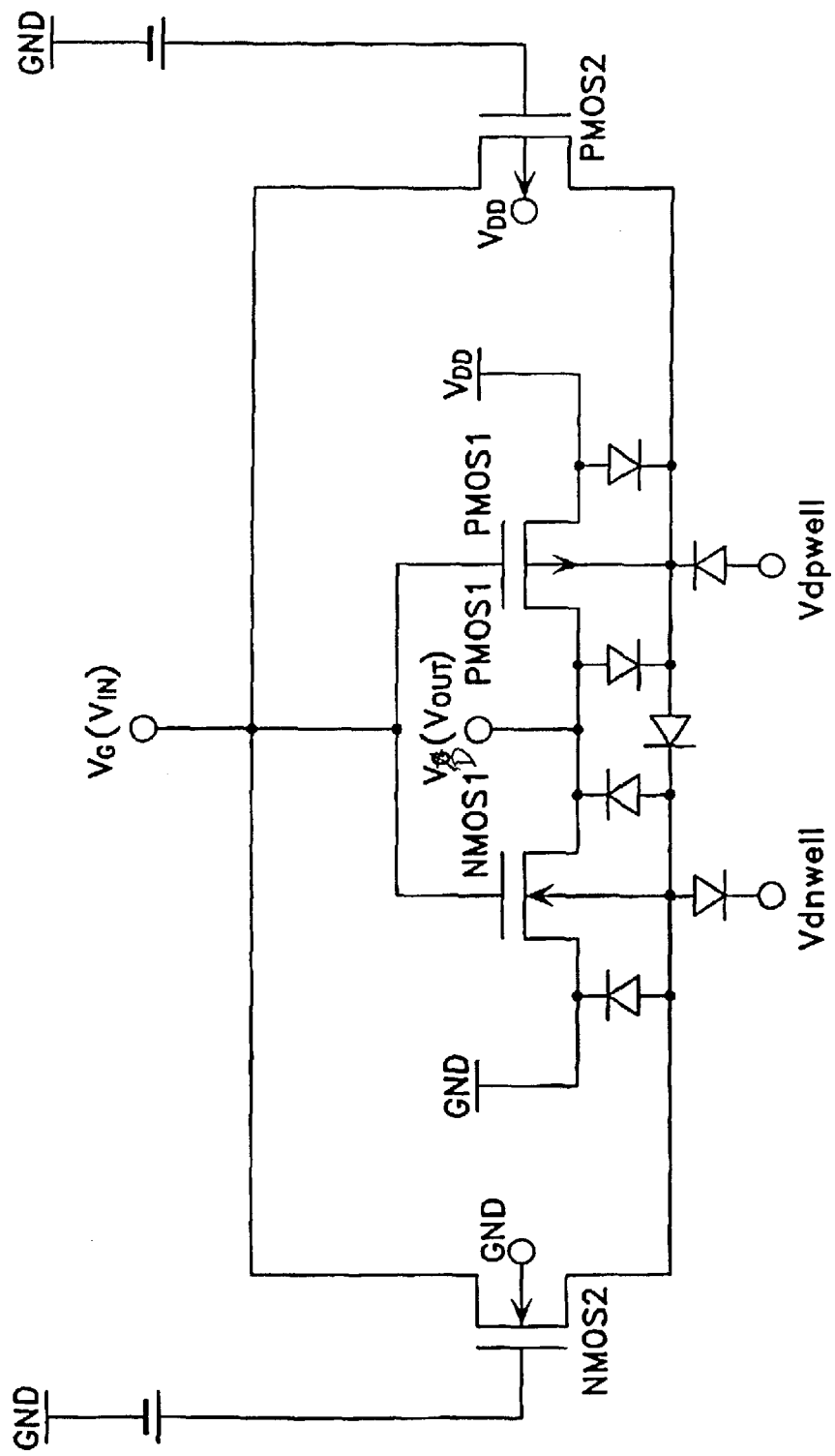
FIG. 29 is a circuit diagram showing a semiconductor device of Example 19.
Figure 30:
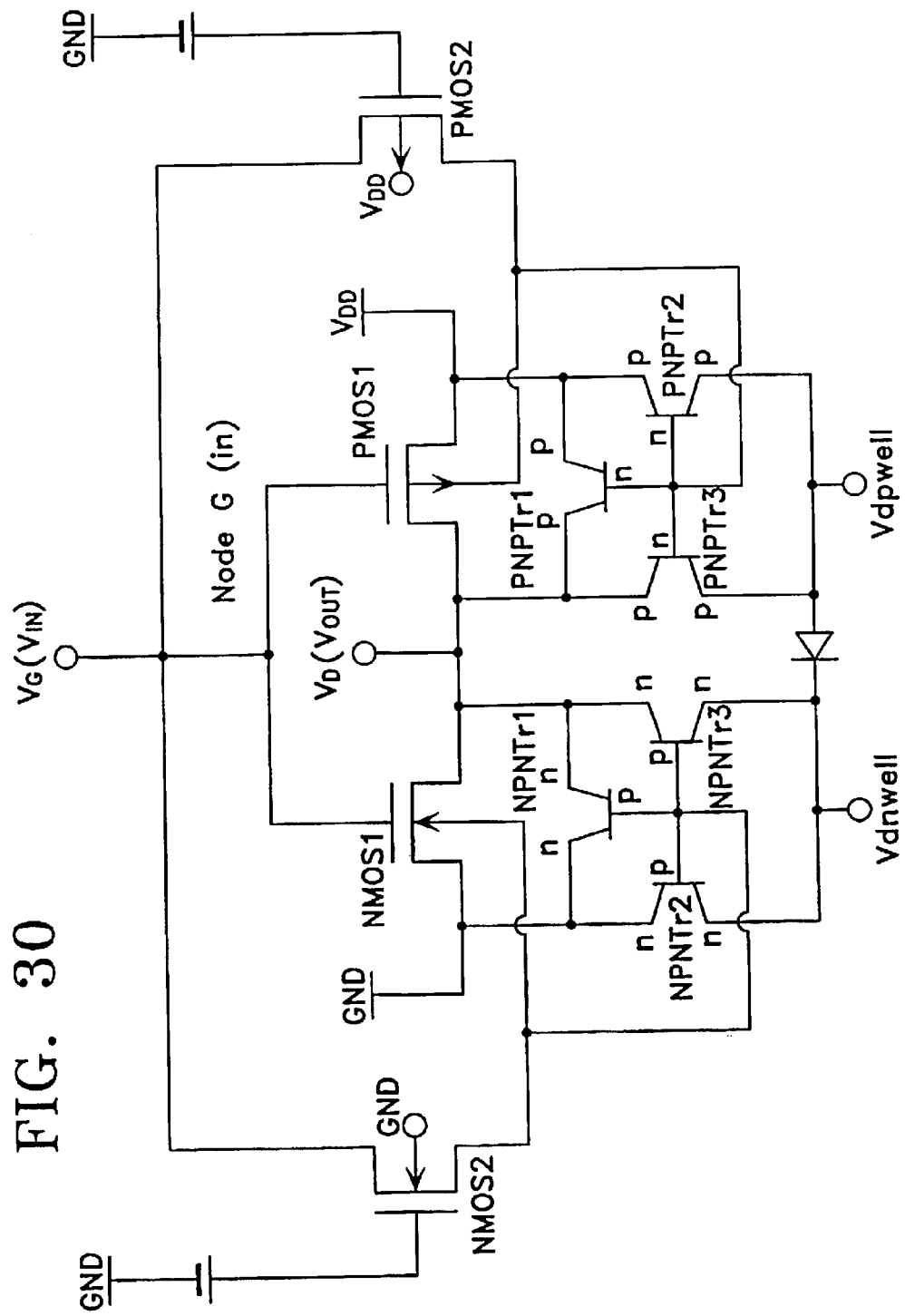
FIG. 30 is another circuit diagram showing the semiconductor device of Example 19.
Figure 31:
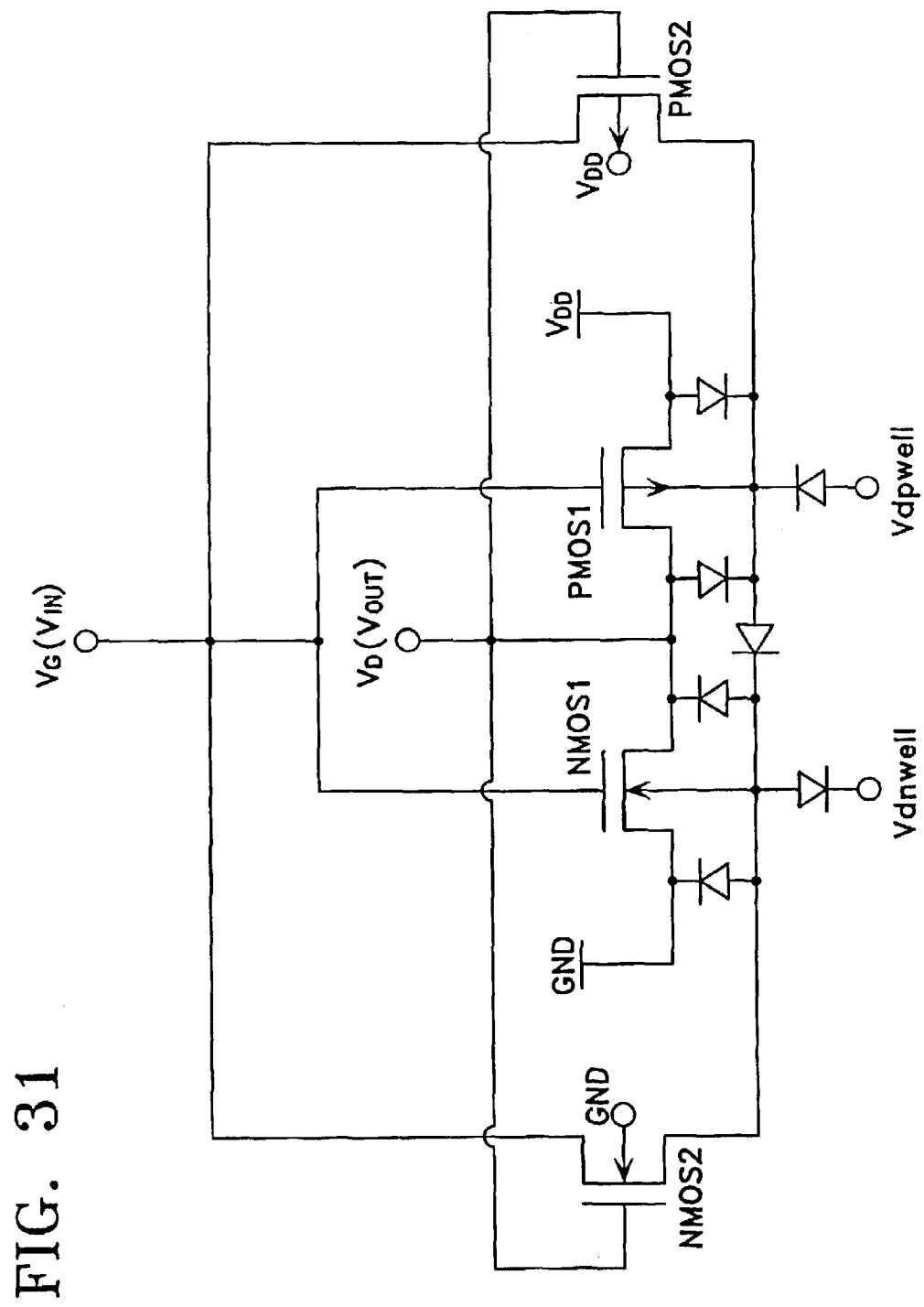
FIG. 31 is still another circuit diagram showing the semiconductor device of Example 19.
Figure 32:
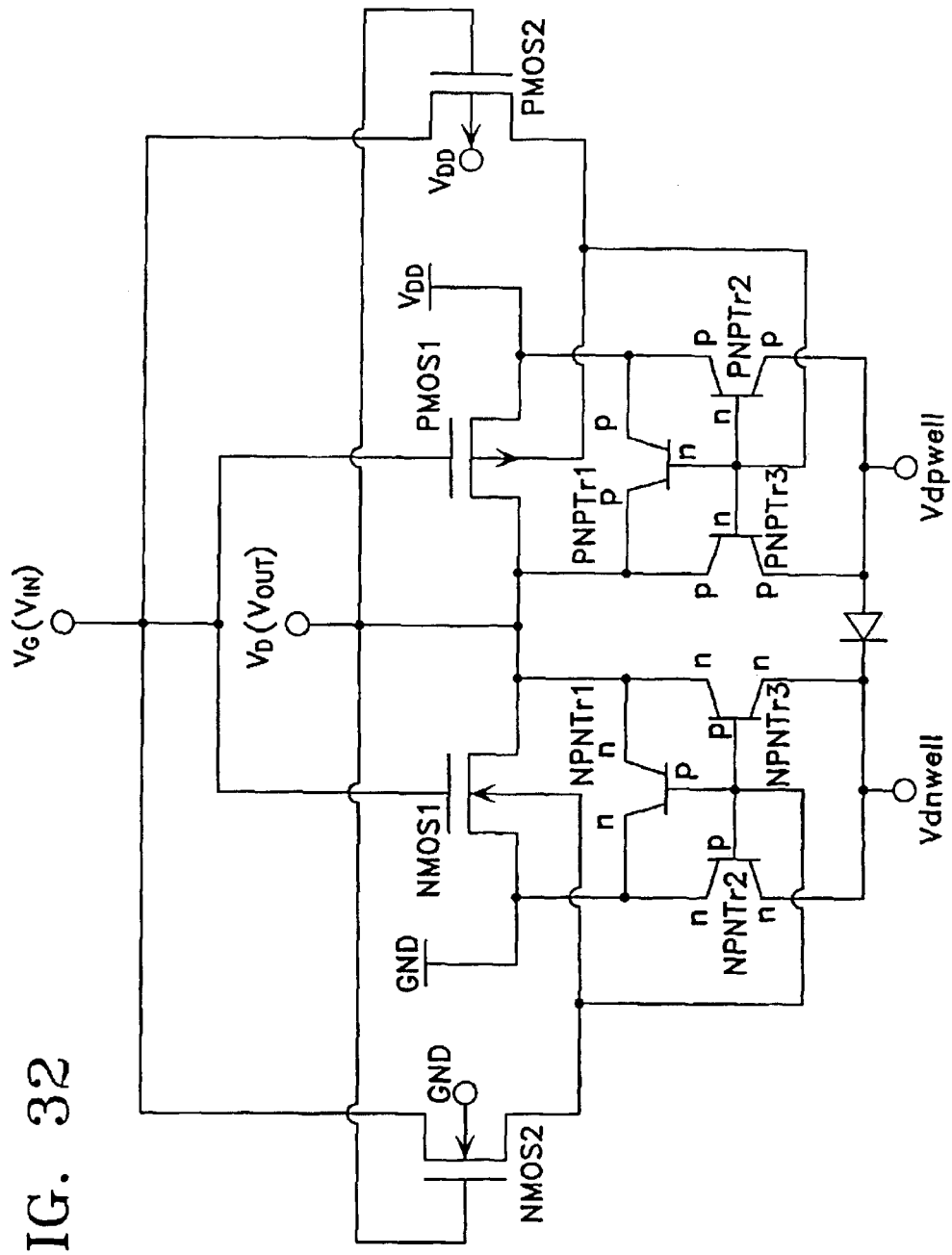
FIG. 32 is still another circuit diagram showing the semiconductor device of Example 19.

In Example 16, a method allowing a power supply voltage to be used without limitation is described regarding an equivalent circuit in which the parasitic bipolar effect is negligibly small. In actuality, however, there is a great possibility that the bipolar current becomes dominant depending on the base width (equal to the value obtained by subtracting the depth of the source/drain regions from the depth of the shallow well region) in the case where the power supply voltage equal to or higher than the built-in potential is used. In Example 17, a situation where the parasitic bipolar effect is taken into consideration is described. FIGS. 27 and 28 show an equivalent circuit taking the parasitic bipolar effect into consideration.

An equivalent circuit shown in FIG. 27 includes N-channel transistors and npn bipolar transistors. An equivalent circuit shown in FIG. 28 includes P-channel transistors and pnp bipolar transistors. Since the MOS transistors NMOS2 and PMOS2 function in the same way as that of the MOS transistors NMOS2 and PMOS2 of Example 16, the basic operation thereof is herein omitted.

In the case where the effect of the parasitic bipolar transistor is not negligible in this way, a semiconductor device including bipolar transistors and MOS transistors, which is capable of blocking a base current in a standby state (in actuality, the amount of a base current corresponding to an OFF current of the MOS transistors NMOS2 and PMOS2 flows), can be formed.

The semiconductor device of Example 17 is used under the following conditions. A power supply voltage is set to be substantially equal to or lower than a built-in potential (in actuality, the maximum value of the difference between a base potential (the potential of the shallow well region) and the potential of the source/drain regions is set to be equal to or lower than a built-in potential). The base potential and the power supply voltage satisfy the relationship: VB=VD-Vth2, where VB is a base potential at a node sp or a node sn, VD is an output potential at the node D, and $V_{th2}$ is a threshold voltage of the MOS transistor NMOS2 or PMOS2. As a result, a current of the MOS transistor becomes dominant in the operation of the device.

If the semiconductor device of this invention is used at a power supply voltage substantially equal to or higher than the built-in potential (in actuality, with such a power supply voltage that the maximum value of the difference in potential between the base potential, that is, the potential of the shallow well region, and the source/drain regions becomes equal to or higher than the built-in potential), a bipolar current becomes dominant.

In order to use the semiconductor device under the condition where a bipolar current is dominant, the potential of the deep well region $V_{dnwell}$ (FIG. 27) should be set at GND or the potential of the deep well region $V_{dpwell}$ (FIG. 28) should be set at $V_{dd}$ (power supply voltage) (that is, the deep well regions are used as emitters of an npn bipolar transistor NPN3 and a pnp bipolar transistor PNP3).

Specifically, the semiconductor device of Example 17 functions as a MOS transistor having a high drivability at a low voltage on the low power supply voltage side, and as an bipolar transistor through which a base current does not flow in a standby state on the high power supply voltage side.

EXAMPLE 18

In Examples 14 to 17 described above, the semiconductor device of Examples 1 and 2 having a structure capable of eliminating the limit of the power supply voltage and restraining a pn junction forward direction current in a standby state has been described. It is understood from the equivalent circuit diagrams that such a structure can be realized by the addition of transistors.

The structure of the N-channel MOS transistor NMOS1 shown in FIG. 21C, the P-channel MOS transistor PMOS1 shown in FIG. 21D, the N-channel MOS transistor NMOS1 shown in FIG. 23, the P-channel MOS transistor PMOS1 shown in FIG. 24, the N-channel MOS transistor NMOS1 shown in FIG. 25, the P-channel MOS transistor PMOS1 shown in FIG. 26, the N-channel MOS transistor NMOS1 shown in FIG. 27, and the P-channel MOS transistor PMOS1 shown in FIG. 28 have the same structures as those of the switching element described in Examples 1 and 2. It is preferred that adjacent shallow well regions are separated from each other by a groove type separation structure as in Example 3. By forming the groove type element separation structure, it is possible to reduce a distance between the transistors and thus to highly integrate the semiconductor device.

EXAMPLE 19

In Examples 14 to 17 described above, the semiconductor device of Examples 1 and 2 having a structure capable of eliminating the limit of the power supply voltage and restraining a pn junction forward direction in a standby state have been described. It is understood from the equivalent circuit diagrams that such a structure can be realized by the addition of transistors. In the above description, however, the semiconductor device is not a complementary type. Therefore, when the MOS type transistors are in an ON state, a feed-through current continues to flow therethrough. In particular, in Examples 16 and 17, even if a pn junction forward current (bipolar current) is eliminated in a standby state, a feed-through current continues to flow on the side of the N-channel MOS transistor which enters a standby state while the input is set at High or on the side of the P-channel MOS transistor which enters a standby state while the input is set at Low. Therefore, the semiconductor device having such a structure is not suitable for reducing the power consumption. In Example 19, the semiconductor devices described in Examples 14 to 17 are fabricated so as to have a complementary structure.

FIGS. 29 to 32 are circuit diagrams in the case where the semiconductor devices of Examples 14 to 17 are fabricated so as to have a complementary structure. Since the operation of each of the transistors is described in Examples 14 to 17, a description thereof is herein omitted.

In the case where the semiconductor devices of Examples 14 and 15 are fabricated so as to have a complementary structure, it is possible to eliminate the limitation of the power supply voltage as compared with the complementary semiconductor device of Example 10. However, the same problem as that of Example 10 arises, i.e., a pn junction forward current continues to flow. In a standby state, an input value is set at High (power supply voltage) or Low (GND). Either the parasitic bipolar transistors (PNPTr1, PNPTr2 and PNPTr3 in FIG. 30) on the P-channel MOS transistor or the parasitic bipolar transistors (NPNTr1, NPNTr2 and NPNTr3 in FIG. 30) on the N-channel MOS transistor are certainly turned ON. Therefore, a parasitic bipolar current continues to flow. Even in the case where a parasitic bipolar current is negligibly small, a pn junction forward current (a pn junction forward current flowing between the shallow well region and the source/drain regions, and, depending on a bias, flowing between the shallow well region and a deep well region) continues to flow.

Therefore, as guidelines of design, the impurity concentration of the shallow well region, the depth of the shallow well region, and the impurity concentration of the deep well region are determined so as to reduce the ability of the parasitic bipolar transistors to as small as possible in order to make a collector current almost identical to that of the base current (that is, to render the effect of the parasitic bipolar transistors almost negligible). Then, a threshold voltage of the MOS transistor is set so that an OFF current of the transistor is identical to a pn junction forward current as described in Example 12 under conditions satisfying: collector current=base current=pn junction forward current.

In the case where the semiconductor devices of Examples 16 and 17 are constituted so as to have a complementary structure, parasitic bipolar transistors are turned OFF in a standby state (a base current is floating in a standby state) as described in Examples 16 and 17. However, in order to prevent a forward current from flowing through a diode junction between a deep p-well region and a deep n-well region, it is necessary to set the potential of the deep p-well region and that of the deep n-well region to be identical to each other (for example, at ½ $V_{DD}$, that is, a half of a power supply voltage), or to set the deep n-well region at a power supply voltage $V_{DD}$ and the deep p-well region to a ground voltage GND. In this case, since parasitic bipolar transistors PNPTr3 and NPNTr3 operate so as to prevent the operation of the transistors as described in Example 2 above, the ability of the parasitic bipolar transistors is lowered to as low as possible (as in Example 1) so as to be negligibly small with respect to the operation of the MOS transistors by increasing a base length (i.e., increasing the depth of the shallow well region to 200 nm or more) and reducing the impurity concentration in the base (the impurity concentration in the shallow well region is $2\times10^{17}/cm^3$ or less).

On the other hand, in the case where the potential of the deep n-well region is set at GND and that of the deep p-well region is set at a power supply voltage $V_{DD}$, such a design is effective for the MOS transistors because the parasitic bipolar transistors operate so as to help the MOS transistors as described in Table 1 of Example 2. However, a diode junction between the deep p-well region and the deep n-region is forward biased. Therefore, even if the parasitic bipolar transistors in a standby state are turned off, a forward current continues to flow between the deep n-well region and the deep p-well region. In order to solve this problem, it is sufficient to provide a circuit and a configuration as described in Examples 20 and 21 as follows for the semiconductor device of Example 11.

EXAMPLE 20

It is described in Example 19 that the potential of the deep n-well region is set at the ground level GND and the deep p-well region is set at the power supply voltage $V_{DD}$ in order to positively use the bipolar transistors of Examples 16 and 17 as active elements. Specifically, the deep n-well region of the parasitic bipolar transistor NPNTr3 is used as an emitter which is grounded, and the deep p-well region of the parasitic bipolar transistor PNPTr3 is used as an emitter which is set at the power supply voltage.

Since a forward current continues to flow between the deep p-well region and the deep n-well region in this case, it is necessary to separate the deep p-well region and the deep n-well region from each other. Specifically, deeper well regions are formed in such a manner that a deep p-well region is formed in a deeper n-well region so as to have the same potential and a deep n-well region is formed in a deeper p-well region so as to have the same potential.

Figure 33:
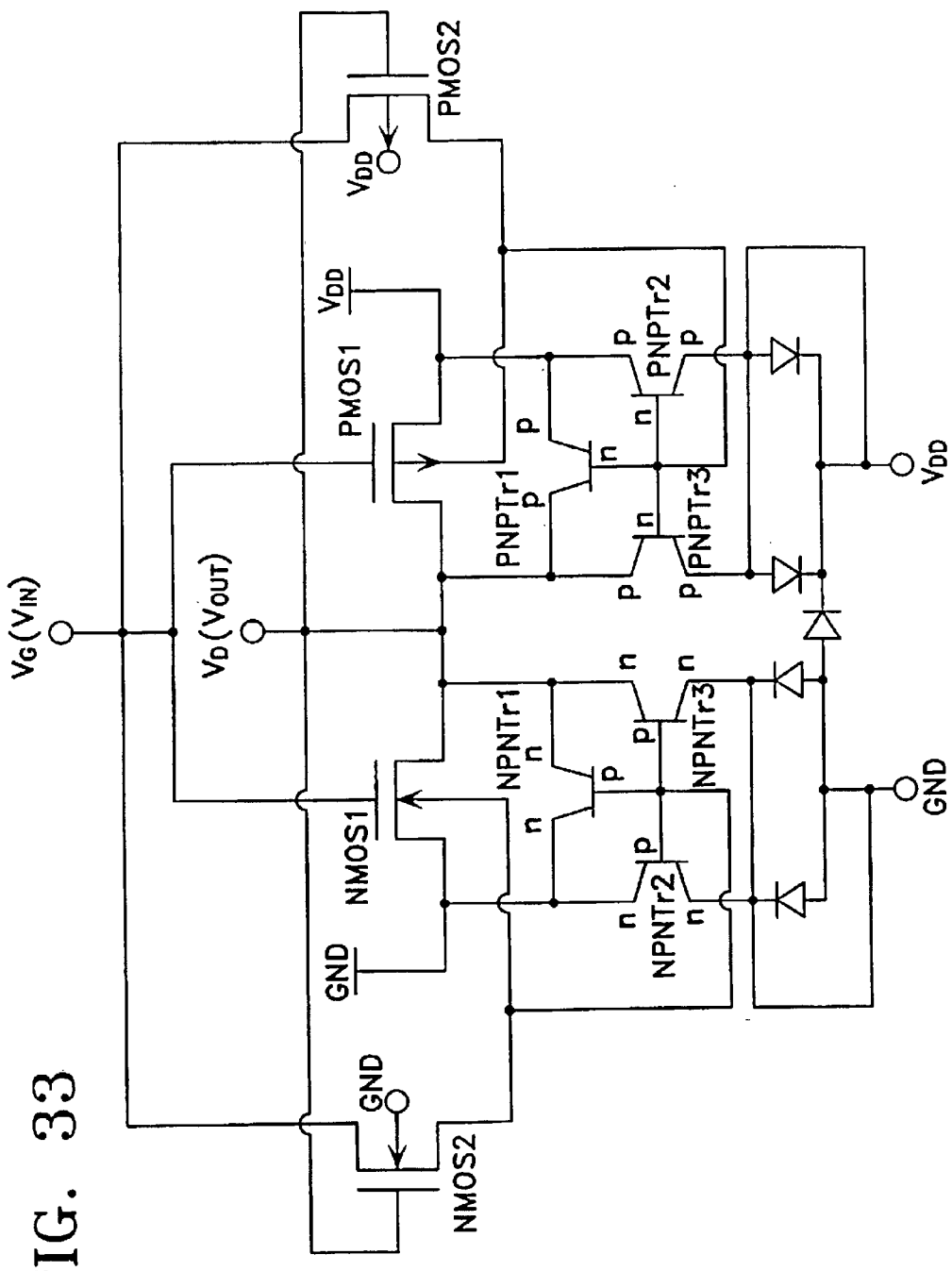
FIG. 33 is a circuit diagram of a semiconductor device of Example 20.

Through such a configuration, since a pn junction between the deep well regions are reverse biased, a forward current is prevented from flowing therebetween. FIG. 33 is a circuit diagram of a semiconductor device having such a configuration. In the complementary semiconductor device of Example 20, a power supply voltage is not limited. A driving current during activation of a semiconductor device is equal to the sum of a drain current and a bipolar current of the MOS transistors. Moreover, a leak current in a standby state is determined only by an OFF state of the MOS transistors NMOS1, NMOS2, PMOS1, and PMOS2.

Specifically, in the case where a power supply voltage is set to be in the vicinity of the built-in potential or lower, a normal CMOS transistor is not suitable for use because a driving current is so small that the normal CMOS transistor operates at an extremely low speed. However, according to Example 20, it is possible to configure a significantly low power consumption circuit. In the case where a power supply voltage is set to be in the vicinity of the built-in potential or higher, it is possible to configure a significantly high speed and low power consumption circuit, which uses an amount of the power as small as a CMOS circuit and operates as fast as a the bipolar circuit.

EXAMPLE 21

In order to separate the deep well region of a N-channel MOS transistor NMOS1 and that of a P-channel MOS transistor PMOS1 from each other, the N-channel MOS transistor NMOS1 and the P-channel MOS transistor PMOS1 are formed so as to have the same structure as that shown in FIG. 17 for Example 11. Specifically, the two transistors are separated by a groove type element separation structure which is deeper than the "deep well region" and shallower than the "deeper well region".

EXAMPLE 22

As described above, since a forward bias is applied to source/drain regions with respect to a shallow well region, an undesirable leak current (forward current) flows between the shallow well region and the source/drain regions in the case where an electric field equal to or higher than the built-in potential is applied across the shallow well region and the source/drain regions.

The built-in potential is determined by the material of the substrate. In the case where the substrate is made of silicon, the built-in potential is about 0.9 V at room temperatures. Therefore, in order to prevent a pn junction forward current from flowing, it is sufficient to increase the built-in potential. According to one method, carbon or nitrogen serving as an impurity is introduced into a junction region between the source/drain regions and the shallow well region.

According to this example, impurity ions (carbon ions or nitrogen ions) are implanted at a concentration in the range of about $1 \times 10^{14}$ to about $1 \times 10^{16}/cm^2$, with such an acceleration energy that an implantation projection range (Rp center) is positioned in the junction region between the source/drain regions and the shallow well region. By this ion implantation, a Si—C bond or a Si—N bond is formed in the vicinity of the junction region, resulting in an increase in the built-in potential.

EXAMPLE 23

In Examples 14 to 17 above, a method for eliminating the limit of a power supply voltage and a method for restraining a pn junction forward current in a standby state in the semiconductor devices of Examples 1 and 2 by the addition of transistors are described by using an equivalent circuit. In Examples 19 and 20, a method for eliminating the limit of a power supply voltage and a method for restraining a pn junction forward current in a standby state are described for complementary type semiconductor devices.

Another configuration for restraining a leak current during standby is described with reference to FIGS. 34 and 35.

Figure 34:
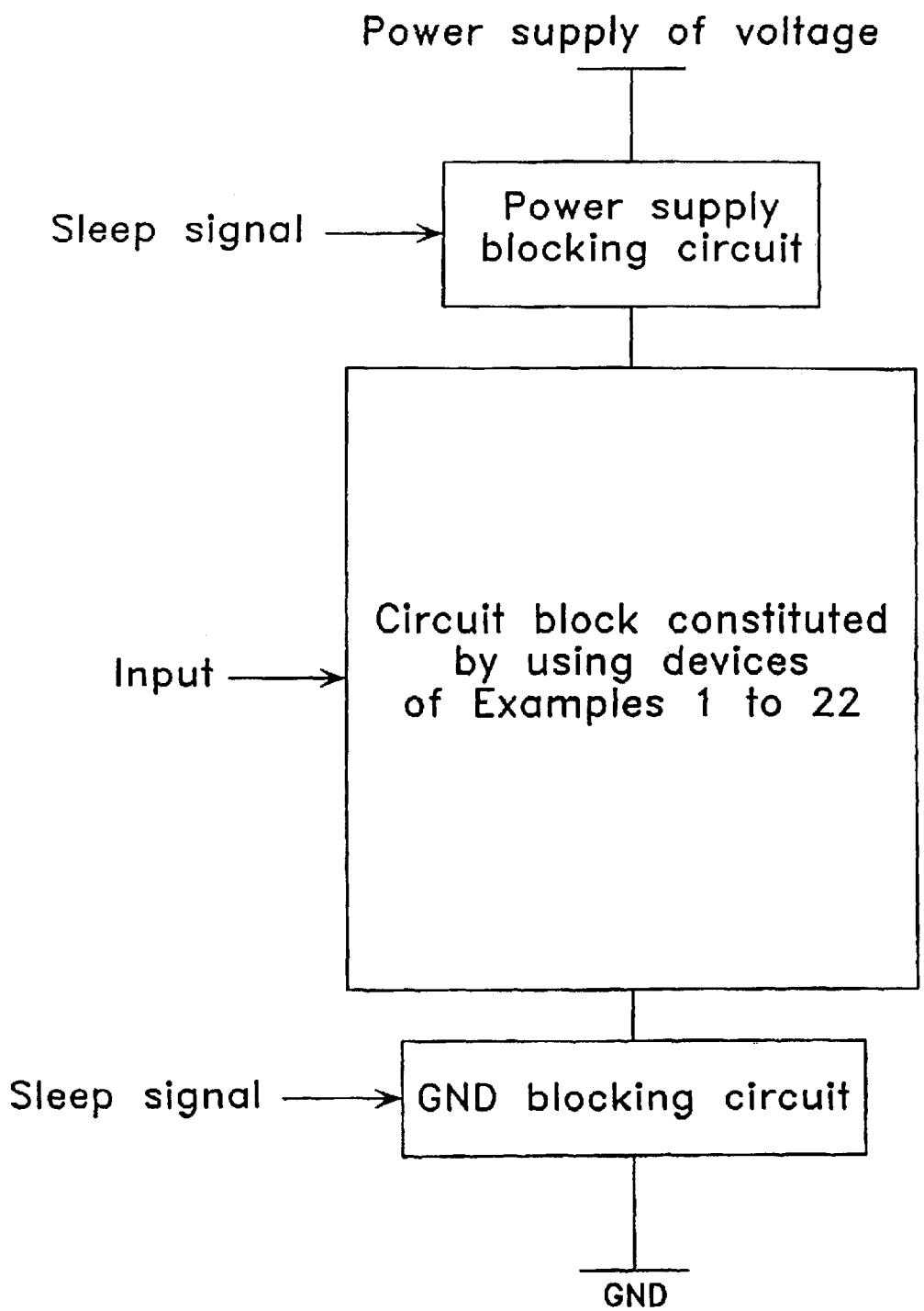
FIG. 34 is a circuit diagram of a semiconductor device of Example 23.
Figure 35:
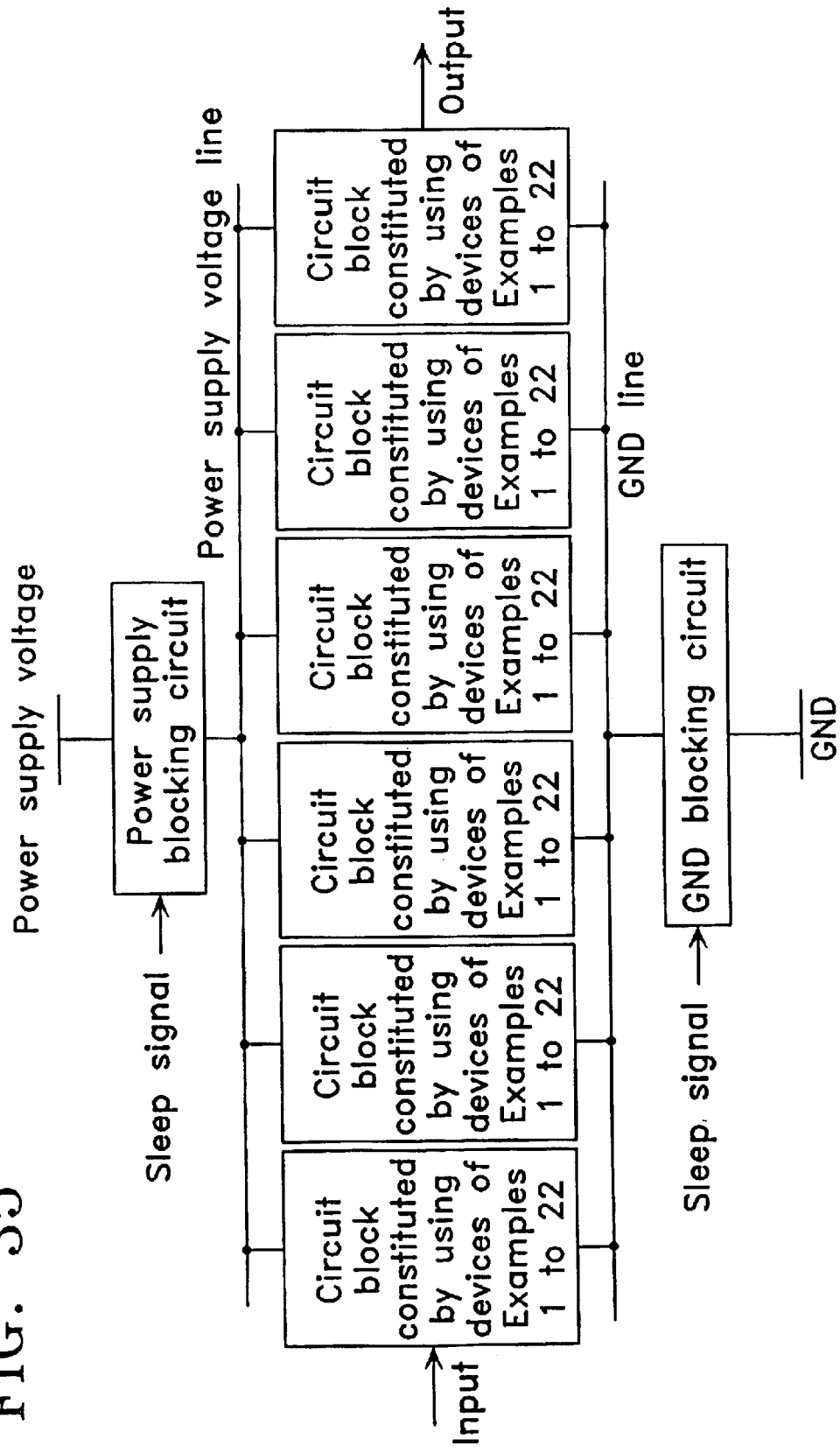
FIG. 35 is another circuit diagram of the semiconductor device of Example 23.

In Example 23, as shown in FIGS. 34 and 35, a power supply voltage blocking circuit and/or a GND blocking circuit is provided for each unit circuit block (FIG. 34) or for each group of unit circuit blocks (FIG. 35). The power supply voltage blocking circuit is configured so that a power supply voltage is supplied to a circuit block only when the circuit block is activated. The operation of the blocking circuits are controlled by sleep signals. In this manner, the leak current during standby can be reduced.

EXAMPLE 24

In Example 24, the relationship between a groove type element separation structure and a field oxide film, and a shallow well region is described.

FIGS. 36A to 36D are cross-sectional views showing the fabrication steps of a semiconductor device according to Example 24.

In FIGS. 36A to 36D, the reference numeral 2401 denotes a semiconductor substrate, the reference numeral 2402 denotes a deep n-well region, the reference numeral 2403 denotes a deep p-well region, the reference numeral 2404 denotes a groove type element separation structure, the reference numeral 2405 denotes a field oxide film region, the reference numeral 2406 denotes an ion implantation protective film, the reference numeral 2407 denotes a photoresist, the reference numeral 2408 denotes a donor impurity to be implanted, the reference numeral 2409 denotes a photoresist, the reference numeral 2410 denotes an acceptor impurity to be implanted, the reference numeral 2411 denotes a shallow n-well region, and the reference numeral 2412 denotes a shallow p-well region.

Figure 36A:
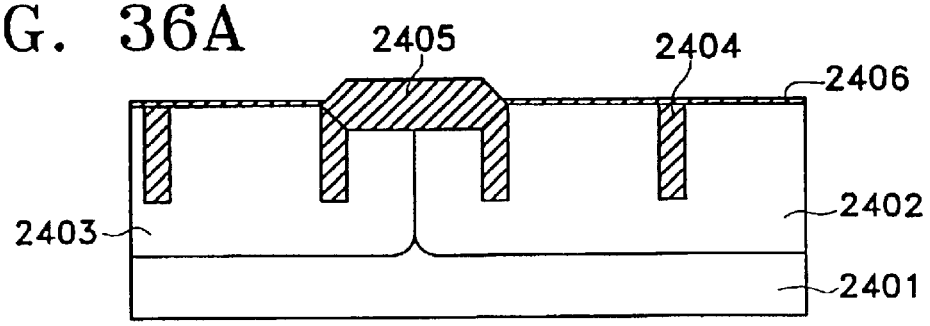
FIGS. 36A to 36D are cross-sectional views showing the steps of a fabrication method of Example 24.

First, as shown in FIG. 36A, the deep n-well region 2402, the deep p-well region 2403, the groove type element separation structure 2404 and the field oxide film 2405 are formed in the semiconductor substrate 2401. The deep n-well region 2402 and the deep p-well region 2403 are formed so as to have a depth in the range of about 2 to 4 $\mu m$ and an impurity concentration in the range of about $1 \times 10^{16}/cm^3$ to about $1 \times 10^{17}/cm^3$. The groove type element separation structure 2404 is formed so as to have a depth in the range of about 1 to 2 $\mu m$. The field oxide film 2405 is formed so as to have a thickness in the range of about 200 to about 600 nm.

Figure 36B:
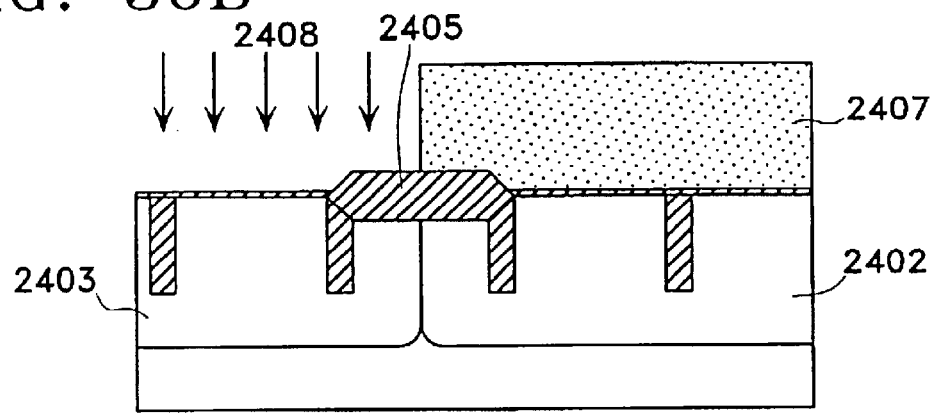
Figure 36C:
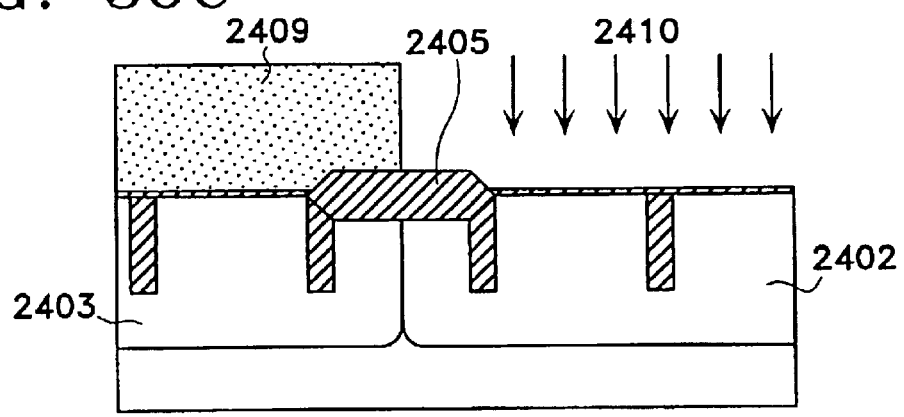

Next, as shown in FIGS. 36B and 36C, ion implantation is performed using the photoresists 2407 and 2409 as masks so as to implant the donor ions 2408 into the deep p-well region 2403 and the acceptor ions 2410 into the deep n-well region 2402. The order of the implantation is not limited. At this time, even when the photoresists 2407 and 2409 are somewhat misaligned, it is possible to prevent the impurity ions from being implanted into the region below the field oxide film 2405 by the field oxide film 2405.

Figure 36D:
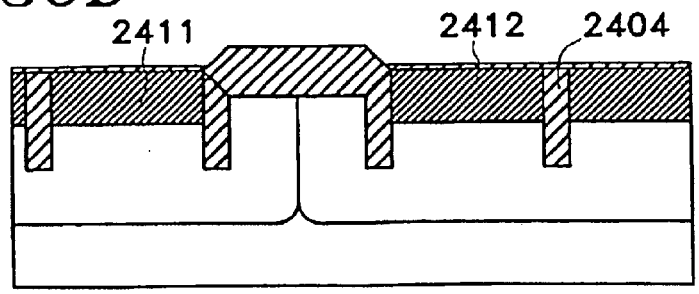

Next, as shown in FIG. 36D, the shallow n-well region 2411 and the shallow p-well region 2412 are formed by activation annealing. The shallow n-well region 2411 and the shallow p-well region 2412 are formed so as to be shallower than the groove type element separation structure 2404, that is, to have a depth in the range of about 0.5 to about 1.0 $\mu m$ and an impurity concentration in the range of about $5 \times 10^{16}/cm^3$ to about $1 \times 10^{18}/cm^3$.

By forming the shallow well region after forming the groove type element separation structure and the field oxide film as in Example 24, it is possible to separate the shallow n-well region and the deep n-well region, from the shallow p-well region and the deep p-well region by the field oxide film in a self-aligned manner.

However, the fabrication method of Example 24 is difficult to apply to such a structure where the field oxide film extends around the contact region between the gate region and the shallow well region as shown in FIG. 8D of Example 4 because the ion implantation is performed after forming the field oxide film. Even if the fabrication method of this example is applied to such a structure, the effect of this example cannot be fully obtained. This is because the ion implantation should be performed with a high energy which can electrically connect the shallow well region below the channel region, and the shallow well region below the contact region, between the gate region and the shallow well region, with each other. Such a high energy can penetrate the field oxide film. In this case, it is impossible to separate the shallow n-well region and the shallow p-well region from each other by the field oxide film in a self-aligned manner.

EXAMPLE 25

Figure 37:
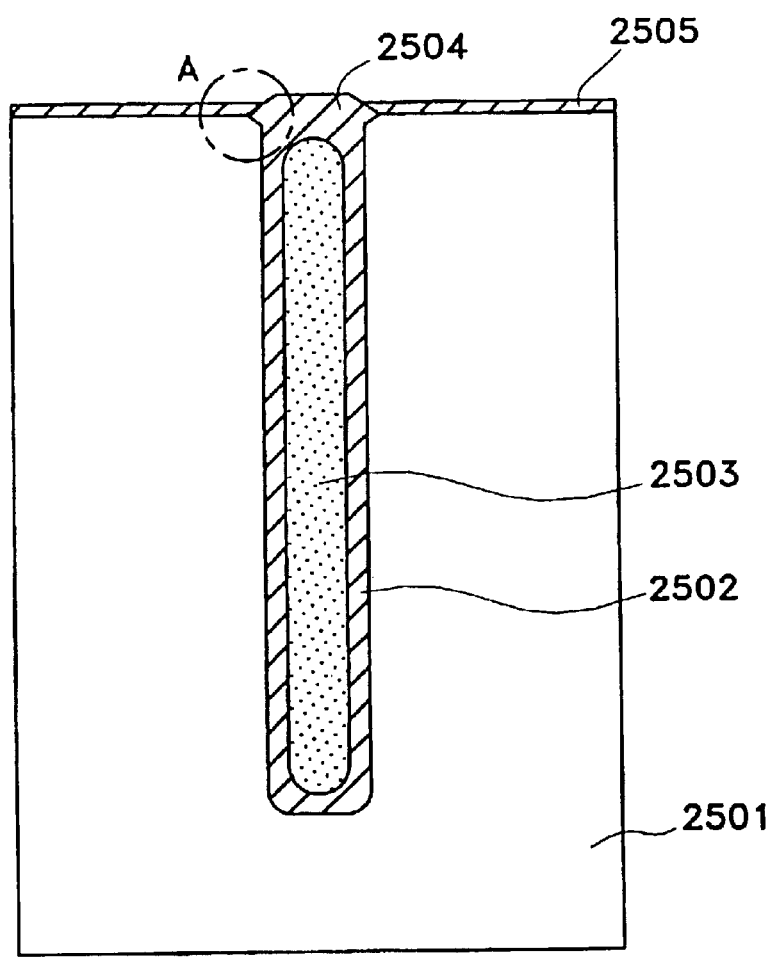
FIG. 37 is a cross-sectional view showing a groove type element separation structure of Example 25.
Figure 38A:
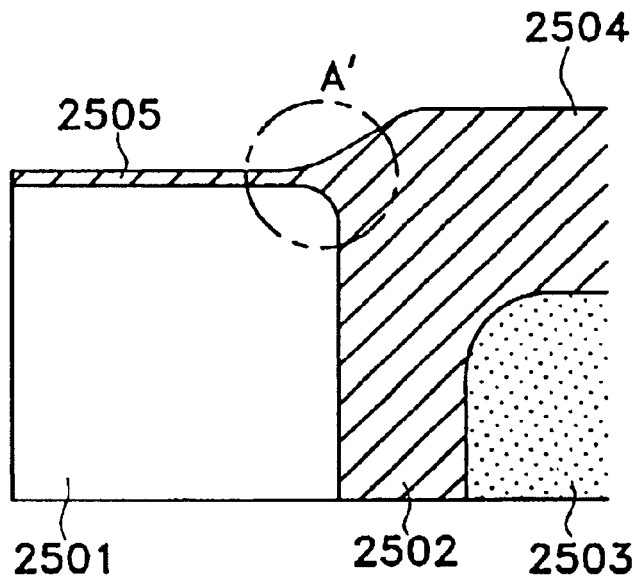
FIG. 38A is an enlarged view of a portion A in FIG. 37.

FIG. 37 is a cross-sectional view showing a groove type element separation structure according to the present invention. FIG. 38A is an enlarged view specifically showing a portion A in FIG. 37.

Figure 38B:
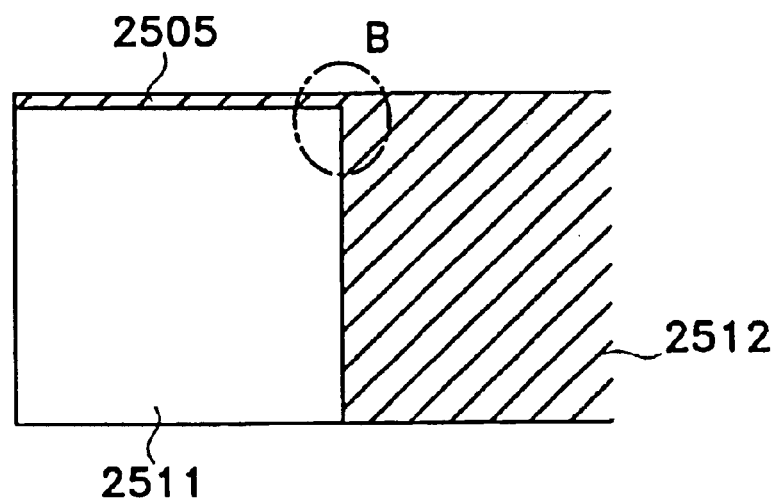
FIG. 38B is a cross-sectional view of a conventional groove type element separation structure.

FIG. 38B shows a groove type element separation structure of a conventional example. In this conventional example, after a groove is formed in a semiconductor substrate 2511, the groove is filled with a silicon oxide film 2512. Then, the silicon oxide film 2512 is partially removed by chemical mechanical polishing (CMP) so that the silicon oxide film 2512 only remains in the groove. A gate insulating film 2505 is formed on an active region of the semiconductor substrate 2511.

As shown in FIG. 37, in the groove type element separation structure of this example, the silicon oxide film 2502 is formed along the wall of the groove. However, the groove is not completely filled with the silicon oxide film 2502. The groove is filled also with a polycrystalline silicon film 2503. A thin gate insulating film 2505 is formed on an active region of the surface of the semiconductor substrate 2501, whereas a relatively thick field oxide film 2504 is formed in an active region (field region). The field oxide film 2504 is also present on the groove. The field oxide film 2504 is formed by local oxidation. On the edge of the field oxide film 2504, a bird's beak is formed. As a result, in the structure of this example, the edge of a groove opening is not sharpened.

Therefore, the electric field concentration does not occur in the edge of the groove opening, indicated with A' in FIG. 38A. Therefore, it is possible to prevent a leak current from increasing in the edge portion A'. On the other hand, the conventional groove type element separation structure formed by CMP shown in FIG. 38B has a sharpened edge of the groove opening as indicated with B. As a result, an electric field is concentrated in the edge portion B which cause an increase in the leak current in the edge portion B.

The groove type element separation structure is not only effective for the separation of transistors as shown in FIGS. 1A to 1D, having a dynamically varying threshold but is also effective for the separation of normal transistors.

Figure 39:
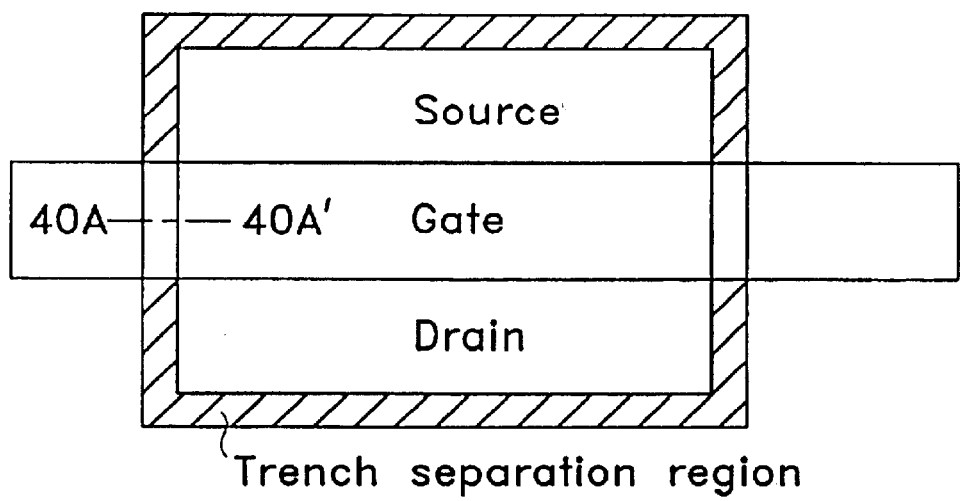
FIG. 39 is a plan view showing the positional relationship of a gate electrode overlapping a groove type element separation structure of a normal MOS transistor.

FIG. 39 shows a normal MOS transistor in which a gate electrode and a groove type element separation structure are positioned so as to partially overlap. Such a positional relationship may affect the transistor characteristics.

Figure 40A:
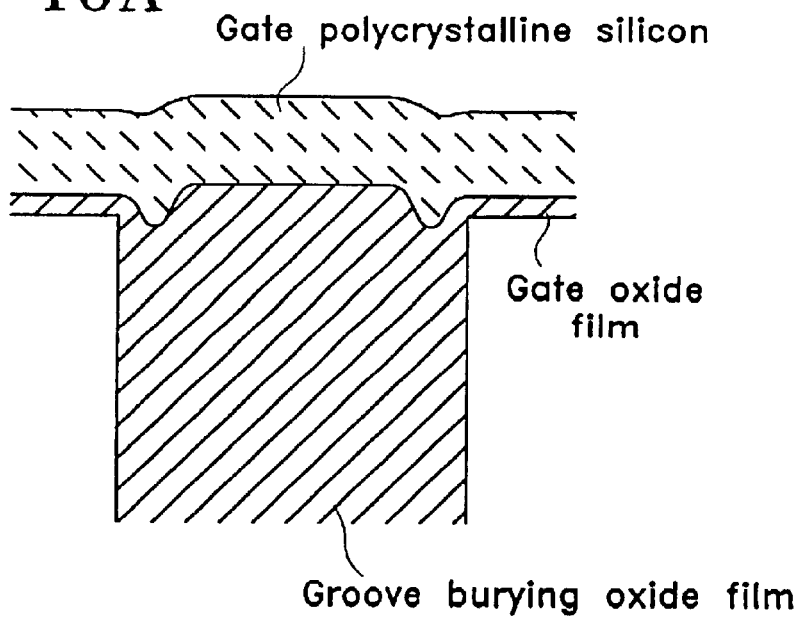
FIG. 40A is a cross-sectional view taken along a line 40A–40A' in FIG. 39 in the case of a conventional groove type element separation structure.
Figure 40B:
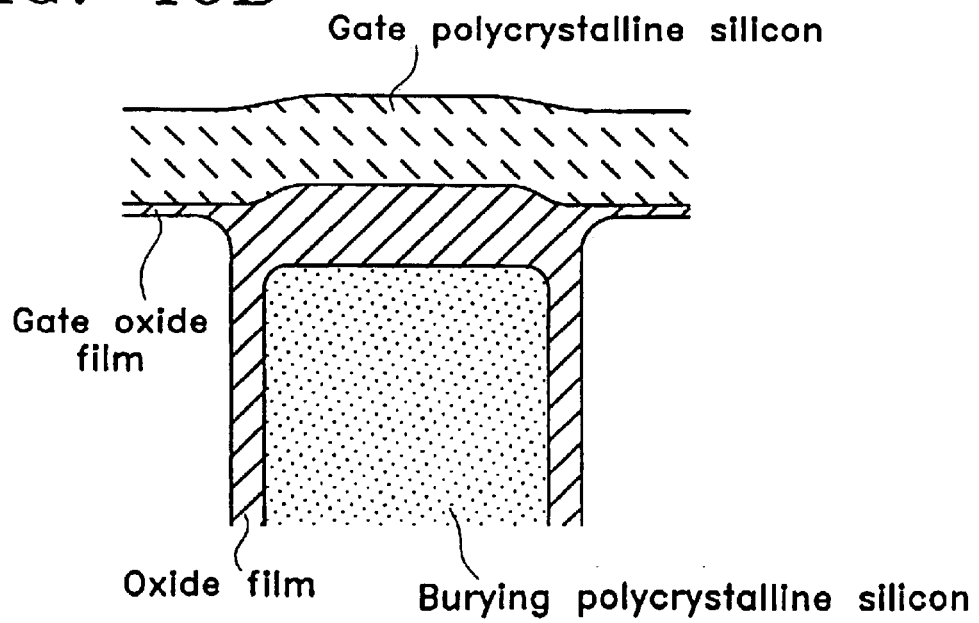
FIG. 40B is a cross-sectional view taken along a line 40A–40A' in FIG. 39 in the case of a groove type element separation structure according to the present invention.

FIGS. 40A and 40B are cross-sectional views taken along a line 40A–40A' in FIG. 39.

Figure 41B:
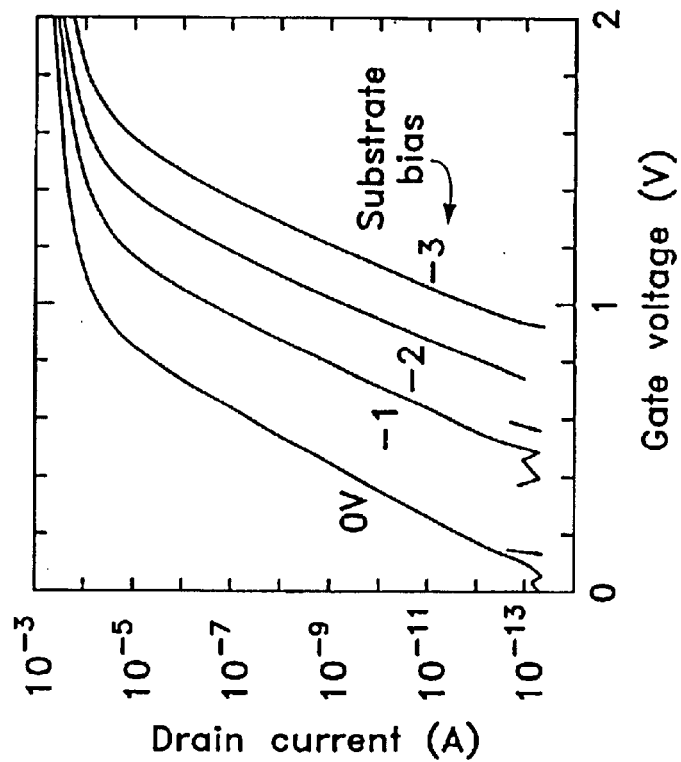
FIG. 41B is a graph showing transistor characteristics in the case of a groove type element separation structure according to the present invention.
Figure 41A:
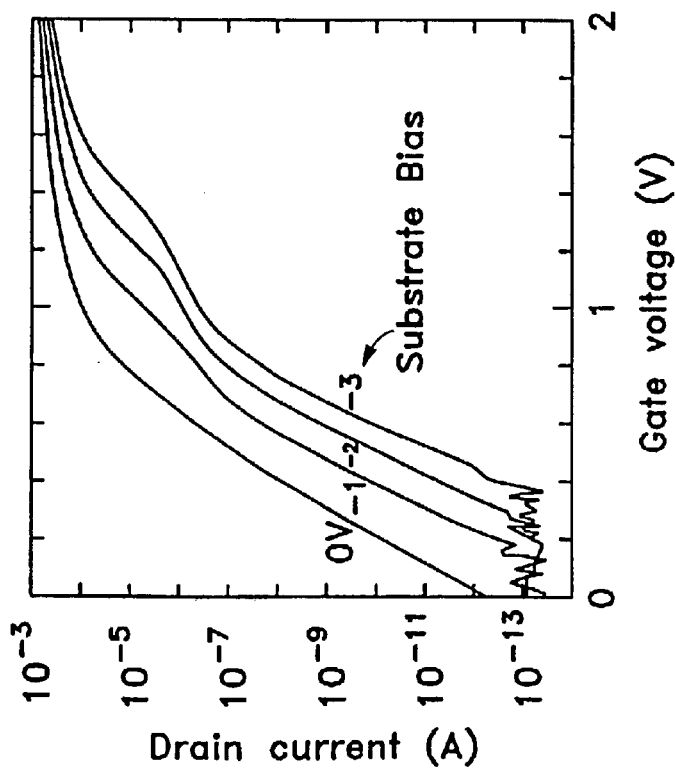
FIG. 41A is a graph showing transistor characteristics in the case of a conventional groove type element separation structure.

By a conventional fabrication method, a burying oxide film in the edge portion of the groove is prone to be etched by a hydrofluoric acid washing treatment performed prior to the formation of a gate insulating film. Therefore, the edge portion of the groove may likely to be narrowed. FIG. 40A shows the edge portion of the groove having such a "narrowed portion". By the electric field concentration in the groove edge portion, as shown in FIG. 41A, a kink occurs in a sub-threshold characteristic curve of the MOS transistor.

By using the groove type element separation structure according to the present invention, as shown in FIG. 40B, the edge portion of the groove is rounded, so that the electric field concentration in the portion is alleviated. Therefore, in a MOS transistor having such a groove type element separation structure, a kink is not generated in a sub-threshold characteristic curve as shown in FIG. 41B. FIGS. 41A and 41B show the gate voltage dependance of a drain current in the transistors shown in FIGS. 40A and 40B. The graphs shown in FIGS. 41A and 41B are obtained based on the result of measuring a source voltage at about 0 V and a drain voltage at about 0.1 V.

EXAMPLE 26

Figure 42:
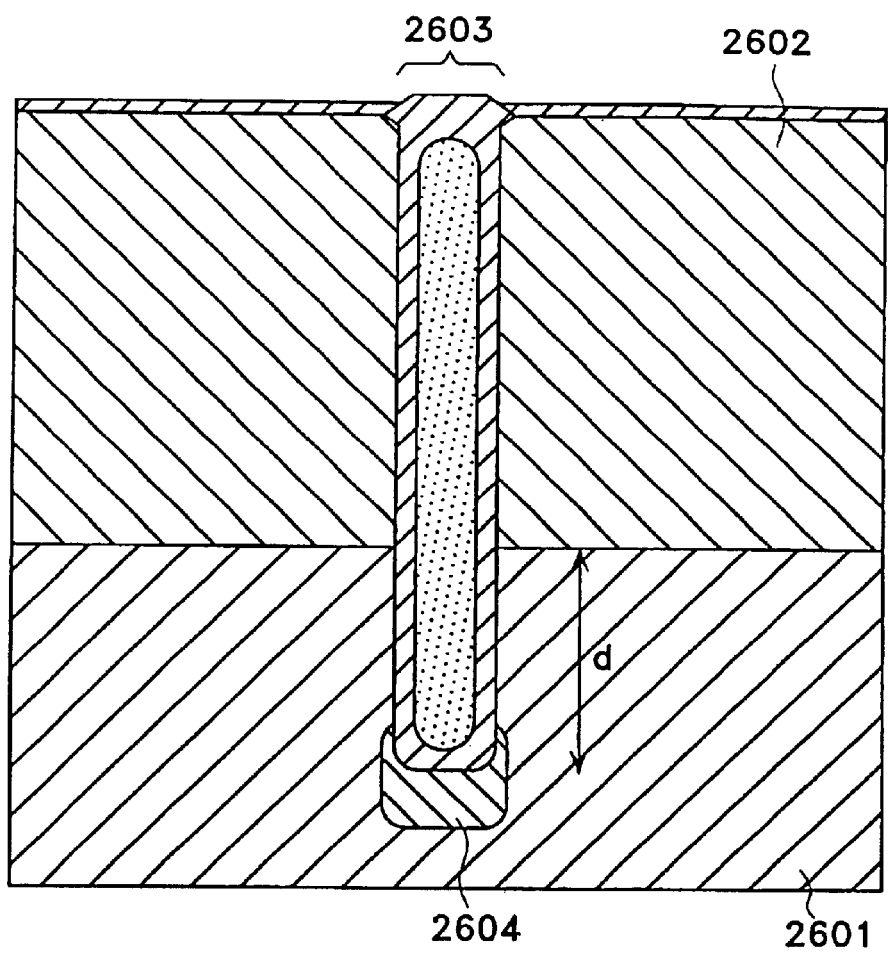
FIG. 42 is a cross-sectional view showing a groove type element separation structure of Example 26.

FIG. 42 is a cross-sectional view showing the relationship between a groove type element separation structure 2603, a shallow well region 2602, and a deep well region 2601 when the semiconductor device of Example 3 is separated by using the groove type element separation structure shown in FIG. 37. Since an impurity concentration of the shallow well region 2602 is set to be in the range of about $5\times10^{16}$ to $1\times10^{18}/cm^3$ and an impurity concentration of the deep well region is set to be in the range of about $1\times10^{16}$ to $1\times10^{17}/cm^3$, the width of a deletion layer is increased (about several hundreds of nano meters). Therefore, in the case where a distance d between the junction portion of the shallow well region 2602 and the deep well region 2601, and the bottom of the groove is short, there is a possibility that punch-through may occur between the adjacent shallow well regions.

In order to avoid punch-through, it is preferred to provide a region 2604, in which an impurity having the same conductivity type as that of the deep well region is diffused at a high concentration, in the vicinity of the bottom of the groove. In Example 26, an impurity concentration of the region 2604 is set to be within the range of about $1\times10^{18}/cm^3$ to about $1\times10^{19}/cm^3$.

Although the positional relationship between the shallow well region, the deep well region and the groove type element separation structure is described in Example 26, the relationship is not limited thereto. For example, such a positional relationship can be used for separating the adjacent source/drain regions of a transistor formed in a shallow well region. In such a case, the shallow well region 2602 is replaced by the source/drain regions, and the deep well region 2601 is replaced by the shallow well region.

EXAMPLE 27

A method for forming a groove type element separation structure according to the present invention will be described with reference to FIGS. 43A to 43H.

Figure 43A:
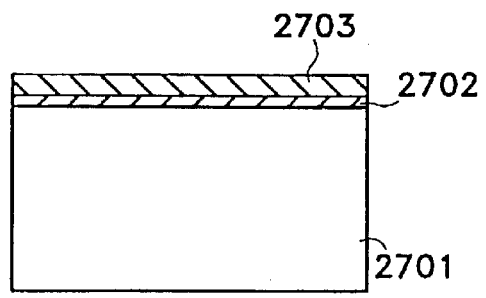
FIGS. 43A to 43H are cross-sectional views showing the step of forming a groove type element separation structure and a field oxide film of Example 27.

First, as shown in FIG. 43A, a silicon oxide film 2702 (having a thickness in the range of about 10 to 20 nm in this example) and a silicon nitride film 2703 (having a thickness in the range of about 100 to about 200 nm in this example) are successively formed.

Figure 43E:
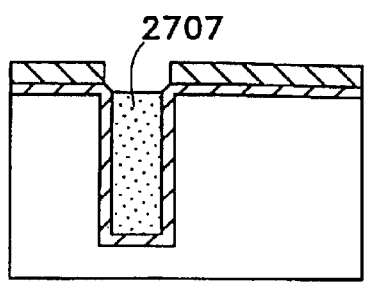
Figure 43B:
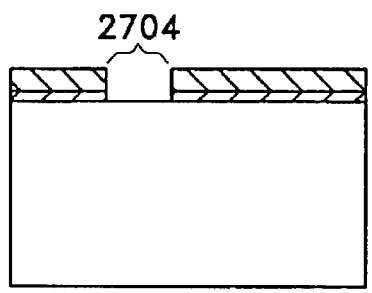

Next, as shown in FIG. 43B, the silicon nitride film 2703 and the silicon oxide film 2702 positioned in a region 2704 where the groove type element separation structure is to be formed are selectively removed by using photolithography and etching so as to partially expose the surface of the semiconductor substrate 2701. The width of the exposed region is set within the range of about 0.1 to 0.3 $\mu$m.

Figure 43F:
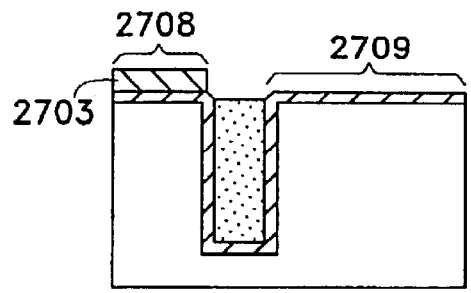
Figure 43C:
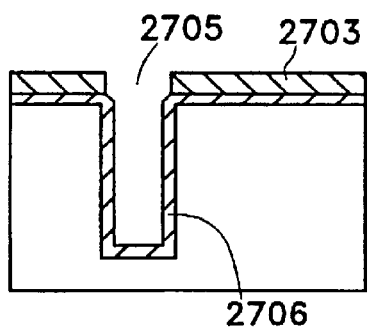

Next, as shown in FIG. 43C, the silicon substrate 2701 is etched by using the silicon nitride film 2703 as a mask so as to form a groove 2705 in the semiconductor substrate 2701. Thereafter, an inner wall of the groove 2705 is oxidized by an oxidizing atmosphere. In Example 27, after forming a groove having a depth in the range of about 1 to 2 $\mu$m, a silicon oxide film 2706 having a thickness in the range of about 10 to 50 nm is formed along the inner wall of the groove 2705.

Figure 43G:
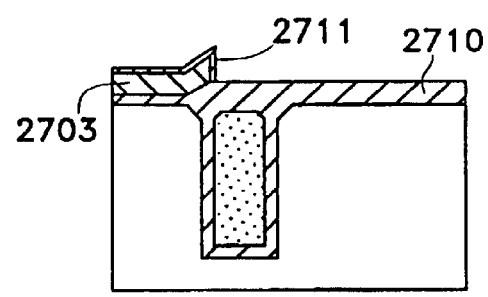
Figure 43D:
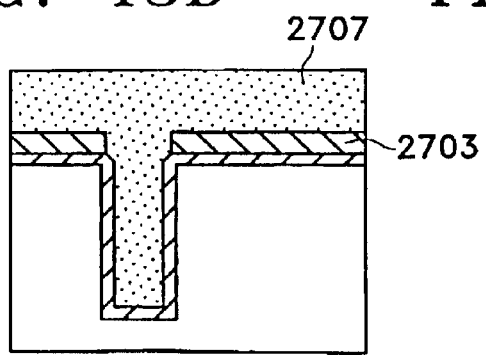

Next, as shown in FIG. 43D, a polycrystalline silicon film 2707 is deposited (in Example 27, so as to have a thickness in the range of about 200 nm to 600 nm) to fill the groove 2705.

Then, as shown in FIG. 43E, the polycrystalline silicon film 2707 is etched back so as to leave the polycrystalline silicon film 2707 only in the groove 2705.

Next, as shown in FIG. 43F, a silicon nitride film 2703 excluding an active region 2708 (an element formation region) is etched by photolithography so as to form a field oxide film in a field region 2709 excluding the active region 2708. At this time, the region of the silicon nitride film 2703 positioned on the groove type element separation structure 2704 has been already removed. Therefore, a width equal to that of the groove type element separation structure 2704 serves as an alignment margin of the photolithography for forming the field oxide film.

Next, as shown in FIG. 43G, oxidation is performed using the silicon nitride film 2703 on the active region 2708 as a mask so as to form a field oxide film 2710. In this example, the field oxide film 2710 is formed so as to have a thickness in the range of about 200 nm to 400 nm. At this time, the surface of the silicon nitride film 2703 is also oxidized so as to form a silicon oxide film 2711.

Figure 43H:
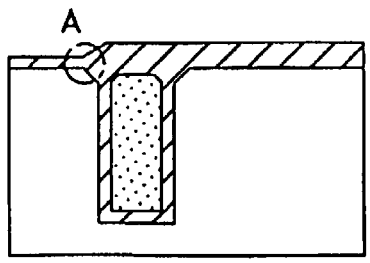

Next, as shown in FIG. 43H, the silicon oxide film 2711 which is formed by the field oxidizing step, formed on the silicon nitride film 2703 and the silicon nitride film 2703 on the active region, are removed.

By the method of the present invention, since the field oxide film and the groove type element separation structure are not misaligned (because there is an alignment margin equal to the width of the groove type element separation structure) and can be simultaneously formed, the fabrication step is simplified. Regarding a leak current in the edge portion of the groove, which becomes the most serious problem in the formation of a groove type element separation structure, a bird's beak is formed in the edge portion A of the groove as shown in FIG. 43H so as to restrain a leak current.

EXAMPLE 28

Another method for forming a groove type element separation structure according to the present invention is described with reference to FIGS. 44A to 44E.

Figure 44A:
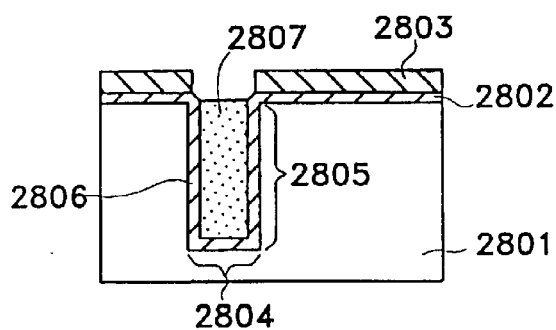
FIGS. 44A to 44E are cross-sectional views showing the step of forming a groove type element separation structure and a field oxide film of Example 28.

First, as shown in FIG. 44A, the steps shown in FIGS. 43A to 43E of Example 27 are performed so as to form a groove type element separation structure. In FIGS. 44A to 44E, the reference numeral 2801 denotes a semiconductor substrate, the reference numeral 2802 denotes a silicon oxide film, the reference numeral 2803 denotes a silicon nitride film, the reference numeral 2804 denotes a groove type element separation structure, the reference numeral 2805 denotes a groove the reference numeral 2806 denotes a silicon oxide film and the reference numeral 2807 denotes a polycrystalline silicon film.

Figure 44B:
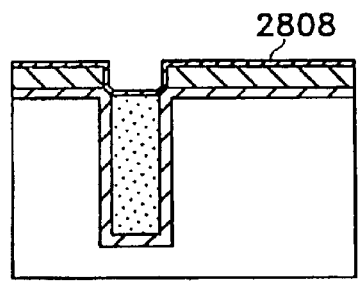

Next, as shown in FIG. 44B, a silicon nitride film 2808 is deposited onto the silicon nitride film 2803. In Example 28, the silicon nitride film 2808 is deposited so as to have a thickness in the range of about 1 to 5 nm.

Figure 44C:
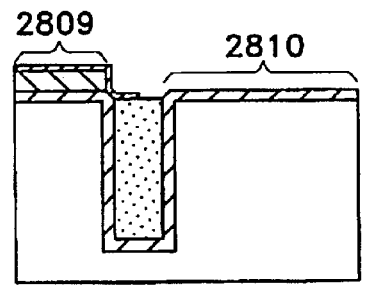

Next, as shown in FIG. 44C, the silicon nitride films 2808 and 2803 excluding an active region (an element formation region) 2809 are removed by etching through the photolithography so as to form a field oxide film on a field region 2810 excluding the active region 2809. At this time, it is preferred to etch the silicon nitride film 2808 on the groove type element separation structure 2804 so that almost a half of the silicon nitride film 2808 is left on the groove type element separation structure 2804.

Figure 44D:
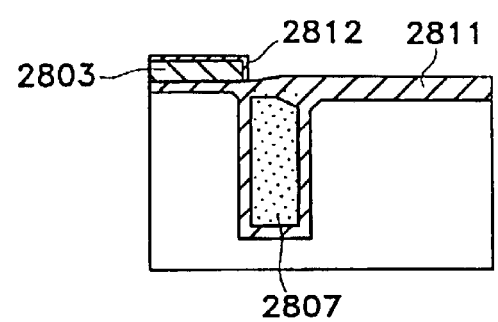

Next, as shown in FIG. 44D, the oxidation is performed by using the silicon nitride films 2803 and 2808 on the active region 2809 as masks so as to form a field oxide film 2811. In Example 28, the field oxide film 2811 has a thickness in the range of about 200 nm to about 400 nm is formed. At this time, since the silicon nitride film 2808 is extremely thin, the silicon nitride film 2808 is completely oxidized to be a silicon oxide film 2812. Moreover, the surface of the polycrystalline silicon film 2807 filling the groove 2805 is also oxidized.

Figure 44E:
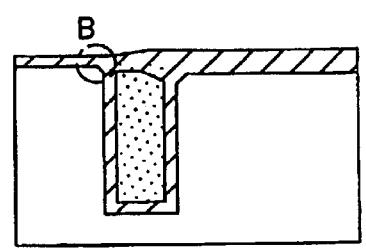

Next, as shown in FIG. 44E, the silicon oxide film 2812 positioned on the silicon nitride film 2803 and the silicon nitride film 2803 positioned on the active region 2809 are removed.

According to the method of Example 28, it is possible to reduce a bird's beak in an edge portion B of the groove (shown in FIG. 44E) as compared with Example 27. As a result, the width of a groove type element separation structure which is close to the designed size, can be obtained.

Figure 45:
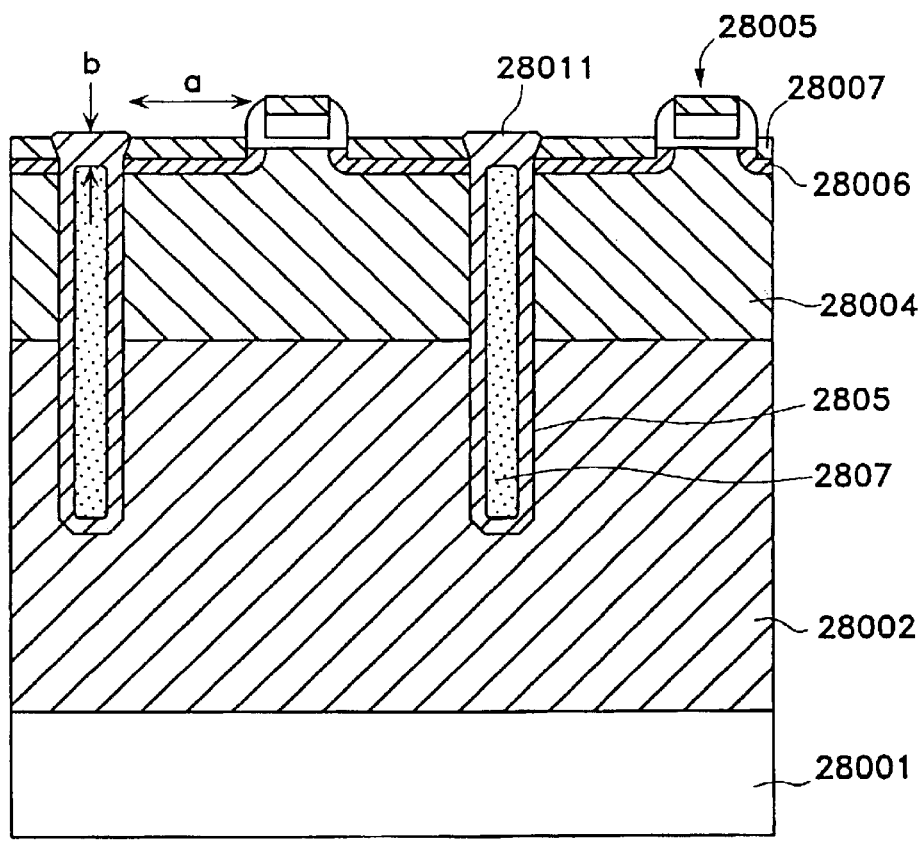
FIG. 45 is a cross-sectional view showing the semiconductor device of Example 3 to which the method for forming a groove type separation structure of Example 28 is applied.
Figure 46:
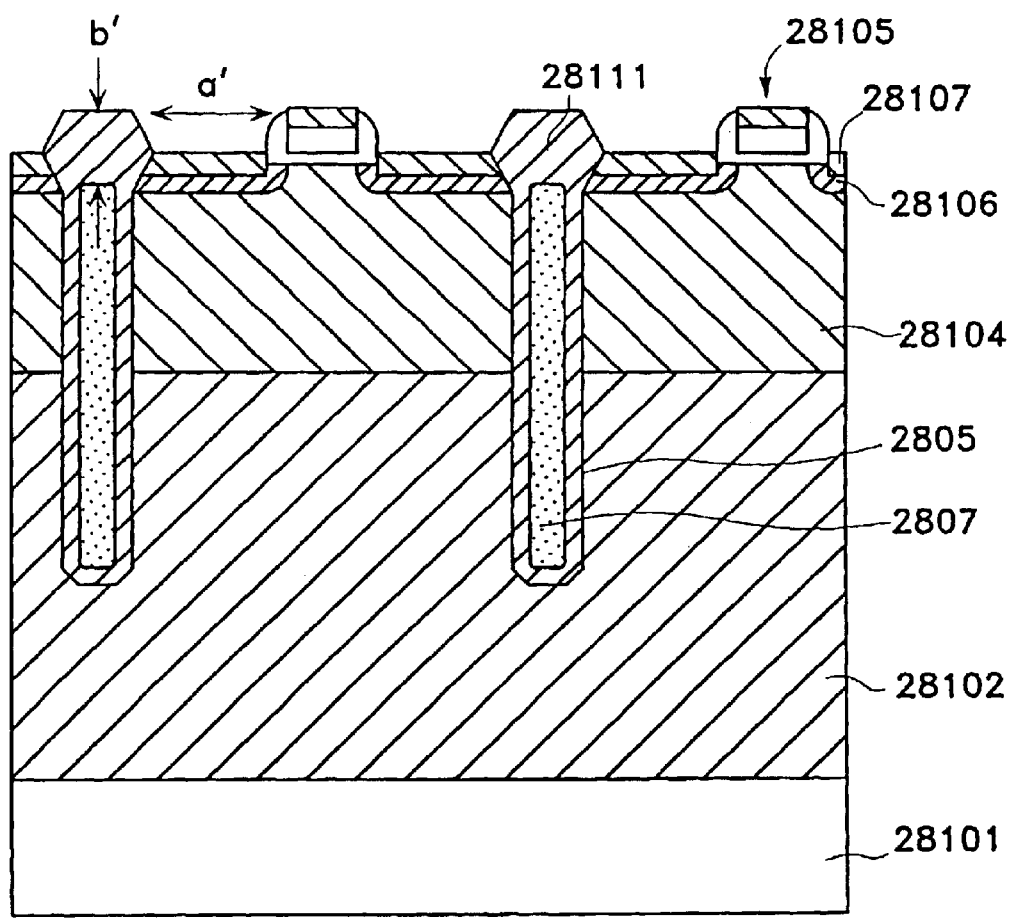
FIG. 46 is a cross-sectional view showing the application of the method for forming a groove type element separation structure of Example 27 to the semiconductor device of Example 3 for comparison with the method of Example 28.

FIG. 45 shows the application of the method for forming a groove type element separation structure of Example 28 to the semiconductor device of Example 3. FIG. 46 shows the application of the method of forming a groove type element separation structure of Example 27 to the semiconductor device of Example 3.

In FIGS. 45 and 46, the reference numerals 28001 and 28101 denote a semiconductor substrate, the reference numerals 28002 and 28102 denote a deep well region, the reference numerals 28004 and 28104 denote a shallow well region, the reference numerals 28005 and 28105 denote a gate electrode, the reference numerals 28006 and 28106 denote source/drain regions, and the reference numerals 28007 and 28107 denote a refractory silicide film, the reference numerals 28011 and 28111 denote a silicon oxide film, the reference numeral 2805 denotes a groove type element separation structure and the reference numeral 2807 denotes a polycrystalline silicon film.

In Example 28, in the case where the groove type element separation structure is sandwiched between active regions, the surface of the polycrystalline silicon film 2807 filling the groove type element separation structure 2805 is covered with the thin silicon nitride film 2808, prior to the field oxidation step, as shown in FIGS. 44B and 44C. Therefore, the polycrystalline silicon film 2807 is restrained from being oxidized during field oxidation (the polycrystalline silicon film 2807 is not oxidized until the silicon nitride film 2808 is completely oxidized to be a silicon oxide film 2812), so that a thickness b (see FIG. 45) of the silicon oxide film 28011 on the polycrystalline silicon film 2807 is reduced. As a result, the unevenness of the surface of the substrate is reduced so as to reduce the amount of over etching during processing of the gate polycrystalline silicon film.

Moreover, since the amount of oxidation of the polycrystalline silicon 2807 is small, a bird's beak is restrained. As a result, it is possible to reserve an area of an active region close to the designed size (that is, it is possible to set a size a shown in FIG. 45 so as to be close to a designed value). In particular, it becomes more advantageous as the minimum processing size is reduced and a thickness of the gate oxide film is reduced. In Example 28, both a gate width and a groove type element separation structure width have a designed size of about 0.18 $\mu$m, and the groove has a depth of about 1 $\mu$m.

In the case where the fabrication method of Example 27 is employed, since the polycrystalline silicon film 2807 is exposed prior to the field oxidation, a thickness b' of the silicon oxide film 28111 is increased, as shown in FIG. 46, so as to increase the unevenness of the surface of the substrate. Moreover, the size of a bird's beak is increased. However, the fabrication process of Example 27 is advantageously simpler than that of Example 28.

EXAMPLE 29

FIGS. 47A to 47F are cross-sectional views showing the fabrication steps of a groove type element separation structure and a field oxide film according to the present invention.

In Examples 27 and 28, it is necessary to perform the etch back so as to fill the groove with the polycrystalline silicon film. The etch back is performed by using a gas such as $Cl_2$, $O_2$, HBr and $SF_6$. In order to eliminate the unevenness of the surface of the substrate resulting from etching, it is necessary to perform over etching.

Figure 48A:
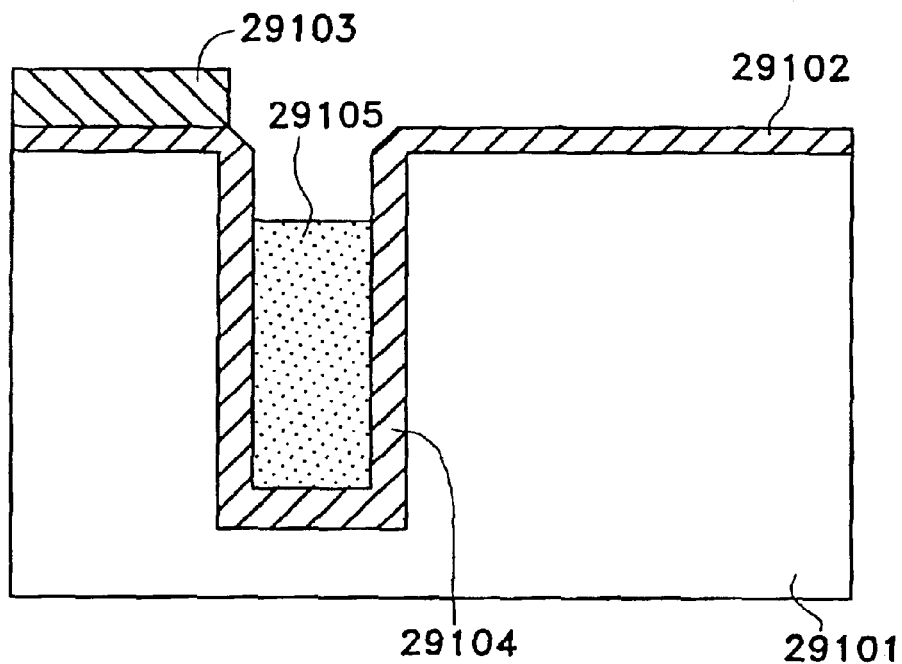
FIG. 48A is a cross-sectional view in the fabrication step prior to the field oxidation according to the methods of Examples 27 and 28 used in Example 29.
Figure 48B:
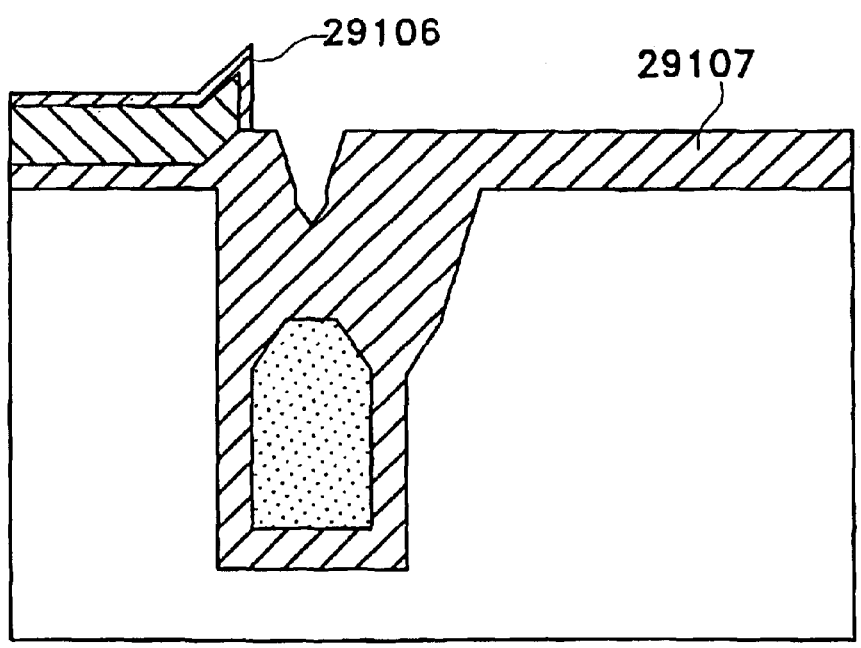
FIG. 48B is a cross-sectional view in the fabrication step after the field oxidation according to the methods of Examples 27 and 28 used in Example 29.
Figure 49A:
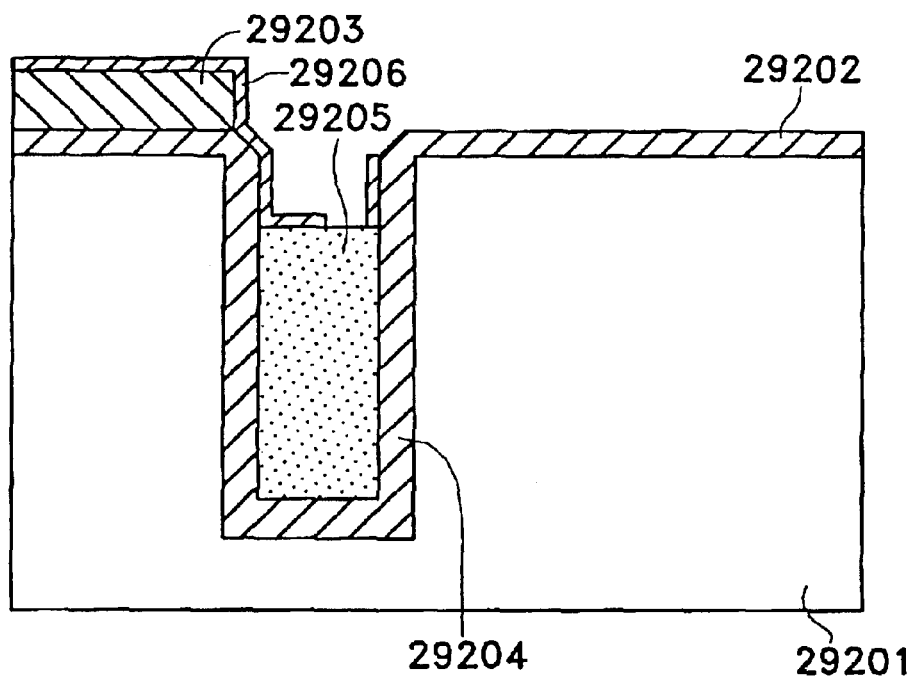
FIG. 49A is a cross-sectional view in the fabrication step prior to the field oxidation according to the methods of Examples 27 and 28 used in Example 29.
Figure 49B:
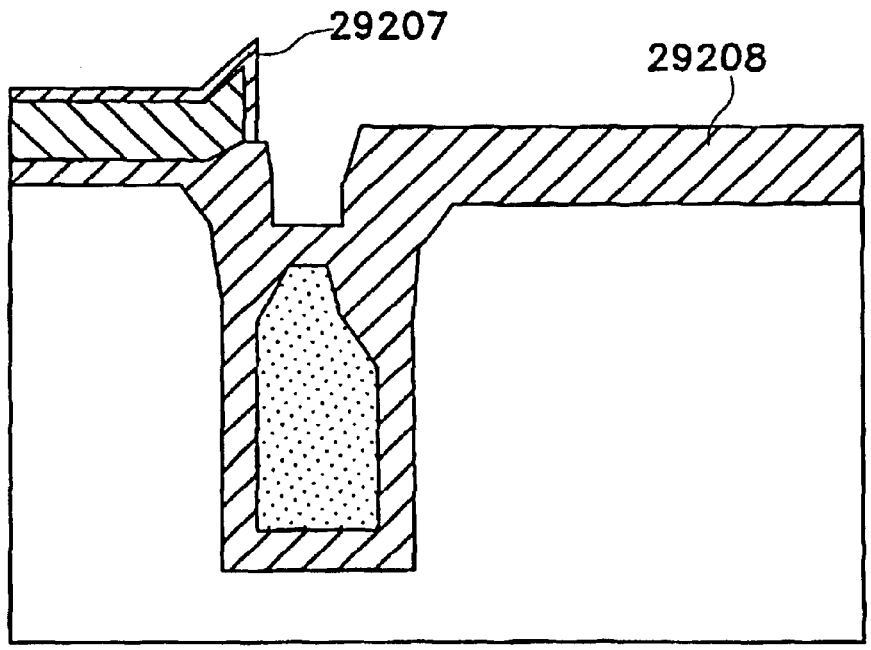
FIG. 49B is a cross-sectional view in the fabrication step after the field oxidation according to the methods of Examples 27 and 28 used in Example 29.

In the case where the amount of over etching is large, the shape of the groove type element separation structure becomes that as shown in FIGS. 48A and 48B (in the case of Example 27) or that as shown in FIGS. 49A and 49B (in the case of Example 28). Specifically, the level of the polycrystalline silicon film is lowered with respect to the level of the opening of the groove. In the case where the field oxidation process is performed in such a state, the side wall of the groove is significantly oxidized, resulting in the shape as shown in FIG. 48B (in the case of Example 27) or as shown in FIG. 49B (in the case of Example 28). The width of the resulting groove type element separation structure is greatly different from the designed size. Moreover, the unevenness of the surface of the substrate is increased. Accordingly, the polycrystalline silicon partially remains when the gate processing step is performed subsequently.

In FIGS. 48A, 48B, 49A and 49B, the reference numerals 29101 and 29201 denote a semiconductor substrate, the reference numerals 29102, 29104, 29106, 29202, 29204, and 29207 denote a silicon oxide film, the reference numerals 29103, 29203 and 29206 denote a silicon nitride film, the reference numerals 29105 and 29205 denote a polycrystalline silicon film and the reference numerals 29107 and 29208 denote a field oxide film. In order to provide a margin for the amount of over etching, it is sufficient to increase a height d as shown in FIG. 47D.

The fabrication steps will be described below in order.

Figure 47A:
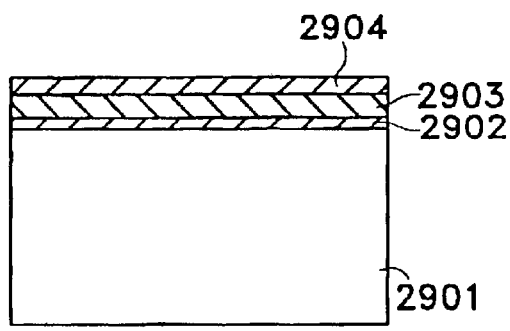
FIGS. 47A to 47F are cross-sectional views showing the fabrication step for forming a groove type element separation structure and a field oxidation film of Example 29.
Figure 47D:
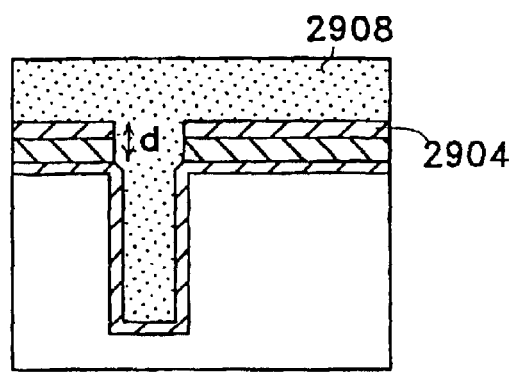

First, as shown in FIG. 47A, a silicon oxide film 2902 (having a thickness in the range of about 10 to 20 nm, in this example), a silicon nitride film 2903 (having a thickness in the range of about 100 to 200 nm, in this example) and a silicon oxide film 2904 (having a thickness in the range of about 30 to 150 nm, in this example) are successively deposited on a semiconductor substrate 2901 in this order. Although the silicon oxide film 2904 has a thickness in the range of about 30 to 150 nm, in this example, it is preferred that the silicon oxide film 2904 have a thickness in the range of about 50 to 70 nm.

Figure 47B:
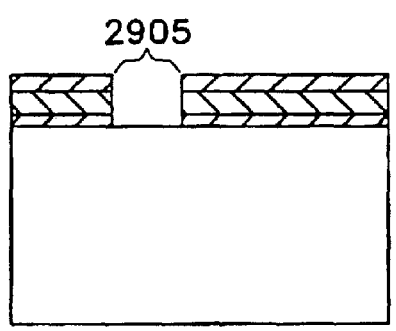

Next, as shown in FIG. 47B, the silicon oxide film 2904, the silicon nitride film 2903 and the silicon oxide film 2902 are partially etched through photolithography so as to form an opening 2905 for forming a desired groove type element separation structure, which has a width in the range of about 0.1 to 0.3 μm, in this example.

Figure 47E:
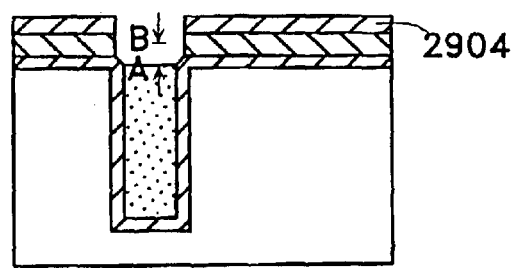
Figure 47C:
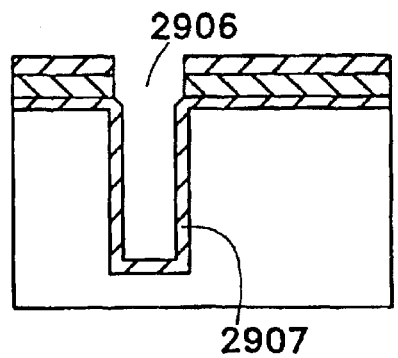

Next, as shown in FIG. 47C, the silicon substrate 2901 is etched using the silicon nitride film 2903 as a mask so as to form a groove 2906 for the groove type element separation structure. Thereafter, the inner wall of the groove 2906 is oxidized in an oxidation atmosphere. In this example, the groove 2906, having a depth in the range of about 1 to about 2 μm, is formed, and the silicon oxide film 2907, having a thickness in the range of about 20 to 100 nm, is formed along the inner wall of the groove 2906.

Next, as shown in FIG. 47D, a polycrystalline silicon film 2908 (in this example, having a thickness in the range of about 200 nm to 600 nm) is deposited so as to fill the groove 2906.

Next, as shown in FIG. 47E, the polycrystalline silicon film 2908 is etched back so as to leave the polycrystalline silicon film 2908 only in the groove 2906. The silicon oxide film 2904 is thinned when the polycrystalline silicon film is etched back, depending on an etching selectivity ratio of the silicon oxide film and the polycrystalline silicon film.

If the silicon oxide film 2904 is too thick, a difference in the level between a convex portion and the other portion on the substrate 2901 becomes large after the field oxidation step. In addition, if the silicon oxide film 2904 is too thick, a difference in the level between a concave portion and the other portion on the substrate 2901 becomes large after the field oxidation step. A height of the surface of the polycrystalline silicon film 2908 after the etch back should be about 100 nm or less (indicated with a height B in FIG. 47E) from the surface (indicated with a height A in FIG. 47E) of the silicon substrate 2901.

Figure 47F:
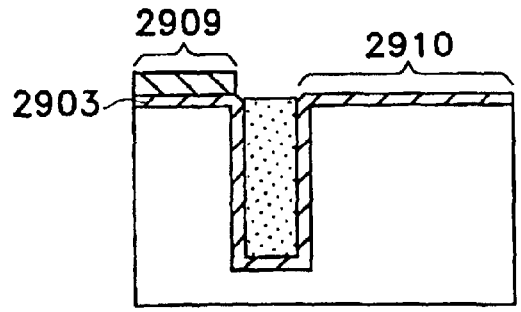

Next, as shown in FIG. 47F, after removing the silicon oxide film 2904 formed on the silicon nitride film 2903 by etching, the silicon nitride film 2903 in the field region 2910 is removed through photolithography by using the active region as a mask. Thereafter, the same steps as those of Example 29 or 28 are carried out so as to form a desired groove type element separation structure.

If the etch back is performed with high accuracy and a height of the polycrystalline silicon film after etch back is about 100 nm or less (indicated with a height B in FIG. 47E) from the surface (indicated with a height A in FIG. 47E) of the silicon substrate even without the silicon oxide film 2904, it is advantageous to employ the fabrication method of Example 29 or 28 because the steps of the fabrication method of Example 29 or 28 are simplified.

EXAMPLE 30

In Example 29 described above, after the silicon oxide film 2904 is entirely removed, the silicon nitride film 2903 in the field region is removed by etching through photolithography. In this case, the silicon oxide film 2907 in an opening portion of the groove is also etched during the etching of the silicon oxide film 2904. Therefore, oxygen is diffused to reach the silicon substrate at a high speed during the field oxide step, resulting in the increase of a bird's beak.

The above problem will be described in detail with reference to FIGS. 50A to 50D.

Figure 50A:
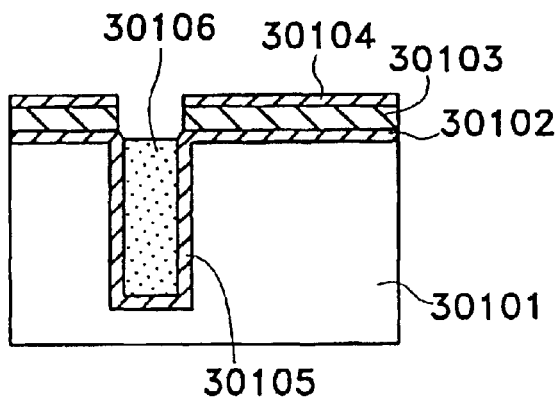
FIGS. 50A to 50D are cross-sectional views showing the fabrication steps according to Example 30.
Figure 50B:
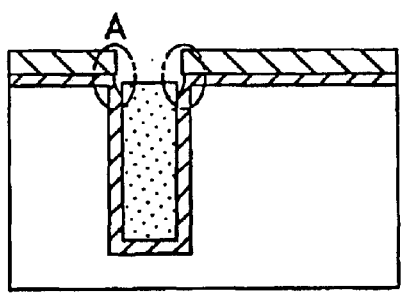
Figure 50D:
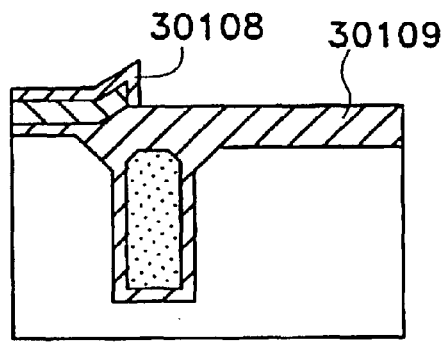
Figure 50C:
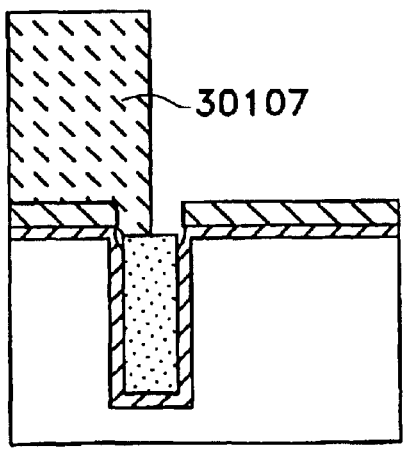

By using the method of Example 29, after etching back a polycrystalline silicon film 30106 as shown in FIG. 50A, a silicon oxide film 30104 is entirely etched as shown in FIG. 50B. As a result, a silicon oxide film 30105 in a region A in the vicinity of the opening of the groove is etched so as to be thinned during etching of the silicon oxide film 30104. Then, a silicon nitride film 30103 in a field region is removed by etching through photolithography by using a photoresist 30107 as a mask (see FIG. 50C). As a result, a bird's beak is slightly enlarged as shown in FIG. 50D after the field oxidation step.

In Example 30, a method for restraining a bird's beak is described.

Figure 51A:
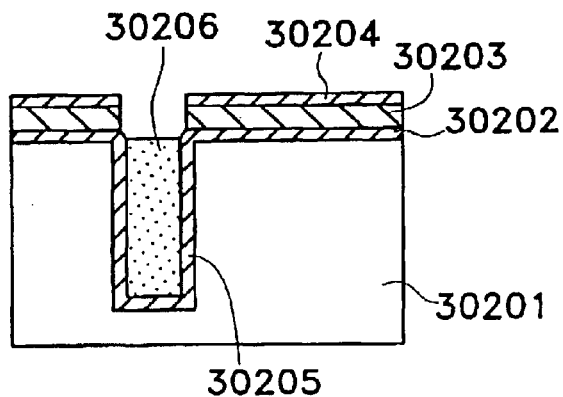
FIGS. 51A to 51D are cross-sectional views showing a fabrication method of Example 29 corresponding to FIGS. 50A to 50D.
Figure 51B:
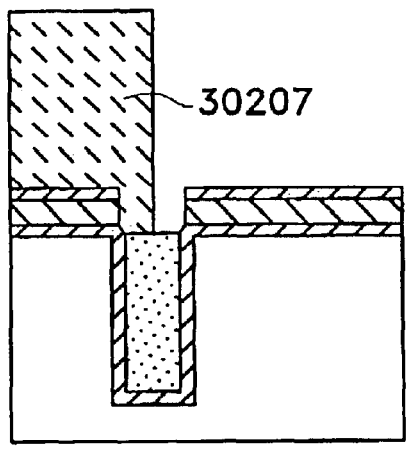
Figure 51D:
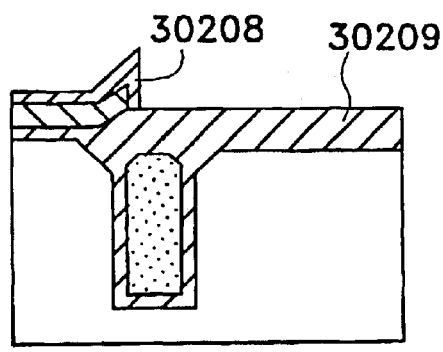
Figure 51C:
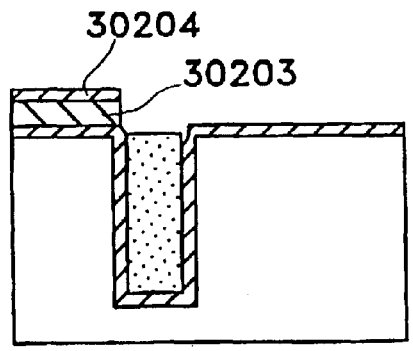

In a similar manner as in Example 29, as shown in FIG. 51A, after a polycrystalline silicon film 30206 is etched back, a photoresist step is performed while leaving a silicon oxide film 30204 on a silicon nitride film 30203 as shown in FIG. 51B. Next, as shown in FIG. 51C, part of the silicon oxide film 30204 and the silicon nitride film 30203 present on the field region are removed by etching using a photoresist 30207 as a mask. Therefore, after the field oxidation, a bird's beak is restrained as shown in FIG. 51D.

However, it is necessary to remove the silicon oxide film 30208 after the field oxidation because the thickness of the silicon oxide film 30208 is increased to be larger than that of the silicon oxide film 30204 prior to the silicon oxidation by the field oxidation step. Since the thickness of the silicon oxide film 30208 is larger than the silicon oxide film 30108 of Example 29, a thickness of the field oxide film after removing the silicon oxide film 30208 and the silicon nitride film 30203 is smaller than that of Example 29.

Specifically, the occurrence of a bird's beak and the thickness of the field oxide film have the relationship of trade-off in Example 30 as compared with Example 29; that is, although the occurrence of a bird's beak is restrained, a thickness of the field oxide film is reduced as compared with Example 29.

EXAMPLE 31

FIGS. 52A to 52E are cross-sectional views showing another fabrication process, illustrating the steps of forming a groove type element separation structure and a field oxide film.

Figure 52A:
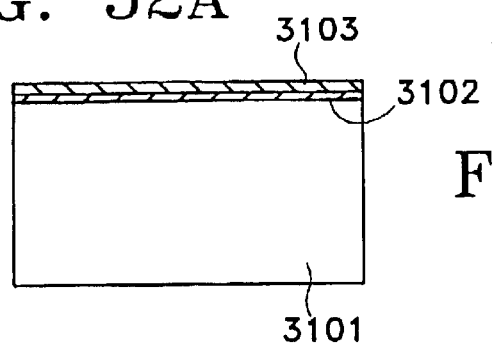
FIGS. 52A to 52E are cross-sectional views showing the fabrication steps of forming a groove type element separation structure and a field oxide film of Example 31.

First, as shown in FIG. 52A, a silicon oxide film 3102 and a silicon nitride film 3103 are successively formed on a semiconductor substrate 3101. In Example 31, the silicon oxide film 3102 has a thickness in the range of about 10 to 20 nm and the silicon nitride film 3103 has a thickness in the range of about 100 to 200 nm.

Figure 52B:
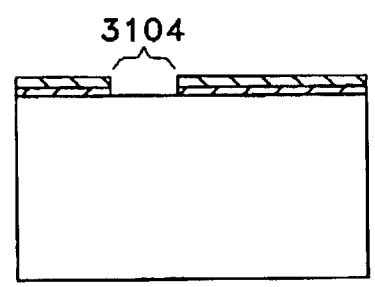

Next, as shown in FIG. 52B, the silicon nitride film 3103 and the silicon oxide film 3102 are etched through photolithography so as to form an opening 3104 for forming a groove type element separation structure. The groove type element separation structure in this example has a width in the range of about 0.1 to 0.3 µm.

Figure 52C:
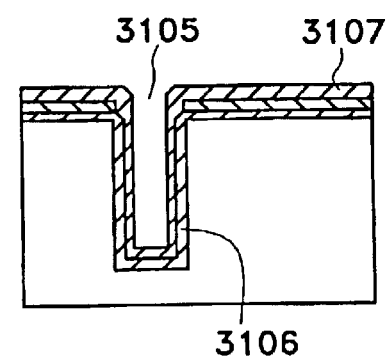

Next, as shown in FIG. 52C, the silicon substrate 3101 is etched using the silicon nitride film 3103 as a mask so as to form a groove 3105 for the groove type element separation structure 3104. Then, the inner wall of the groove 3105 is oxidized in an oxidation atmosphere. In Example 31, the groove 3105 has a depth of about 1 to 2 µm. A silicon oxide film 3106 having a thickness in the range of about 10 to 50 nm is formed along the inner wall of the groove 3105.

Next, a silicon oxide film 3107 is deposited on the silicon nitride film 3103 and the silicon oxide film 3106 in the groove 3105 by chemical vapor deposition (CVD). The silicon oxide film 3107 is formed to have a thickness in the range of about 10 to 70 nm in Example 31.

Figure 52D:
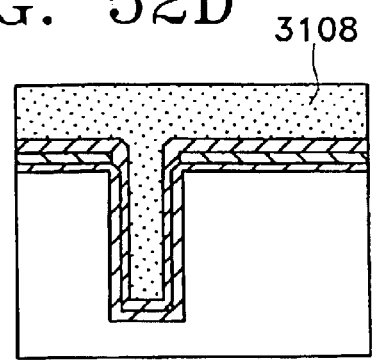

Next, as shown in FIG. 52D, a polycrystalline silicon film 3108 is deposited on the silicon oxide film 3107 so as to fill the groove 3105. The polycrystalline silicon film 3108 is formed to have a thickness in the range of about 200 nm to about 600 nm in this example.

Figure 52E:
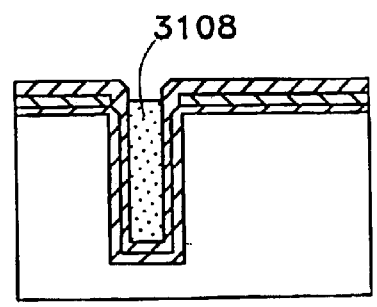
Figure 53:
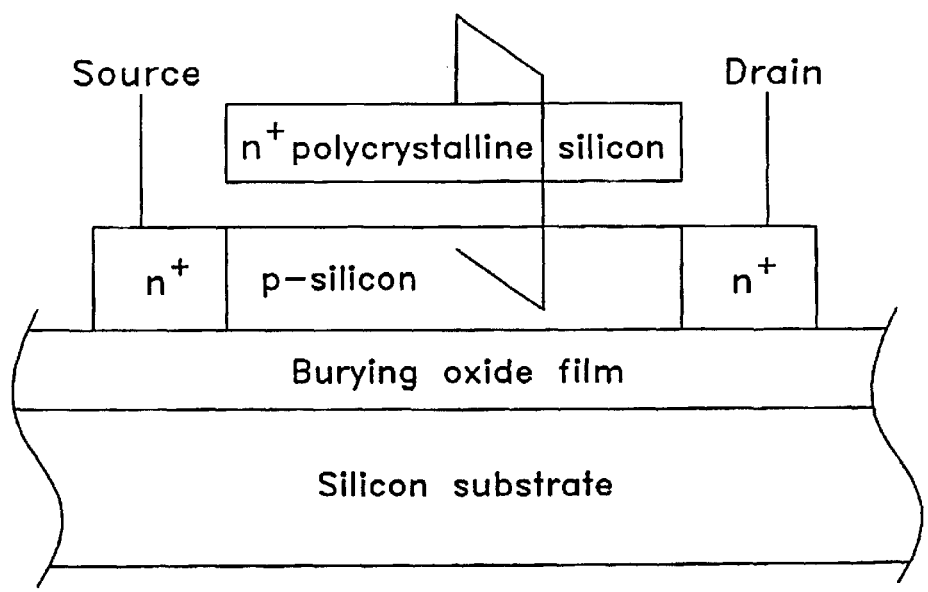
FIG. 53 is a schematic view showing a conventional dynamic threshold voltage MOS transistor.

Next, as shown in FIG. 52E, the polycrystalline silicon film 3108 is etched back so as to leave the polycrystalline silicon film 3108 only in the groove 3105. At this time, the silicon oxide film 3107 on the silicon nitride film 3103 is thinned by over etching of the polycrystalline silicon film 3108. It is also possible to almost completely remove the silicon oxide film 3107 on the silicon nitride film 3103 depending on an etching selectivity ratio. Thereafter, the same steps as those in Example 29 or 30 are conducted to form a desired groove type element separation structure.

According to Example 31, it is possible to increase a distance between the polycrystalline silicon film filling the groove and the silicon substrate by the silicon oxide film. As a result, the occurrence of a bird's beak can be further restrained as compared with Examples 29 and 30.

EXAMPLE 32

In order to obtain the structure of Example 26, it is necessary to add the doping step of impurity ions by ion implantation between the step of oxidizing the inner wall of the groove and the step of depositing a polycrystalline silicon film so as to fill the groove.

In Example 32, rotational implantation is performed at an implantation angle in the range of about 0 to about 10 degrees with respect to the vertical direction, depending on an aspect ratio of the groove. The dose amount is in the range of about $1\times10^{13}$ to $1\times10^{14}/cm^2$.

As described above, the following effect can be obtained by the present invention.

According to a semiconductor device of the present invention, it is possible to achieve a high drivability at a low power supply voltage, which is an advantage of a dynamic threshold voltage transistor, while preventing the aforementioned problem of a SOI substrate from occurring.

According to a semiconductor device of the present invention, since one switching element operates by the sum of a dynamic threshold type transistor current and a bipolar transistor current, a larger drivability can be obtained as compared with a semiconductor device which can operate only as a MOS transistor. Therefore, the semiconductor device of the present invention can be operated at an extremely high speed at a low power supply voltage.

According to a semiconductor device of the present invention, it is possible to effectively separate the adjacent transistor elements from each other without increasing the size of a separation region between the transistor elements. Thus, it is possible to reduce an area for one transistor element. As a result, effects, such as an improvement in the integration and a reduction in the capacity of a wiring, a reduction in the wiring delay time or the like can be obtained.

According to a semiconductor device of the present invention, since a bird's beak of a field oxide film is present in an overlapping region of the gate electrode and the element separation region, it is possible to restrain a leak current between a source region and/or drain region resulting from the edge of the groove in a region where the gate electrode overlaps the edge region of the groove. As a result of this, the OFF current of the transistor element can be reduced.

According to a semiconductor device of the present invention, a p-type semiconductor and an n-type semiconductor are connected to each other through a metal silicide film or a metal film. Therefore, it is possible to form an Ohmic contact. As a result, the potential of a gate electrode can be transmitted to a shallow well region without any delay time. Accordingly, a threshold value can be dynamically varied without any delay time.

According to a semiconductor device of the present invention, only by adding the step of forming a contact hole between a gate and a shallow well region to the known step for forming a salicide, it is possible to form an Ohmic contact between the gate and the shallow well region simultaneously with the salicidation.

According to a semiconductor device of the present invention, it is possible to increase the impurity concentration of an interface region between a metal silicide film and a shallow well region in contact with each other, thereby making it possible to form an Ohmic contact.

According to a semiconductor device of the present invention, the semiconductor device of the present invention advantageously makes it easy to constitute a circuit capable of reducing the power consumption.

According to a semiconductor device of the present invention, the adjacent deep well regions are separated from each other by a groove type element separation structure, and therefore are not in direct contact with each other. By setting the potential of a deeper well region to be identical to that of a deep well region, a p-type deeper well region formed so as to surround an n-type deep well region is grounded to a GND level, while an n-type deeper well region formed so as to surround a p-type deep well region is set at a power supply voltage. As a result, a pn junction between the deep well regions is reverse biased. A pn junction forward current which has nothing to do with the operation of the transistor is prevented from flowing.

According to a semiconductor device of the present invention, it is possible to reduce a pn junction forward current to as small as possible. As a result, a leak current which has nothing to do with a driving current can be prevented. Thus, the semiconductor device of the present invention has a configuration effective for reducing power consumption.

According to a semiconductor device of the present invention, the ion implantation for forming a region having a high impurity concentration in a shallow well region is performed simultaneously with the ion implantation for forming source/drain regions of the other transistor elements of a complementary semiconductor device. As a result, the fabrication steps are simplified.

According to a semiconductor device of the present invention, a difference of the potential between the shallow well region and the source/drain regions can be set at an arbitrary value lower than a built-in potential of a pn junction at maximum, regardless of the power supply voltage.

According to a semiconductor device of the present invention, a power supply voltage can be arbitrary determined. For example, when an input value changes from High to Low or Low to High, a base current is allowed to flow during a time period for changing an output value from Low to High or High to Low and not to flow in a standby state. Since a bipolar current flows only during an operation state and a bipolar current (a base current) can be prevented in a standby state, a semiconductor device with a remarkably high drivability, even when using a low power supply voltage, which operates at the sum of a current of a MOS transistor and a bipolar current, can be realized. Therefore, since a current of the MOS transistors is reduced by the order of a digit with respect to a bipolar current when the semiconductor device is operated at a high power supply voltage, a bipolar device with the low power consumption, in which a base current does not flow therethrough in a, standby state, can be realized.

According to a semiconductor device of the present invention, in the case where the power supply voltage is set in the vicinity of a built-in potential or lower, it is possible to constitute a circuit with extremely low power consumption (a normal CMOS is not suitable for use because a driving current is so small that the operation speed of the CMOS is extremely low). In the case where the power supply voltage is set in the vicinity of a built-in potential or higher, it is possible to constitute a high speed and low power consumption electric circuit which consumes the power as low as a CMOS circuit and operates as high as a bipolar circuit.

According to a semiconductor device of the present invention, by enhancing a built-in potential, a pn junction forward current can be further restrained. As a result, the power consumption can be further reduced.

According to a semiconductor device of the present invention, since a power supply voltage during standby can be blocked, the power consumption can be further reduced.

According to a semiconductor device of the present invention, after forming a groove type element separation structure and a field oxide film, it is possible to prevent a shallow well region from being formed immediately below a field oxide film in a self aligned manner. In particular, in a complementary type semiconductor device, therefore, it is possible to separate a shallow n-well region and a shallow p-well region from each other and a deep n-well region and a deep p-well region from each other by a field oxide film in a self-aligned manner. Therefore, it is possible to certainly separate the well regions from each other without performing a high accuracy of alignment.

According to a semiconductor device of the present invention, in a groove type element separation structure, a bird's beak is present in the edge of the opening of the groove and thus the edge is not sharpened. Therefore, it is possible to alleviate the concentration of an electric field in the edge of the opening of the groove. Therefore, in the region where the edge of the groove overlaps the gate electrode, it is possible to restrain a leak current from occurring between the source region/drain region due to the edge of the groove. Therefore, an OFF current of the transistor can be reduced.

According to a semiconductor device of the present invention, since a depletion layer of a semiconductor layer to be separated by a groove is prevented from reaching the bottom of the groove, it is possible to certainly separate the semiconductor layers from each other.

According to a semiconductor device of the present invention, a semiconductor device capable of alleviating the concentration of the electric field in the edge of the opening of the groove and reducing an OFF current of the transistor can be easily fabricated.

According to a fabrication method of the semiconductor device of the present invention, there is an alignment margin equal to a width of a groove type element separation structure for the anti-oxidation mask for forming a field oxide film in a field region of the semiconductor substrate. Therefore, no misalignment occurs between the field oxide film and the groove type element separation structure. By using such an anti-oxidation mask, a groove type element separation structure can be completed by oxidizing the upper part of a polycrystalline silicon film filling the groove simultaneously with the formation of a field oxide film by thermal oxidation. Therefore, the fabrication steps can be simplified. Moreover, as a result of the formation of a bird's beak in the edge of the groove, a leak current in the edge of the groove, which may produce the most serious problem in a groove type element separation structure, can be reduced.

According to a fabrication method of the semiconductor device of the present invention, a field oxide film formed on the groove type element separation structure is thinned by the presence of a second silicon nitride film. As a result, a bird's beak is prevented from growing. As a result, it is possible to reserve an area of an active region which is close to the designed size. The difference of level of the surface is also reduced.

According to a fabrication method of the semiconductor device of the present invention, since the second silicon oxide film is provided on the outermost surface of an etching mask for forming a groove, a polycrystalline silicon film filling the groove is prevented from being excessively etched in the step of etching back the polycrystalline silicon film. As a result, the controllability of the polycrystalline silicon film filling the groove is improved. Moreover, the side wall of the groove is prevented from being oxidized by the thermal oxidation for forming the field oxide film.

According to a fabrication method of the semiconductor device of the present invention, after the silicon nitride film on the field region is removed, the second silicon nitride film remains so as to cover the edge portion on the active region of the groove. Therefore, a bird's beak having an excessively large thickness is not formed in the edge portion.

According to a fabrication method of the semiconductor device of the present invention, since the second silicon oxide film remains on the uppermost surface of the anti-oxidation mask, a bird's beak having an excessively large thickness is not formed in the edge portion on the active region of the groove.

According to a fabrication method of the semiconductor device of the present invention, a thickness of the field oxide film formed on the groove type element separation structure is reduced by providing the second silicon nitride film. As a result, a bird's beak is prevented from growing.

According to a fabrication method of the semiconductor device of the present invention, a third silicon oxide film is deposited so as to cover the second silicon oxide film. As a result, the growth of a bird's beak in the edge portion of the opening of the groove can be prevented.

According to a fabrication method of the semiconductor device of the present invention, by implanting impurity ions into the bottom of the groove of the groove type element separation structure, the function of the element separation structure can be further enhanced.

According to a field effect transistor device, a field effect transistor having a high drivability at a low power supply voltage, which is an advantage of a dynamic threshold voltage transistor, can be realized while avoiding the aforementioned problems of an SOI substrate.

Moreover, by using a bulk substrate in the examples described above, it is possible to solve the problem of a large body resistance, which was a critical problem when using a SOI substrate. More specifically, a body resistance can be reduced to be about 1/50 or lower. Furthermore, with the thus lowered body resistance, it is possible to increase the operation speed of a circuit.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor device comprising:

a semiconductor substrate;

a deep well region of a first conductivity type, formed in the semiconductor substrate;

one or more shallow well regions of a second conductivity type, formed in the deep well region;

a source region and a drain region of the first conductivity type formed in each of the one or more shallow well regions;

corresponding to each shallow well region, a channel region, formed between the source region and the drain region of that shallow well region;

a gate insulating film formed on the channel region of that shallow well region; and a gate electrode formed on the gate insulating film of that shallow well region, wherein each of the one or more shallow well regions is electrically separated from adjacent ones of the one or more adjacent shallow well regions by a groove type element separation structure, corresponding to each groove type element separation structure, an impurity diffusion region, having a same conductivity type as the deep well region, is provided on a bottom of that groove type element separation structure and reaches the deep well region, and for each shallow well region, a difference of a potential formed between that shallow well region and the source region for that shallow well region and a difference of a potential formed between that shallow well region and the drain region for that shallow well region is set so as to be smaller than a built-in potential of a pn junction formed between that shallow well region and the source region for that shallow well region and the built-in potential of a pn junction formed between that shallow well region and the drain region for that shallow well region, respectively, during operation.

2. A semiconductor device according to claim 1, wherein:

for each shallow well region, the gate electrode corresponding to that shallow well region is electrically connected to that shallow well region.

3. A semiconductor device according to claim 2, wherein:

the deep well region of the first conductivity type is capable of functioning as an emitter or a collector of a bipolar transistor;

each of the one or more shallow well regions of the second conductivity type is capable of functioning as a base of the bipolar transistor;

for each of the one or more shallow well regions, the source region and the drain region of the first conductivity type are capable of functioning as the collector or the emitter of the bipolar transistor; and the semiconductor device is operated by a combination of an operation of a MOS transistor and an operation of the bipolar transistor.

4. A semiconductor device according to claim 2, wherein:

for each shallow well region, the gate electrode corresponding to that shallow well region includes a polycrystalline silicon film formed on the gate insulating film of that shallow well region and a metal silicide film formed on the polycrystalline silicon film of that shallow well region, and the metal suicide film of that shallow well region is electrically connected to that shallow well regions via the contact region of that shallow well region.

5. A semiconductor device according to claim 2, further comprising:

an interlayer insulating film and an upper wiring provided on the interlayer insulating film, wherein, for each shallow well region a contact hole is formed in the interlayer insulating film, which penetrates through the gate electrode of that shallow well region and the gate insulating film of that shallow well region so as to reach the contact region of that shallow well region, an electrical connection is formed between the upper wiring and that shallow well region on the bottom of the contact hole for that shallow well region, and an electrical connection is formed between the gate electrode of that shallow well region and the upper wiring on at least a side wall region of the contact hole for that shallow well region.

6. A semiconductor device comprising:

a semiconductor substrate;

a deep well region of a first conductivity type, formed in the semiconductor substrate;

one or more shallow well regions of a second conductivity type, formed in the deep well region;

a source region and a drain region of the first conductivity type formed in each of the one or more shallow well regions;

corresponding to each shallow well region, a channel region, formed between the source region and the drain region of that shallow well region;

a gate insulating film formed on the channel region of that shallow well region; and a gate electrode formed on the gate insulating film of that shallow well region, wherein each of the one or more shallow well regions is electrically separated from adjacent ones of the one or more adjacent shallow well regions by a groove type element separation structure, and corresponding to each groove type element separation structure, an impurity diffusion region, having a same conductivity type as the deep well region, is provided on a bottom of that groove type element separation structure and reaches the deep well region, wherein for each shallow well region, a pn junction portion is formed between at least a bottom of the source region and that shallow well region and between at least a bottom of the drain region and that shallow well region contains carbon bonded to silicon or nitrogen bonded to silicon, and a built-in potential of the pn junction portions is set so as to be higher than a built-in potential of a pn junction formed of a p-type silicon and an n-type silicon.

7. A semiconductor device comprising a first block circuit and a second block circuit, wherein:

the first block circuit is positioned between a power supply voltage source and a circuit block constituted by using a semiconductor device, wherein said semiconductor device comprises:

a semiconductor substrate;

a deep well region of a first conductivity type, formed in the semiconductor substrate;

one or more shallow well regions of a second conductivity type, formed in the deep well region;

a source region and a drain region of the first conductivity type formed in each of the one or more shallow well regions;

corresponding to each shallow well region, a channel region, formed between the source region and the drain region of that shallow well region;

a gate insulating film formed on the channel region of that shallow well region; and a gate electrode formed on the gate insulating film of that shallow well region, wherein each of the one or more shallow well regions is electrically separated from adjacent ones of the one or more adjacent shallow well regions by a groove type element separation structure, and corresponding to each groove type element separation structure, an impurity diffusion region, having a same conductivity type as the deep well region, is provided on a bottom of that groove type element separation structure and reaches the deep well region, the second block circuit is positioned between the circuit block and a ground voltage supply source, and supply of either or both of a power supply voltage or a ground voltage are blocked when the circuit block is in a standby state.

8. A semiconductor device comprising:

a semiconductor substrate;

a deep well region of a first conductivity type, formed in the semiconductor substrate;

a groove type element separation structure formed in the deep well region;

one or more shallow well regions of a second conductivity type, each shallow well region formed in one or more island active regions surrounded by the groove type element separation structure;

for each shallow well region, a source region and a drain region of the first conductivity type and a contact region formed in the one or more island active regions in which that shallow well region is formed;

a channel region formed between the source region and the drain region and adjacent to the contact region;

a gate insulating film formed on the channel region;

a gate electrode formed from above the gate insulating film to above the contact region, wherein the gate electrode is electrically connected to that shallow well region at the contact regions; and wherein a high concentration impurity diffusion region is formed in the contact regions;

wherein the deep well region of the first conductivity type is capable of functioning as an emitter or a collector of a bipolar transistor;

each of the one or more shallow well regions of the second conductivity type are capable of functioning as a base of the bipolar transistor;

for each of the one or more shallow well regions, the source region and the drain region of the first conductivity type are capable of functioning as the collector or the emitter of the bipolar transistor;

wherein the semiconductor device is operated by a combination of an operation of a MOS transistor and an operation of the bipolar transistor.

9. A semiconductor device according to claim 8, wherein:

for each shallow well region, the contact region is formed of impurity material having the same conductivity type as that shallow well region.

10. A semiconductor device according to claim 8, wherein for each shallow well region, the contact region is formed in a parallel direction to a gate width direction of the channel region with respect to the channel region.

11. A semiconductor device according to claim 8, wherein:

for each shallow well region, the gate electrode corresponding to that shallow well region includes a polycrystalline silicon film formed on the gate insulating film of that shallow well region and a metal silicide film formed on the polycrystalline silicon film, and the metal silicide film of that shallow well region is electrically connected to that shallow well region via the contact region of that shallow well region.

12. A semiconductor device according to claim 11, wherein the high concentration impurity diffusion region being such that an impurity of the same conductivity type as that of the one or more shallow well regions is diffused at a higher concentration than at which the impurity is diffused in a remainder of that shallow well region; and an electrical connection is formed between the metal silicide film and that shallow well region through the high concentration impurity diffusion region.

13. A semiconductor device according to claim 8, further comprising:

an interlayer insulating film and an upper wiring provided on the interlayer insulating film, wherein, for each shallow well region, a contact hole is formed in the interlayer insulating film, which penetrates through the gate electrode of that shallow well region and the gate insulating film of that shallow well region so as to reach the contact region of that shallow well region, an electrical connection is formed between the upper wiring and that shallow well region on the bottom of the contact hole for that shallow well region, and an electrical connection is formed between the gate electrode of that shallow well region and the upper wiring on at least a side wall region of the contact hole for that shallow well region.

14. A semiconductor device according to claim 13, wherein:

for each shallow well region, a contact hole is formed in the interlayer insulating film, which penetrates through the gate electrode of that shallow well region and the gate insulating film of that shallow well region so as to reach the contact region of that shallow well region.

15. A semiconductor device according to claim 8, wherein:

for each shallow well region, a difference of a potential formed between that shallow well region and the source region for that shallow well region and a difference of a potential formed between that shallow well region and the drain region for that shallow well region is set so as to be smaller than a built-in potential of a pn junction formed between that shallow well region and the source region for that shallow well region and the built-in potential of a pn junction formed between that shallow well region and the drain region for that shallow well region, respectively, during operation.

16. A semiconductor device according to claim 8, wherein:

for each shallow well region, a pn junction portion is formed between at least a bottom of the source region and that shallow well region and between at least a bottom of the drain region and that shallow well region contains carbon bonded to silicon or nitrogen bonded to silicon, and a built-in potential of the pn junction portions is set so as to be higher than a built-in potential of a pn junction formed of a p-type silicon and an n-type silicon.

17. A semiconductor device comprising a first block circuit and a second block circuit, wherein:

the first block circuit is positioned between a circuit block constituted by using the semiconductor device according to claim 8 and a power supply voltage source; and the second block circuit is positioned between the circuit block and a ground voltage supply source, and supply of either or both of a power supply voltage or a ground voltage are blocked when the circuit block is in a standby state.

18. A semiconductor device comprising:

a semiconductor substrate;

active regions formed on the semiconductor substrate;

a deep well region, of a first conductivity type, formed in the semiconductor substrate;

one or more shallow well regions, of a second conductivity type, formed in the deep well region;

for each shallow well region, a source region and a drain region, of the first conductivity type, formed therein;

a channel region formed between the source region and the drain region;

a gate insulating film formed on the channel region;

a gate electrode formed on the gate insulating film;

a groove type first element separation region which electrically separates that shallow well regions from adjacent ones of the shallow well regions; and a second element separation region, which is thicker than the gate insulating film, formed between the groove type first element separation regions.

19. A semiconductor device according to claim 18, wherein:

for each shallow well region, the gate electrode of that shallow well region is electrically connected to the shallow well region.

20. A semiconductor device according to claim 19, wherein:

for each shallow well region, the second element separation region is formed between a contact region, where the gate electrode is electrically connected to that shallow well region, and the channel region for that shallow well region.

21. A semiconductor device according to claim 19, wherein:

the deep well region of the first conductivity type is capable of functioning as an emitter or a collector of a bipolar transistor;

each of the one or more shallow well regions of the second conductivity type are capable of functioning as a base of the bipolar transistor;

for each of the one or more shallow well regions, the source region and the drain region of the first conductivity type are capable of functioning as the collector or the emitter of the bipolar transistor; and the semiconductor device is operated by a combination of an operation of a MOS transistor and an operation of the bipolar transistor.

22. A semiconductor device according to claim 19, wherein:

for each of the one or more shallow well regions, the gate electrode includes a polycrystalline silicon film formed on the gate insulating film and a metal suicide film formed on the polycrystalline silicon film, and the metal silicide film is electrically connected to that shallow well region via the contact region of that shallow well region.

23. A semiconductor device according to claim 19, further comprising:

an interlayer insulating film and an upper wiring provided on the interlayer insulating film, wherein, for each shallow well region a contact hole is formed in the interlayer insulating film, which penetrates through the gate electrode and the gate insulating film so as to reach the contact region of that shallow well region, an electrical connection is formed between the upper wiring and the one or more shallow well regions on the bottom of the contact hole, and an electrical connection is formed between the gate electrode and the upper wiring on at least a side wall region of the contact hole.

24. A semiconductor device according to claim 18, wherein for each shallow well region, a difference of a potential formed between that shallow well region and the source region for that shallow well region and a difference of a potential formed between that shallow well region and the drain region for that shallow well region is set so as to be smaller than a built-in potential of a pn junction formed between that shallow well region and the source region for that shallow well region and the built-in potential of a pn junction formed between that shallow well region and the drain region for that shallow well region, respectively, during operation.

25. A semiconductor device according to claim 18, wherein for each shallow well region, a pn junction portion is formed between at least a bottom of the source region and that shallow well region and between at least a bottom of the drain region and that shallow well region contains carbon bonded to silicon or nitrogen bonded to silicon, and a built-in potential of the pn junction portions is set so as to be higher than a built-in potential of a pn junction formed of a p-type silicon and an n-type silicon.

26. A semiconductor device comprising a first block circuit and a second block circuit, wherein:

the first block circuit is positioned between a circuit block constituted by using the semiconductor device according to claim 18 and a power supply voltage source;

the second block circuit is positioned between the circuit block and a ground voltage supply source, and supply of either or both of a power supply voltage or a ground voltage are blocked when the circuit block is in a standby state.

27. A semiconductor device comprising:

a semiconductor substrate of a first conductivity type;

a plurality of transistor elements formed in the semiconductor substrate;

a groove type element separation structure that separates the plurality of transistor elements from each other;

wherein the semiconductor substrate includes a first semiconductor layer of the first conductivity type; and a second semiconductor layer of a second conductivity type positioned below the first semiconductor layer, and an oxide film having a bird's beak formed above a groove of the groove type element separation structure in an edge portion of an opening of the groove, wherein the groove extends from a surface of the semiconductor substrate to reach a middle of the second semiconductor layer, and a high concentration region, in which an impurity of the second conductivity type is diffused at a higher concentration than the first semiconductor layer and second semiconductor layer, is formed in the vicinity of the bottom of the groove.

28. A semiconductor device according to claim 27, wherein a concentration of the impurity of the second conductivity type in the higher concentration region is in the range of about $1\times10^{18}/cm^3$ to about $1\times10^{19}/cm^3$.

29. A semiconductor device comprising:

a semiconductor substrate;

a deep well region of a first conductivity type, formed in the semiconductor substrate;

one or more shallow well regions, of a second conductivity type, formed in the deep well region;

for each shallow well region, a source region and a drain region, of the first conductivity type, formed therein;

a channel region formed between the source region and the drain region;

a gate insulating film formed on the channel region;

a contact region formed adjacent to the channel region and in the shallow well region, and a gate electrode formed on the gate insulating film, wherein the gate electrode is electrically connected to the shallow well region, and each shallow wall region is electrically separated from adjacent ones of the shallow well regions, wherein, for each shallow well region, the gate electrode includes a polycrystalline silicon film formed on the gate insulating film and a metal silicide film formed on the polycrystalline silicon film, and the metal silicide film is electrically connected to that shallow well region via the contact region of that shallow well region.

30. A semiconductor device according to claim 29, wherein each shallow well region is separated from adjacent ones of the shallow well regions by a groove type element separation structure which is deeper than the shallow well regions and shallower than the deep well region.

31. A semiconductor device according to claim 29, further comprising:

a groove type of first element separation region which electrically separates adjacent shallow well regions from each other, and for each shallow well region, a second element separation region which has a thickness greater than that of the gate insulating film and electrically separates the source region of that shallow well region from the drain region of that shallow well region.

32. A semiconductor device according to claim 29, wherein the deep well region of the first conductivity type is capable of functioning as an emitter or a collector of a bipolar transistor;

each of the one or more shallow well regions of the second conductivity type are capable of functioning as a base of the bipolar transistor;

for each of the one or more shallow well regions, the source region and the drain region of the first conductivity type are capable of functioning as the collector or the emitter of the bipolar transistor;

wherein the semiconductor device is operated by a combination of an operation of a MOS transistor and an operation of the bipolar transistor.

33. A semiconductor device claim according to claim 29, wherein the contact region has a high impurity concentration of the same conductivity type as that of the one or more shallow well regions.

34. A semiconductor device comprising:

a semiconductor substrate;

a deep well region of a first conductivity type, formed in the semiconductor substrate;

one or more shallow well regions of a second conductivity type, formed in the deep well region;

for each shallow well region, a source region and a drain region of the first conductivity type, formed therein;

a channel region formed between the source region and the drain region;

a gate insulating film formed on the channel region;

a contact region formed adjacent to the channel region and in the shallow well region, and a gate electrode formed on the gate insulating film, wherein the gate electrode is electrically connected to the shallow well region, each shallow well region is electrically separated from adjacent ones of the shallow well regions, the semiconductor device further comprising an interlayer insulating film and an upper wiring provided on the interlayer insulating film, wherein, for each shallow well region a contact hole is formed in the interlayer insulating film, which penetrates through the gate electrode of that shallow well region and the gate insulating film of that shallow well region so as to reach the contact region of that shallow well region, an electrical connection is formed between the upper wiring and that shallow well region on the bottom of the contact hole for that shallow well region, and an electrical connection is formed between the gate electrode of that shallow well region and the upper wiring on at least a side wall region of the contact hole for that shallow well region.

35. A semiconductor device according to claim 34, wherein adjacent shallow well regions are separated from each other by a groove type element separation structure which is deeper than the one or more shallow well regions and shallower than the deep well region.

36. A semiconductor device according to claim 34, wherein the deep well region of the first conductivity type is capable of functioning as an emitter or a collector of a bipolar transistor;

each of the one or more shallow well regions of the second conductivity type is capable of functioning as a base of the bipolar transistor;

for each of the one or more shallow well regions, the source region and the drain region of the first conductivity type are capable of functioning as the collector or the emitter of the bipolar transistor; and the semiconductor device is operated by a combination of an operation of a MOS transistor and an operation of the bipolar transistor.

37. A semiconductor device according to claim 34, wherein the contact region has a high impurity concentration of the same conductivity type as that of the one or more shallow well regions.

38. A semiconductor device according to claim 34, wherein, for the contact hole within the interlayer insulating film, the diameter of the contact hole as the contact hole passes through the gate insulating film is substantially the same as the diameter of the contact hole as the contact hole passes through the gate electrode.

39. A semiconductor device comprising a first block circuit and a second block circuit, wherein:

the first block circuit is positioned between a power supply voltage source and a circuit block constituted by using a semiconductor device comprising:

a semiconductor substrate;

an n-type deep well region formed in the semiconductor substrate;

a p-type deep well region formed in the semiconductor substrate;

one or more p-type shallow well regions formed in the n-type deep well region;

one or more n-type shallow well regions formed in the p-type deep well region;

an N-channel MOS transistor formed in each of the one or more p-type shallow well regions; and a P-channel MOS transistor formed in each of the one or more n-type shallow well regions, wherein, for each p-type shallow well region, the N-channel MOS transistor includes an n-type source region and an n-type drain region formed therein, a channel region formed between the n-type source region and the n-type drain region, a contact region formed adjacent to the channel region and in the p-type shallow well region, a gate insulating film formed on the channel region, and a gate electrode formed on the gate insulating film, and the gate electrode of the N-channel MOS transistor is electrically connected to that p-type shallow well region, for each n-type shallow well region, the P-channel MOS transistor includes a p-type source region and a p-type drain region formed therein, a channel region formed between the p-type source region and the p-type drain region, a contact region formed adjacent to the channel region and in the n-type shallow well region, a gate insulating film formed on the channel region, and a gate electrode formed on the gate insulating film, and the gate electrode of the P-channel MOS transistor is electrically connected to that n-type shallow well region;

the second block circuit is positioned between the circuit block and a ground voltage supply source, and supply of a power supply voltage or supply of a ground voltage or both of the supply of the power supply voltage and the supply of the ground voltage are blocked when the circuit block is in a standby state.

40. A method for operating a semiconductor device comprising the steps of:

providing an operating state of a semiconductor device comprising:

a semiconductor substrate;

an n-type deep well region formed in the semiconductor substrate;

a p-type deep well region formed in the semiconductor substrate;

one or more p-type shallow well regions formed in the n-type deep well region;

one or more n-type shallow well regions formed in the p-type deep well region;

for each p-type shallow well region, an N-channel MOS transistor formed therein; and for each n-type shallow well region, a P-channel MOS transistor formed therein, wherein each N-channel MOS transistor includes an n-type source region and an n-type drain region formed in p-type shallow well regions in which that N-channel MOS transistor is formed, a channel region formed between the n-type source region and the n-type drain region, a contact region formed adjacent to the channel region and in the p-type shallow region, and a gate insulating film formed on the channel region, and a gate electrode formed on the gate insulating film and electrically connected to the p-type shallow well region; and wherein each P-channel MOS transistor includes
a p-type source region and a p-type drain region formed in the n-type shallow well region in which that p-channel MOS transistor is formed
a channel region formed between the p-type source region and the p-type drain region,
a contact region formed adjacent to the channel region and in the n-type shallow well region,
a gate insulating film formed on the channel region, and
a gate electrode formed on the gate insulating film and electrically connected to the n-type shallow well region;
for each p-channel MOS transistor,
obtaining a difference of a maximum potential formed between the p-type source and drain regions and the n-type shallow well region in which the p-channel MOS transistor is formed, and
maintaining said maximum potential difference so as to be smaller than a built-in potential formed between the p-type source and drain regions and the n-type shallow well region in which the p-channel MOS transistor is formed; and
for each n-channel MOS transistor,
obtaining a difference of a maximum potential formed between the n-type source and drain regions and the p-type shallow well region in which the n-channel MOS transistor is formed; and
maintaining said maximum potential difference so as to be smaller than a built-in potential formed between the n-type source and drain regions and the p-type shallow well region in which the n-channel MOS transistor is formed.

41. A semiconductor device comprising a first circuit constituted by a semiconductor device comprising:
a semiconductor substrate;
an n-type deep well region formed in the semiconductor substrate;
a p-type deep well region formed in the semiconductor substrate;
one or more p-type shallow well regions formed in the n-type deep well region;
one or more n-type shallow well regions formed in the p-type deep well region;
for each p-type shallow well region, an N-channel MOS transistor formed therein; and
for each n-type shallow well region, a P-channel MOS transistor formed therein,
wherein each N-channel MOS transistor includes
an n-type source region and an n-type drain region formed in p-type shallow well regions in which that N-channel MOS transistor is formed,
a channel region formed between the n-type source region and the n-type drain region,
a contact region formed adjacent to the channel region and in the p-type shallow region, and
a gate insulating film formed on the channel region, and
a gate electrode formed on the gate insulating film and electrically connected to the p-type shallow well region; and
wherein each P-channel MOS transistor includes
a p-type source region and a p-type drain region formed in the n-type shallow well region in which that p-channel MOS transistor is formed
a channel region formed between the p-type source region and the p-type drain region,
a contact region formed adjacent to the channel region and in the n-type shallow well region,
a gate insulating film formed on the channel region, and
a gate electrode formed on the gate insulating film and electrically connected to the n-type shallow well region; and
a second circuit for blocking a power supply voltage,
wherein the second circuit is blocking a supply of the power voltage to the first circuit when the first circuit is in a stand-by state.

42. A semiconductor device comprising a first circuit constituted by a semiconductor device comprising:
a semiconductor substrate;
an n-type deep well region formed in the semiconductor substrate;
a p-type deep well region formed in the semiconductor substrate;
one or more p-type shallow well regions formed in the n-type deep well region;
one or more n-type shallow well regions formed in the p-type deep well region;
for each p-type shallow well region, an N-channel MOS transistor formed therein; and
for each n-type shallow well region, a P-channel MOS transistor formed therein,
wherein each N-channel MOS transistor includes
an n-type source region and an n-type drain region formed in p-type shallow well regions in which that N-channel MOS transistor is formed,
a channel region formed between the n-type source region and the n-type drain region,
a contact region formed adjacent to the channel region and in the p-type shallow region, and
a gate insulating film formed on the channel region, and
a gate electrode formed on the gate insulating film and electrically connected to the p-type shallow well region; and
wherein each P-channel MOS transistor includes
a p-type source region and a p-type drain region formed in the n-type shallow well region in which that p-channel MOS transistor is formed
a channel region formed between the p-type source region and the p-type drain region,
a contact region formed adjacent to the channel region and in the n-type shallow well region,
a gate insulating film formed on the channel region, and
a gate electrode formed on the gate insulating film and electrically connected to the n-type shallow well region; and
a second circuit for blocking a GND voltage,
wherein the second circuit is blocking a supply of the GND voltage to the first circuit when the first circuit is in a stand-by state.

43. A semiconductor device comprising a first circuit constituted by a semiconductor device comprising:
a semiconductor substrate;
an n-type deep well region formed in the semiconductor substrate;
a p-type deep well region formed in the semiconductor substrate;

one or more p-type shallow well regions formed in the n-type deep well region;

one or more n-type shallow well regions formed in the p-type deep well region;

for each p-type shallow well region, an N-channel MOS transistor formed therein; and for each n-type shallow well region, a P-channel MOS transistor formed therein, wherein each N-channel MOS transistor includes an n-type source region and an n-type drain region formed in p-type shallow well regions in which that N-channel MOS transistor is formed, a channel region formed between the n-type source region and the n-type drain region, a contact region formed adjacent to the channel region and in the p-type shallow region, and a gate insulating film formed on the channel region, and a gate electrode formed on the gate insulating film and electrically connected to the p-type shallow well region; and wherein each P-channel MOS transistor includes a p-type source region and a p-type drain region formed in the n-type shallow well region in which that p-channel MOS transistor is formed a channel region formed between the p-type source region and the p-type drain region, a contact region formed adjacent to the channel region and in the n-type shallow well region, a gate insulating film formed on the channel region, and a gate electrode formed on the gate insulating film and electrically connected to the n-type shallow well region; and a second circuit for blocking a power supply voltage and a third circuit for blocking a GND voltage, wherein the second and third circuits are blocking a supply of the power voltage and GND voltage to the first circuit when the first circuit is in a stand-by state.

44. A field effect transistor comprising:

a semiconductor substrate of a first conductivity type or a first well region of the first conductivity type, a second well region of a second conductivity type formed either on the semiconductor substrate of the first conductivity type or within the first well region of the first conductivity type;

a gate insulating film formed on the second well region of the second conductivity type;

a gate electrode formed on the gate insulating film; and source/drain regions of the first conductivity type formed on both sides of the gate electrode, wherein the gate electrode is electrically connected to the second well region of the second conductivity type, and, when an input voltage is loaded on the gate electrode, a threshold voltage of the field effect transistor is varied according to the input voltage, and a current corresponding to the threshold voltage is flowing between the source/drain regions of the first conductivity type formed on both sides of the gate electrode, and wherein the second well region includes a contact region, and a high concentration impurity diffusion region is formed in the contact region.

45. A semiconductor device comprising:

a semiconductor substrate;

an n type deep well region formed in the semiconductor substrate;

a p type deep well region formed in the semiconductor substrate;

one or more p type shallow well regions formed in the n type deep well region;

one or more n type shallow well regions formed in the p type deep well region;

an N channel MOS transistor respectively formed in the one or more p type shallow well regions; and a P channel MOS transistor respectively formed in the one or more n type shallow well regions, wherein the N channel MOS transistor includes an n type source region and an n type drain region formed in a corresponding one of the one or more p type shallow well regions, a channel region formed between the n type source region and the n type drain region a contact region formed adjacent to the channel region and in the p-type shallow region, a gate insulating film formed pn the channel region, and a gate electrode formed on the gate insulating film, wherein the P channel MOS transistor includes a p type source region and a p type drain region formed in a corresponding one of the one or more n type shallow well regions, a channel region formed between the p type source region and the p-type drain region, a contact region formed adjacent to the channel region and in the n-type shallow well region, a gate insulating film formed on the channel region, and a gate electrode formed on the gate insulating film, wherein the gate electrode of the N channel MOS transistor is electrically connected to the p type shallow well region, and the gate electrode of the P channel MOS transistor is electrically connected to the n type shallow well region, and wherein a difference of a potential formed between a corresponding one of the one or more n type or p type shallow well regions and the source region and a difference of a potential formed between a corresponding one of the one or more n type or p type shallow well regions and the drain region are set so as to be smaller than a built in potential of a pn junction formed between the source/drain regions and the corresponding one of the one or more n type or p type shallow well regions of a different conductivity type from the source/drain regions during operation.

* * * * *